(12) United States Patent
Mann et al.

(10) Patent No.: US 7,186,983 B2
(45) Date of Patent: Mar. 6, 2007

(54) ILLUMINATION SYSTEM PARTICULARLY FOR MICROLITHOGRAPHY

(75) Inventors: Hans-Juergen Mann, Oberkochen (DE); Wolfgang Singer, Aalen (DE); Joerg Schultz, Aalen (DE); Johannes Wangler, Koenigsbronn (DE); Karl-Heinz Schuster, Koenigsbronn (DE); Udo Dinger, Oberkochen (DE); Martin Antoni, Aalen (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/919,583

(22) Filed: Aug. 17, 2004

(65) Prior Publication Data

US 2005/0088760 A1    Apr. 28, 2005

Related U.S. Application Data

(63) Continuation-in-part of application No. PCT/EP03/00485, filed on Jan. 20, 2003, and a continuation-in-part of application No. 10/201,652, filed on Jul. 22, 2002, now Pat. No. 6,859,328, which is a continuation-in-part of application No. 10/150,650, filed on May 17, 2002, now Pat. No. 7,006,595, and a continuation-in-part of application No. 09/679,718, filed on Sep. 29, 2000, now Pat. No. 6,438,199, said application No. 10/150,650 is a continuation-in-part of application No. 09/679,718, which is a continuation-in-part of application No. 09/305,017, filed on May 4, 1999, now Pat. No. 6,198,793.

(30) Foreign Application Priority Data

| May 5, 1998 | (DE) | ................. 198 19 898 |
| Feb. 2, 1999 | (DE) | ................. 199 03 807 |
| Feb. 8, 1999 | (DE) | ................. 299 02 108 |
| Jul. 28, 2000 | (EP) | ..................... PCT/EP00/07258 |

(51) Int. Cl.
*G02B 27/14* (2006.01)
*G02B 5/30* (2006.01)
*G02B 17/00* (2006.01)

(52) U.S. Cl. ...................... 250/365; 250/372; 359/633; 359/366; 359/487; 359/727

(58) Field of Classification Search ................. 250/365
See application file for complete search history.

(56) References Cited

U.S. PATENT DOCUMENTS 4,195,913 A    4/1980    Dourte et al. ................ 350/292

(Continued)

FOREIGN PATENT DOCUMENTS

EP    0066295 A1    12/1982

(Continued)

OTHER PUBLICATIONS

Internationl Search Report, dated Mar. 23, 2004.

(Continued)

*Primary Examiner*—Frank G. Font
*Assistant Examiner*—Mary El-Shammaa
(74) *Attorney, Agent, or Firm*—Ohlandt, Greeley, Ruggiero & Perle, L.L.P.

(57) ABSTRACT

There is provided a projection objective for a projection exposure apparatus that has a primary light source for emitting electromagnetic radiation having a chief ray with a wavelength $\leq 193$ nm. The projection objective includes an object plane, a first mirror, a second mirror, a third mirror, a fourth mirror; and an image plane. The object plane, the first mirror, the second mirror, the third mirror, the fourth mirror and the image plane are arranged in a centered arrangement around a common optical axis. The first mirror, the second mirror, the third mirror, and the fourth mirror are situated between the object plane and the image plane. The chief ray, when incident on an object situated in the object plane, in a direction from the primary light source, is inclined away from the common optical axis.

21 Claims, 49 Drawing Sheets

U.S. PATENT DOCUMENTS

| | | |
|---|---|---|
| 4,294,538 A | 10/1981 | Ban .......................... 355/51 |
| 4,389,115 A | 6/1983 | Richter ....................... 355/26 |
| 4,651,012 A | 3/1987 | Clark et al. .............. 250/505.1 |
| 4,688,932 A | 8/1987 | Suki |
| 4,740,276 A | 4/1988 | Marmo et al. ................. 204/7 |
| 5,071,240 A | 12/1991 | Ichihara et al. |
| 5,148,442 A | 9/1992 | O'Neil et al. ................. 372/71 |
| 5,222,112 A | 6/1993 | Terasawa et al. ............. 378/34 |
| 5,339,346 A | 8/1994 | White ......................... 378/34 |
| 5,353,322 A | 10/1994 | Bruning et al. ............... 378/34 |
| 5,361,292 A | 11/1994 | Sweatt ........................ 378/34 |
| 5,402,267 A | 3/1995 | Furter et al. ................ 359/727 |
| 5,439,781 A | 8/1995 | MacDowell et al. ........ 460/311 |
| 5,440,423 A | 8/1995 | Ogura ........................ 359/365 |
| 5,459,547 A | 10/1995 | Shiozawa |
| 5,512,759 A | 4/1996 | Sweatt .................... 250/492.1 |
| 5,581,605 A | 12/1996 | Murakami et al. ........... 378/84 |
| 5,644,383 A | 7/1997 | Mori |
| 5,647,664 A | 7/1997 | Hanečka .................... 362/308 |
| 5,669,708 A | 9/1997 | Mashima et al. ........... 362/341 |
| 5,677,939 A | 10/1997 | Oshino ........................ 378/34 |
| 5,686,728 A | 11/1997 | Shafer et al. ............ 250/492.2 |
| 5,715,084 A | 2/1998 | Takahashi et al. |
| 5,737,137 A | 4/1998 | Cohen et al. ............... 359/859 |
| 5,755,503 A | 5/1998 | Chen et al. .................. 353/38 |
| 5,796,524 A | 8/1998 | Oomura |
| 5,805,356 A | 9/1998 | Chiba |
| 5,846,678 A | 12/1998 | Nishigori et al. |
| 5,896,438 A | 4/1999 | Miyake et al. ................ 378/34 |
| 5,963,305 A | 10/1999 | Mizouchi |
| 5,993,010 A | 11/1999 | Ohzawa et al. ............... 353/99 |
| 5,995,582 A | 11/1999 | Terashima et al. ............ 378/34 |
| 6,057,899 A | 5/2000 | Tanaka et al. ................ 349/95 |
| 6,072,852 A | 6/2000 | Hudyma ...................... 378/34 |
| 6,081,319 A | 6/2000 | Ozawa et al. |
| 6,198,793 B1 | 3/2001 | Schultz et al. ................ 378/34 |
| 6,208,707 B1 | 3/2001 | Oshino |
| 6,229,647 B1 | 5/2001 | Takahashi et al. |
| 6,244,717 B1 | 6/2001 | Dinger ....................... 359/859 |
| 6,255,661 B1 | 7/2001 | Braat ....................... 250/492.2 |
| 6,339,467 B1 | 1/2002 | Sato |
| 6,400,794 B1 | 6/2002 | Schultz et al. |
| 6,426,506 B1 | 7/2002 | Hudyma .................. 250/492.2 |
| 6,438,199 B1 | 8/2002 | Schultz et al. |
| 6,498,351 B1 * | 12/2002 | Kruizinga et al. ....... 250/492.2 |
| 6,507,440 B1 | 1/2003 | Schultz |
| 6,583,937 B1 | 6/2003 | Wangler et al. |
| 6,594,334 B1 | 7/2003 | Ota |
| RE38,438 E | 2/2004 | Takahashi |
| 6,781,671 B2 | 8/2004 | Komatsuda .................. 355/67 |
| 2001/0002155 A1 | 5/2001 | Takahashi et al. .......... 359/858 |

FOREIGN PATENT DOCUMENTS

| | | |
|---|---|---|
| EP | 0359018 A2 | 3/1990 |
| EP | 0 939 341 | 9/1999 |
| EP | 0939341 A2 | 9/1999 |
| EP | 0 962 830 | 12/1999 |
| EP | 1026547 A2 | 8/2000 |
| EP | 1 067 437 A2 | 1/2001 |
| EP | 1 209 503 | 5/2002 |

OTHER PUBLICATIONS

Murphy et al., "Synchrotron Radiation Sources and Condensers for Projection X-Ray Lithography", Applied Optics, vol. 32, No. 34, pp. 6920-6929 (Dec. 1, 1993).

"Handbook on Synchrotron Radiation", Ernst-Echard Koch ed., pp. 140-145, 1098-1111 (1983).

* cited by examiner 200.00 mm 150.00 mm 100.00 mm 100.00 mm

Fig. 42
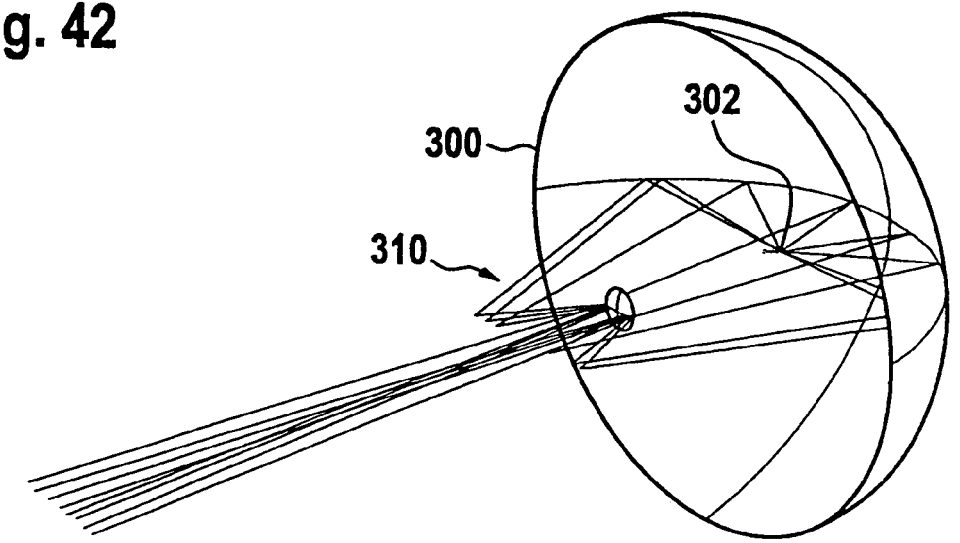
100.00 mm
Fig. 43
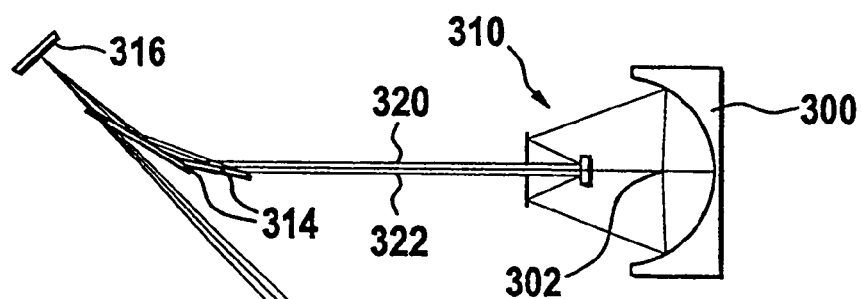
250.00 mm 138.89 mm 227.27 mm

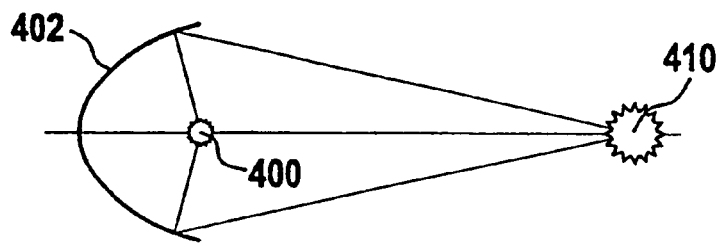
Fig. 49
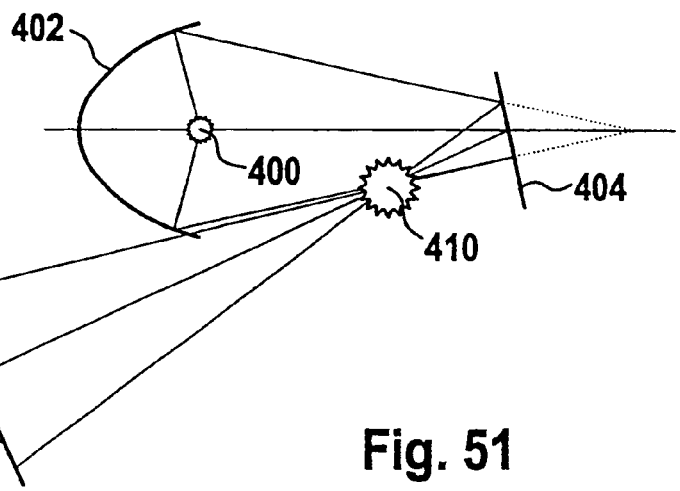
Fig. 50
Fig. 51
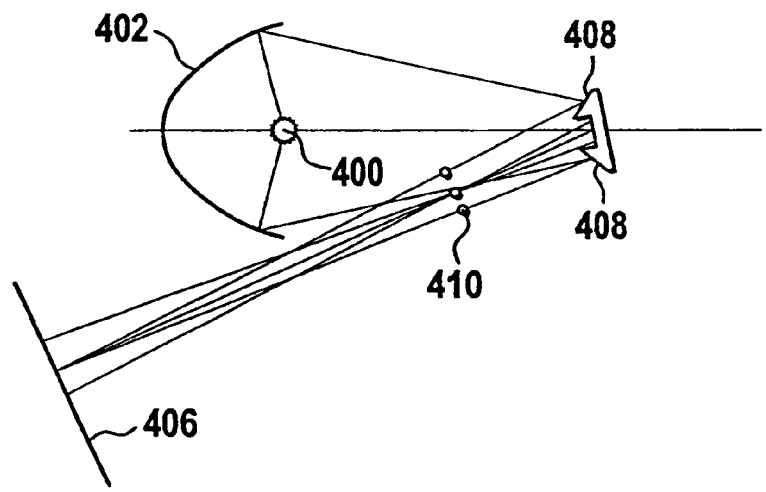
Fig. 52
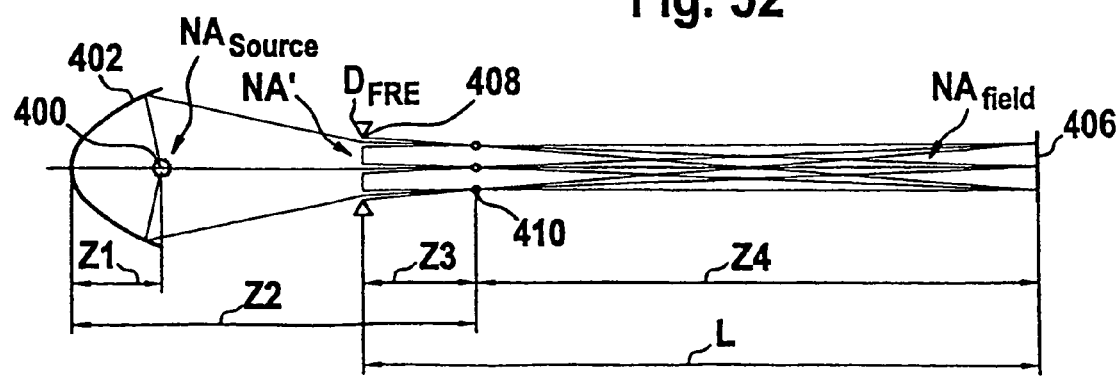

50 mm 271.74mm 227.27mm

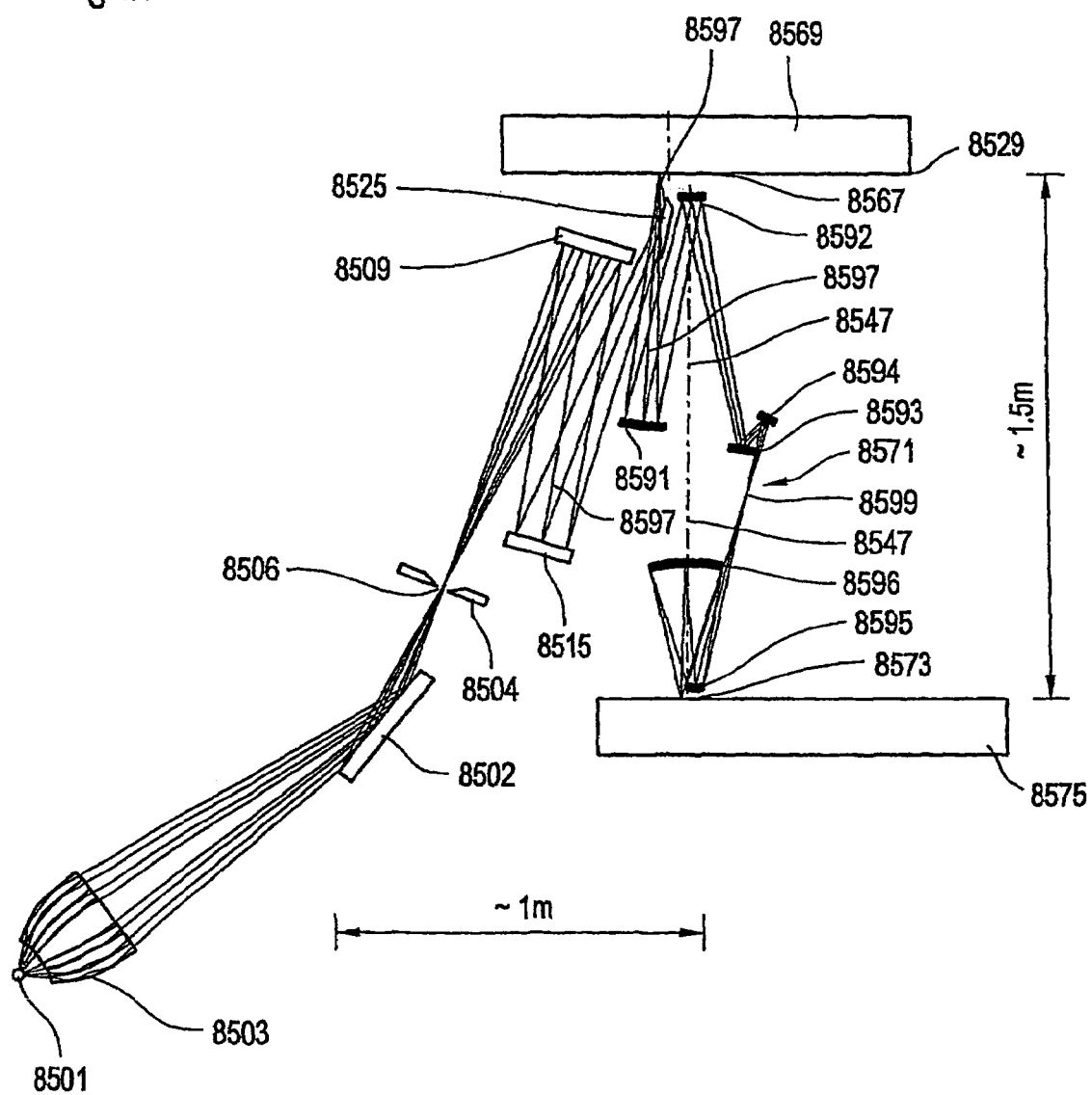

ILLUMINATION SYSTEM PARTICULARLY
FOR MICROLITHOGRAPHY

CROSS-REFERENCE TO A RELATED
APPLICATION

The present application is (a) continuation-in-part of International Application No. PCT/EP03/000485 and (b) a continuation-in-part of U.S. Patent Appl. Ser. No. 10/201,652.

The PCT/EP03/000485 application was filed Jan. 20, 2003, and claims priority of U.S. Patent Appl. Ser. No. 10/201,652.

The 10/201,652 application was filed Jul. 22, 2002, now U.S. Pat. No. 6,859,328, and is (a) a continuation-in-part of U.S. Patent Appl. Ser. No. 10/150,650, and (b) a continuation-in-part of U.S. Patent Appl. Ser. No. 09/679,718.

The 10/150,650 application was filed May 17, 2002, now U.S. Pat. No. 7,006,595, and is a continuation-in-part of the 09/679,718 application.

The 09/679,718 application was filed on Sep. 29, 2000, and is a continuation-in-part of U.S. Patent Appl. Ser. No. 09/305,017. The 09/679,718 application issued as U.S. Patent Appl. Ser. No. 6,438,199.

The 09/305,017 application was filed May 4, 1999, and issued as U.S. Patent Appl. Ser. No. 6,198,793.

The present application is also claiming priority of (a) International Patent Application No. PCT/EP00/07258, filed Jul. 28, 2000, (b) German Patent Application No. 299 02 108.4, filed Feb. 8, 1999, (c) German Patent Application No. 199 03 807.4, filed Feb. 2, 1999, and (d) German Patent Application No. 198 19 898.1, filed May 5, 1998.

BACKGROUND OF THE INVENTION

1. Field of the Invention

The invention concerns a projection exposure apparatus with an illumination system and a projection objective as well as a projection objective in a projection exposure apparatus for wavelengths ≦193 nm.

In order to be able to further reduce the structural widths of electronic components, particularly in the submicron range, it is necessary to reduce the wavelengths of the light utilized for microlithography. Lithography with very deep UV radiation, so called VUV (Very deep UV) lithography or with soft x-ray radiation, so called EUV (extreme UV) lithography, is conceivable at wavelengths smaller than 193 nm, for example.

2. Description of the Prior Art

An illumination system for a lithographic device, which uses EUV radiation, has been made known from U.S. Pat. No. 5,339,346. For uniform illumination in the reticle plane and filling of the pupil, U.S. Pat. No. 5,339,346 proposes a condenser, which is constructed as a collector lens and comprises at least 4 pairs of minor facets, which are arranged symmetrically. A plasma light source is used as the light source.

In U.S. Pat. No. 5,737,137, an illumination system with a plasma light source comprising a condenser mirror is shown, in which an illumination of a mask or a reticle to be illuminated is achieved by means of spherical mirrors.

U.S. Pat. No. 5,361,292 shows an illumination system, in which a plasma light source is provided, and the point plasma light source is imaged in an annular illuminated surface by means of a condenser, which has five aspherical mirrors arranged off-center.

From U.S. Pat. No. 5,581,605, an illumination system has been made known, in which a photon beam is split into a multiple number of secondary light sources by means of a plate with concave raster elements. In this way, a homogeneous or uniform illumination is achieved in the reticle plane. The imaging of the reticle on the wafer to be exposed is produced by means of conventional reduction optics. A gridded mirror is precisely provided with equally curved elements in the illumination beam path.

From U.S. Pat. No. 5,353,322 a lens system for an X-Ray projection lithography camera having a source of X-Ray radiation, a wafer and a mask to be imaged on the wafer has been made know. According to U.S. Pat. No. 5,353,322 a chief ray, which is also called a principle ray, of the radiation incident on the mask is inclined away from the optical axis of the lens system in a direction from the source toward the mask. Whereas in U.S. Pat. No. 5,353,322 in principle a projection exposure apparatus has been made known, the projection exposure apparatus made known from U.S. Pat. No. 5,353,322 does not show how to illuminate the mask in the reticle plane in a homogenous manner.

From EP 0 939 341 A2 an illumination system and an exposure apparatus for wavelengths ≦193 nm has been made known with an optical integrator divided into raster elements for homogenous illumination of a field in an image plane. The raster elements are of arcuate shape as the field formed in the image plane. To illuminate the surface over the arcuate illumination field in an overlapping manner in the image plane, the illumination system of the projection exposure apparatus shown in EP 0 939 341 A2 further includes a condenser optic.

The projection lens shown in the U.S. Pat. No. 5,353,322 is a three mirror projection objective. A disadvantage of the projection objective shown in U.S. Pat. No. 5,353,322 is the small numerical aperture.

From U.S. Pat. No. 5,686,728 a six mirror projection objective is known. The projection objective disclosed therein is used only for UV-light with wavelengths in the region 100–300 nm. The mirrors of this projection objective have a very high asphericity of ±50 μm as well as very large angles of incidence of approximately 38°. Such asphericities and angles of incidence are not practicable for EUV. The aperture stop in the six-mirror objective known from U.S. Pat. No. 5,686,728 is situated between the second mirror and the third mirror. Due to the small distance of 200.525 mm between the first mirror and the second mirror the aperture stop can be varied in its position been the fist and the second mirror only within a small range. Thus, the correction of telecentricity error, coma or astigmatism by shifting the position of the aperture stop is possible only within a small range.

The contents of the above-mentioned patents are incorporated by reference.

None of the aforementioned documents of the state of the art describe a projection objective which allows for a correction of telecentricity errors as well as coma and astigmatism in a broad range. Furthermore none of the references cited above shows a projection exposure apparatus with a homogenous illumination of a field in the image plane of the projection exposure apparatus and a high transmission of the light intensity entering the projection exposure apparatus.

SUMMARY OF THE INVENTION

The invention provides a projection objective which allows for a correction of telecentricity errors as well as coma and astigmatism in a broad range. This is achieved by providing a projection objective with a freely accessible aperture stop and a aperture stop which can be displaced along the optical axis of the projection objective. Advantageously due to a large distance or so called long drift section between two successive mirrors, e.g. the first and the second mirror or the second and the third mirror a aperture stop between these successive mirrors can be displaced over a large distance By displacing the aperture stop in a first place telecentricity can be corrected. In a second place also coma and astigmatism can be corrected.

In a prefered embodiment, the aperture stop is not positioned on or near a mirror surface. In such an embodiment the aperture stop is passed only once by a light bundle traveling from the object plane to the image plane. In the object plane of the projection objective e.g. a mask is situated which is imaged by the projection objective into an image plane, in which a light sensitive substrate is situated. By passing the aperture sp only once vignetting effects by the aperture stop can be avoided.

In a preferred embodiment, the projection objective comprises six mirrors, a first mirror, a second mirror, a third mirror, a forth mirror, a forth mirror and a sixth mirror in centered arrangement around an optical axis.

All surface of the mirrors in this application are rotational symmetric around a common optical axis. The common optical axis is also called principle axis (PA).

The vertex of a surface of a mirror is in this application defined as the intersection point of the surface of the mirror with the principal axis (PA).

Each mirror has a mirror surface. The mirror surface is the physical mirror surface upon which the bundle of light traveling through the objective from the object plane to the image plane impinges. The physical mirror surface or used area of a mirror can be an off-axis or on-segment relative to the principal axis.

To provide a compact design with an accessible aperture stop and to establish an obscuration-free light path of the bundle of light rays traveling from the object plane to the image plane, the projection objective is designed in such a way, that an intermediate image of an object situated in the abject plane is formed. The object situated in the object plane is e.g. a pattern-bearing mask. This object is imaged by the projection objective onto e.g. a light-sensitive substrate such as a wafer in the image plane. In a preferred embodiment the projection objective is divided in a first subsystem comprising the first second, third and fourth mirror and a second subsystem comprising a fifth and a sixth mirror. The first subsystem images an object, especially a pattern-bearing mask, situated in a object plane into an real intermediate image. The second subsystem images the intermediate image into an image in the image plane. Preferably, the projection-objective comprises a freely accessible aperture stop e.g. between the vertex of the second and third mirror.

In a first embodiment the aperture stop is located on or near an vertex of an surface of the second mirror. In such an embodiment the aperture stop should be located so near to the surface of the second mirror, that vignetting effects by passing the aperture twice are minimized. By locating the aperture near the surface of the second mirror vignetting effects are minimized which cause undesired variation of the critical dimension (CD) in the lithography process. A critical dimension (CD) in the lithography process is the minimum structure size, which should be resolved by the projection objective. A critical dimension of a projection objective is for example 50 nm line width.

In a further preferred embodiment the aperture stop can be located in the light path from the object plane to the image plane between an vertex of an surface of the second mirror and an vertex of an surface of the third mirror.

In a most preferred embodiment the first mirror is structural situated between the vertex of an surface of the sixth mirror and the image plane. This arrangement has the advantage, that in the first subsystem very low angles of incidence of the rays impinging onto the mask and the mirror surfaces of the second, third and forth mirrors can be realized.

Apart form the projection objective the invention further supplies a projection exposure apparatus comprising such an objective.

Such a projection exposure apparatus comprises a primary light source and an illumination system having an image plane, which coincides with the object plane of the projection objective, a plurality of raster elements for receiving light from said primary light source, wherein said illumination system uses light from said plurality of raster elements to form a field having a plurality of field points in said image plane, and wherein said illumination system has a chief ray associated with each of said plurality of field points thus defining a plurality of chief rays; and furthermore a projection object for imaging a pattern bearing mask situated in the image plane of the illumination system, which coincidence with the object plane of the projection objective onto a light-sensitive object in an image plane of the projection objective. The projection objective comprises an optical axis, which is also denoted as principal axis (PA) in this application. According to the inventive concept the plurality of chief rays, when impinging said pattern bearing mask in a direction from said primary light source toward said pattern bearing mask is inclined away from the optical axis or the so called principal axis of the projection objective.

Such a projection exposure apparatus has the advantage of a homogenous illumination of the pattern-bearing mask and furthermore it comprises as few optical components as possible. Since in EUV-lithography the light loss of each optical component is in the range of 10–40% a system as the projection exposure apparatus with the inventive projection objective comprising with as few optical components as possible provides for a high transmission of light entering the projection exposure apparatus and furthermore is very compact in size, i.e. the volume of the beam path is reduced. This is especially advantageous because the whole beam path of an EUV-lithography system has to be situated in vacuum.

The projection exposure apparatus according to the invention comprises a primary light source, an illumination system and a projection objective.

The illumination system illuminates a structured reticle arranged in the image plane of the illumination system, which will be imaged by a projection objective onto a light sensitive substrate. In stepper-type lithography systems the reticle is illuminated with a rectangular field, wherein a pregiven uniformity of the light intensity inside the field is required, for example better than ±5%. In scanner-type lithography systems the reticle is illuminated with a rectangular or arc-shaped field, wherein a pregiven uniformity of the scanning energy distribution inside the field is required, for example better than ±5%. The scanning energy is defined as the line integral over the light intensity in the scanning direction. The shape of the field is dependent on the type of projection objective. All reflective projection objectives typically have an arc-shaped field, which is given by a segment of an annulus. A further requirement is the illumination of the exit pupil of the illumination system, which is located at the entrance pupil of the projection objective. A nearly field-independent illumination of the exit pupil is required.

Typical light sources for wavelengths between 100 nm and 200 nm are excimer lasers, for example an ArF-Laser for 193 nm, an $F_2$-Laser for 157 nm, an $Ar_2$-Laser for 126 nm and an NeF-Laser for 109 nm. For systems in this wavelength region refractive components of $SiO_2$, $CaF_2$, $BaF_2$ or other crystallites are used. Since the transmission of the optical materials deteriorates with decreasing wavelength, the illumination systems are designed with a combination of refractive and reflective components. For wavelengths in the EUV wavelength region, between 10 nm and 20 nm, the projection exposure apparatus is designed as all-reflective. A typical EUV light source is a Laser-Produced-Plasma-source, a Pinch-Plasma-Source, a Wiggler-Source or an Undulator-Source.

The light of this primary light source is collected by a collector unit and directed to a first optical element, wherein the collector unit and the first optical element form a first optical component. The first optical element is organized as a plurality of first raster elements and transforms, together with the collector unit, the primary light source into a plurality of secondary light sources. Each first raster element corresponds to one secondary light source and focuses an incoming ray bundle, defined by all rays intersecting the first raster element, to the corresponding secondary light source. The secondary light sources are arranged in a pupil plane of the illumination system or nearby this plane. A field lens forming a second optical component is arranged between the pupil plane and the image plane of the illumination system to image the secondary light sources into an exit pupil of the illumination system, which corresponds to the entrance pupil of a following projection objective. The images of the secondary light sources in the exit pupil of the illumination system are therefore called tertiary light sources.

The first raster elements are imaged into the image plane, wherein their images are at least partially superimposed on a field that must be illuminated. Therefore, they are known as field raster elements or field honeycombs. If the light source is a point-like source, the secondary light sources are also point-like. In this case the imaging of each of the field raster elements can be explained visually with the principle of a "camera obscura", with the small hole of the camera obscura at the position of each corresponding secondary light source, respectively.

To superimpose the images of the field raster elements in the image plane of the illumination system the incoming ray bundles are deflected by the field raster elements with first deflection angles, which are not equal for each of the field raster elements but at least different for two of the field raster elements. Therefore individual deflection angles for the field raster elements are designed.

For each field raster element a plane of incidence is defined by the incoming and deflected centroid ray selected from the incoming ray bundle. Due to the individual deflection angles, at least two of the incidence planes are not parallel.

In advanced microlithography systems the light distribution in the entrance pupil of a projection objective must fulfill special requirements such as having an overall shape or uniformity. Since the secondary light sources are imaged into the exit pupil, their arrangement in the pupil plane of the illumination system determines the light distribution in the exit pupil. With the individual deflection angles of the field raster elements a predetermined arrangement of the secondary light sources can be achieved, independent of the directions of the incoming ray bundles.

For reflective field raster elements the deflection angles are generated by the tilt angles of the field raster elements. The tilt axes and the tilt angles are determined by the directions of the incoming ray bundles and the positions of the secondary light sources, to which the reflected ray bundles are directed.

For refractive field raster element the deflection angles are generated by lenslets, which have a prismatic optical power. The refractive field raster elements can be lenslets with an optical power having a prismatic contribution or they can be a combination of a single prism and a lenslet. The prismatic optical power is determined by the directions of the incoming ray bundles and the positions of the corresponding secondary light sources.

Given the individual deflection angles of the first raster elements, the beam path to the plate with the raster elements can be either convergent or divergent. The slope values of the field raster elements at the centers of the field raster elements has then to be similar to the slope values of a surface with negative power to reduce the convergence of the beam path, or with positive power to increase the divergence of the beam path. Finally the field raster elements deflect the incoming ray bundles to the corresponding secondary light sources having predetermined positions depending on the illumination mode of the exit pupil.

The diameter of the beam path is preferably reduced after the collector unit to arrange filters or transmission windows with a small size. This is possible by imaging the light source with the collector unit to an intermediate image. The intermediate image is arranged between the collector unit and the plate with the field raster elements. After the intermediate image of the light source, the beam path diverges. An additional mirror to condense the diverging rays is not necessary due to the field raster elements having deflecting optical power.

For contamination reasons there is a free working distance between the light source and the collector unit, which results in considerable diameters for the optical components of the collector unit and also for the light beam. Therefore the collector unit has positive optical power to generate a converging ray bundle to reduce the beam diameter and the size of the plate with field raster elements. The convergence of the light rays can be reduced with the field raster elements, if the deflection angles are designed to represent a negative optical power. For the centroid rays impinging on the centers of the field raster elements, the collector unit and the plate with the field raster elements form a telescope system. The collector unit has positive optical power to converge the centroid rays towards the optical axis, wherein the field raster elements reduce the converging angles of the centroid rays. With this telescope system the track length of the illumination system can be reduced.

Preferably, the field raster elements are tilted planar mirrors or prisms with planar surfaces, which are much easier to produce and to qualify than curved surfaces. This is possible, if the collector unit is designed to image the primary light source into the pupil plane of the illumination system, which would result in one secondary light source, if the field raster elements were omitted. The plurality of secondary light sources is generated by the plurality of field raster elements, which distribute the secondary light sources in the pupil plane according to their deflection angles. The positive optical power to focus the incoming ray bundles to the secondary light sources is completely provided by the collector unit. Therefore the optical distance between the image-side principal plane of the collector unit and the image plane of the collector unit is nearly given by the sum of the optical distance between the image-side principal plane of the collector unit and the plate with the field raster elements, and the optical distance between the plate with the field raster elements and the pupil plane of the illumination system. Due to the planar surfaces, the field raster elements do not influence the imaging of the primary light source into one secondary light source, except for the dividing of this one secondary light source into a plurality of secondary light sources due to the deflection angles. For point-like or spherical sources the collector unit has ellipsoidal mirrors or conical lenses with a first or second focus, wherein the primary light source is arranged in the first focus, and the secondary light source is arranged in the second focus of the collector unit.

Dependent on the focusing optical power of the collector unit, the field raster elements can have a positive or negative optical power. If the focusing power of the collector unit is too low and the primary light source is imaged behind the pupil plane, the field raster elements are preferably concave mirrors or lenslets comprising positive optical power to generate the secondary light sources in or nearby the pupil plane. If the focusing power of the collector unit is too strong and the primary light source is imaged in front of the pupil plane, the field raster elements are preferably convex mirrors or lenslets comprising negative optical power to generate the secondary light sources in or nearby the pupil plane.

The field raster elements are preferably arranged in a two-dimensional array on a plate without overlapping. For reflective field raster elements the plate can be a planar plate or a curved plate. To minimize the light losses between adjacent field raster elements they are arranged only with intermediate spaces between them, which are necessary for the mountings of the field raster elements. Preferably, the field raster elements are arranged in a plurality of rows having at least one field raster element and being arranged among one another. In the rows the field raster elements are put together at the smaller side of the field raster elements. At least two of these rows are displaced relative to one another in the direction of the rows. In one embodiment each row is displaced relative to the adjacent row by a fraction of a length of the field raster elements to achieve a regular distribution of the centers of the field raster elements. The fraction is dependent on the side aspect ratio and is preferably equal to the square root of the length of one field raster element. In another embodiment the rows are displaced in such a way that the field raster elements are illuminated almost completely.

Preferably, only these field raster elements are imaged into the image plane, which is completely illuminated. This can be realized with a masking unit in front of the plate with the field raster elements, or with an arrangement of the field raster elements wherein 90% of the field raster elements are completely illuminated.

It is advantageous to insert a second optical element with second raster elements in the light path after the first optical element with first raster elements, wherein one first raster element corresponds to one of the second raster elements. Therefore, the deflection angles of the first raster elements are designed to deflect the ray bundles impinging on the first raster elements to the corresponding second raster elements.

The second raster elements are preferably arranged at the secondary light sources and are designed to image together with the field lens the first raster elements or field raster elements into the image plane of the illumination system, wherein the images of the field raster elements are at least partially superimposed. The second raster elements are called pupil raster elements or pupil honeycombs. To avoid damaging the second raster elements due to the high intensity at the secondary light sources, the second raster elements are preferably arranged defocused of the secondary light sources, but in a range from 0 mm to 10% of the distance between the first and second raster elements.

For extended secondary light sources the pupil raster elements preferably have a positive optical power to image the corresponding field raster elements, which are arranged optically conjugated to the image plane. The pupil raster elements are concave mirrors or lenslets with positive optical power.

The pupil raster elements deflect incoming ray bundles impinging on the pupil raster elements with second deflection angles in such a way that the images of the field raster elements in the image plane are at least partially superimposed. This is the case if a ray intersecting the field raster element and the corresponding pupil raster element in their centers intersects the image plane in the center of the illuminated field or nearby the center. Each pair of a field raster element and a corresponding pupil raster element forms a light channel.

The second deflection angles are not equal for each pupil raster element. They are preferably individually adapted to the directions of the incoming ray bundles and the requirement to superimpose the images of the field raster elements at least partially in the image plane.

With the tilt axis and the tilt angle for a reflective pupil raster element or with the prismatic optical power for a refractive pupil raster element the second deflection angle can be individually adapted.

For point-like secondary light sources the pupil raster elements only have to deflect the incoming ray bundles without focusing the rays. Therefore the pupil raster elements are preferably designed as tilted planar mirrors or prisms.

If both, the field raster elements and the pupil raster elements deflect incoming ray bundles in predetermined directions, the two-dimensional arrangement of the field raster elements can be made different from the two-dimensional arrangement of the pupil raster elements. Wherein the arrangement of the field raster elements is adapted to the illuminated area on the plate with the field raster elements, the arrangement of the pupil raster elements is determined by the kind of illumination mode required in the exit pupil of the illumination system. So the images of the secondary light sources can be arranged in a circle, but also in an annulus to get an annular illumination mode or in four decentered segments to get a Quadrupol illumination mode. The aperture in the image plane of the illumination system is approximately defined by the quotient of the half diameter of the exit pupil of the illumination system and the distance between the exit pupil and the image plane of the illumination system. Typical apertures in the image plane of the illumination system are in the range of 0.02 and 0.1. By deflecting the incoming ray bundles with the field and pupil raster elements a continuous light path can be achieved. It is also possible to assign each field raster element to any of the pupil raster elements. Therefore the light channels can be mixed to minimize the deflection angles or to redistribute the intensity distribution between the plate with the field raster elements and the plate with the pupil raster elements.

Imaging errors such as distortion introduced by the field lens can be compensated for with the pupil raster elements being arranged at or nearby the secondary light sources. Therefore the distances between the pupil raster elements are preferably irregular. The distortion due to tilted field mirrors for example is compensated for by increasing the distances between the pupil raster elements in a direction perpendicular to the tilt axis of the field mirrors. Also, the pupil raster elements are arranged on curved lines to compensate for the distortion due to a field mirror, which transforms the rectangular image field to a segment of an annulus by conical reflection. By tilting the field raster elements the secondary light sources can be positioned at or nearby the distorted grid of the corresponding pupil raster elements.

For reflective field and pupil raster elements the beam path has to be folded at the plate with the field raster elements and at the plate with the pupil raster elements to avoid vignetting. Typically, the folding axes of both plates are parallel. Another requirement for the design of the illumination system is to minimize the incidence angles on the reflective field and pupil raster elements. Therefore the folding angles have to be as small as possible. This can be achieved if the extent of the plate with the field raster elements is approximately equal to the extent of the plate with the pupil raster elements in a direction perpendicular to the direction of the folding axes, or if it differs less than ±10%.

Since the secondary light sources are imaged into the exit pupil of the illumination system, their arrangement determines the illumination mode of the pupil illumination. Typically the overall shape of the illumination in the exit pupil is circular and the diameter of the illuminated region is in the order of 60%–80% of the diameter of the entrance pupil of the projection objective. The diameters of the exit pupil of the illumination system and the entrance pupil of the projection objective are in another embodiment preferably equal. In such a system the illumination mode can be changed in a wide range by inserting masking blades at the plane with the secondary light sources to get a conventional, Dipol or Quadrupol illumination of the exit pupil.

All-reflective projection objectives used in the EUV wavelength region have typically an object field being a segment of an annulus. Therefore the field in the image plane of the illumination system in which the images of the field raster elements are at least partially superimposed has preferably the same shape. The shape of the illuminated field can be generated by the optical design of the components or by masking blades which have to be added nearby the image plane or in a plane conjugated to the image plane.

The field raster elements are preferably rectangular. Rectangular field raster elements have the advantage that they can be arranged in rows being displaced against each other. Depending on the field to be illuminated they have a side aspect ratio in the range of 5:1 and 20:1. The length of the rectangular field raster elements is typically between 15 mm and 50 mm, the width is between 1 mm and 4 mm.

To illuminate an arc-shaped field in the image plane with rectangular field raster elements the field lens preferably comprises a first field mirror for transforming the rectangular images of the rectangular field raster elements to arc-shaped images. The arc length is typically in the range of 80 mm to 105 mm, the radial width in the range of 5 mm to 9 mm. The transformation of the rectangular images of the rectangular field raster elements can be done by conical reflection with the first field mirror being a grazing incidence mirror with negative optical power. In other words, the imaging of the field raster elements is distorted to get the arc-shaped images, wherein the radius of the arc is determined by the shape of the object field of the projection objective. The first field mirror is preferably arranged in front of the image plane of the illumination system, wherein there should be a free working distance. For a configuration with a reflective reticle the free working distance has to be adapted to the fact that the rays traveling from the reticle to the projection objective are not vignetted by the first field mirror.

The surface of the first field mirror is preferably an off-axis segment of a rotational symmetric reflective surface, which can be designed aspherical or spherical. The axis of symmetry of the supporting surface goes through the vertex of the surface. Therefore a segment around the vertex is called on axis, wherein each segment of the surfaces which does not include the vertex is called off-axis. The supporting surface can be manufactured more easily due to the rotational symmetry. After producing the supporting surface the segment can be cut out with well-known techniques.

The surface of the first field mirror can also be designed as an on-axis segment of a toroidal reflective surface. Therefore the surface has to be processed locally, but has the advantage that the surrounding shape can be produced before surface treatment.

The incidence angles of the incoming rays with respect to the surface normals at the points of incidence of the incoming rays on the first field mirror are preferably greater than 70°, which results in a reflectivity of the first field mirror of more than 80%.

The field lens comprises preferably a second field mirror with positive optical power. The first and second field mirror together image the secondary light sources or the pupil plane respectively into the exit pupil of the illumination system, which is defined by the entrance pupil of the projection objective. The second field mirror is arranged between the plane with the secondary light sources and the first field mirror.

The second field mirror is preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the second field mirror are preferably lower than 25°. Since the mirrors have to be coated with multilayers for the EUV wavelength region, the divergence and the incidence angles of the incoming rays are preferably as low as possible to increase the reflectivity, which should be better than 65%. With the second field mirror being arranged as a normal incidence mirror the beam path is folded and the illumination system can be made more compact.

To reduce the length of the illumination system the field lens comprises preferably a third field mirror. The third field mirror is preferably arranged between the plane with the secondary light sources and the second field mirror.

The third field mirror has preferably negative optical power and forms together with the second and first field mirror an optical telescope system having a object plane at the secondary light sources and an image plane at the exit pupil of the illumination system to image the secondary light sources into the exit pupil. The pupil plane of the telescope system is arranged at the image plane of the illumination system. Therefore the ray bundles coming from the secondary light sources are superimposed in the pupil plane of the telescope system or in the image plane of the illumination system accordingly. The first field mirror has mainly the function of forming the arc-shaped field, wherein the telescope system is mainly determined by the negative third field mirror and the positive second field mirror.

In another embodiment the third field mirror has preferably positive optical power to generate images of the secondary light sources in a plane between the third and second field mirror, forming tertiary light sources. The tertiary light sources are imaged with the second field mirror and the first field mirror into the exit pupil of the illumination system. The images of the tertiary light sources in the exit pupil of the illumination system are called in this case quaternary light sources.

Since the plane with the tertiary light sources is arranged conjugated to the exit pupil, this plane can be used to arrange masking blades to change the illumination mode or to add transmission filters. This position in the beam path has the advantage to be freely accessible.

The third field mirror is similar to the second field mirror preferably an off-axis segment of a rotational symmetric reflective surface, which can be designed aspherical or spherical, or an on-axis segment of a toroidal reflective surface.

The incidence angles of the incoming rays with respect to the surface normals at the points of incidence of the incoming rays on the third field mirror are preferably lower than 25°. With the third field mirror being arranged as a normal incidence mirror the beam path can be folded again to reduce the overall size of the illumination system.

To avoid vignetting of the beam path the first, second and third field mirrors are preferably arranged in a non-centered system. There is no axis of symmetry for the mirrors. An optical axis can be defined as a connecting line between the centers of the used areas on the field mirrors, wherein the optical axis is bent at the field mirrors depending on the tilt angles of the field mirrors.

With the tilt angles of the reflective components of the illumination system the beam paths between the components can be bent. Therefore the orientation of the beam cone emitted by the source and the orientation of the image plane system can be arranged according to the requirements of the overall system. A preferable configuration has a source emitting a beam cone in one direction and an image plane having a surface normal which is oriented almost perpendicular to this direction. In one embodiment the source emits horizontally and the image plane has a vertical surface normal. Some light sources like undulator or wiggler sources emit only in the horizontal plane. On the other hand the reticle should be arranged horizontally for gravity reasons. The beam path therefore has to be bent between the light source and the image plane about almost 90°. Since mirrors with incidence angles between 30° and 60° lead to polarization effects and therefore to light losses, the beam bending has to be done only with grazing incidence or normal incidence mirrors. For efficiency reasons the number of mirrors has to be as small as possible.

A very compact configuration of the illumination system can be designed, if the beam path from the plate with the pupil raster elements to the field lens is crossing the beam path from the collector unit to the plate with field raster elements. This is only possible, if the field raster elements and the pupil raster elements are reflective ones and are arranged on plates being tilted to achieve the crossing of the two beam paths. The crossing of the beam paths has the advantage that the beam path after the plate with the pupil raster elements has an angle in the range of 35° to 55° with respect to the beam path in front of the plate with the field raster elements. This was achieved with only two normal incidence reflections.

By definition all rays intersecting the field in the image plane have to go through the exit pupil of the illumination system. The position of the field and the position of the exit pupil are defined by the object field and the entrance pupil of the projection objective. For some projection objectives being centered systems the object field is arranged off-axis of an optical axis, wherein the entrance pupil is arranged on-axis in a finite distance to the object plane. For these projection objectives an angle between a straight line from the center of the object field to the center of the entrance pupil and the surface normal of the object plane can be defined. This angle is in the range of 3° to 10° for EUV projection objectives. Therefore the components of the illumination system have to be configured and arranged in such a way that all rays intersecting the object field of the projection objective are going through the entrance pupil of the projection objective being decentered to the object field. For projection exposure apparatus with a reflective reticle all rays intersecting the reticle needs to have incidence angles greater than 0° to avoid vignetting of the reflected rays at components of the illumination system.

In the EUV wavelength region all components are reflective components, which are arranged preferably in such a way, that all incidence angles on the components are lower than 25° or greater than 65°. Therefore polarization effects arising for incidence angles around an angle of 45° are minimized. Since grazing incidence mirrors have a reflectivity greater than 80%, they are preferable in the optical design in comparison to normal incidence mirrors with a reflectivity greater than 65%.

The illumination system is typically arranged in a mechanical box. By folding the beam path with mirrors the overall size of the box can be reduced. This box preferably does not interfere with the image plane, in which the reticle and the reticle supporting system are arranged. Therefore it is advantageous to arrange and tilt the reflective components in such a way that all components are completely arranged on one side of the reticle. This can be achieved if the field lens comprises only an even number of normal incidence mirrors.

The illumination system as described before can be used preferably in a projection exposure apparatus comprising the illumination system, a reticle arranged in the image plane of the illumination system and a projection objective to image the reticle onto a wafer arranged in the image plane of the projection objective. Both, reticle and wafer are arranged on a support unit, which allows the exchange or scan of the reticle or wafer.

The projection objective can be a catadioptric lens, as known from U.S. Pat. No. 5,402,267 for wavelengths in the range between 100 nm and 200 nm. These systems have typically a transmission reticle.

For the EUV wavelength range the projection objectives are preferably all-reflective systems with four to eight mirrors as known for example from U.S. Ser. No. 09/503,640 showing a six mirror projection lens. These systems have typically a reflective reticle.

For systems with a reflective reticle the illumination beam path between the light source and the reticle and the projection beam path between the reticle and the wafer preferably interfere only nearby the reticle, where the incoming and reflected rays for adjacent object points are traveling in the same region. If there are no further crossing of the illumination and projection beam path it is possible to separate the illumination system and the projection objective except for the reticle region.

The projection objective has preferably a projection beam path between the reticle and the first imaging element which is convergent toward the optical axis of the projection objective. Especially for a projection exposure apparatus with a reflective reticle the separation of the illumination system and the projection objective is easier to achieve.

BRIEF DESCRIPTION OF THE DRAWINGS

The invention will be described below on the basis of drawings. Here:

FIGS. 40–45: Course of the light beams in a system with collector unit as well as two tele-mirrors according to FIGS. 37–39;

FIGS. 49–52: System with a laser-plasma source, a collector and a field raster element plate with planar field raster elements;

FIG. 91 a first embodiment of a projection exposure apparatus with a inventive projection exposure objective.

DESCRIPTION OF THE INVENTION

It shall be shown theoretically on the basis of FIGS. 1–20, how a system can be provided for any desired illumination distribution in a plane, which satisfies the requirements with reference to uniformity and telecentricity.

Figure 1:
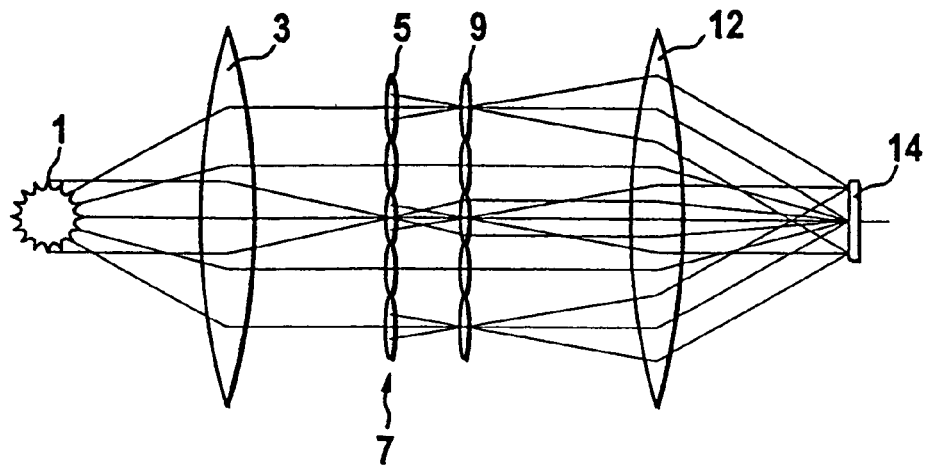
FIG. 1: Principle diagram of the beam path of a system with two raster element plates.

In FIG. 1, a principle diagram of the beam path of a system with two plates with raster elements is illustrated. The light of the primary light source 1 is collected by means of a collector lens 3 and converted into a parallel or convergent light beam. The field raster elements 5 of the first raster element plate 7 decompose the light beam and produce secondary light sources at the site of the pupil raster elements 9. At the position of the secondary light sources the pupil plane of the illumination system is arranged. The field lens 12 images these secondary sources in the et pupil of the illumination system or the entrance pupil of the subsequent projection objective forming tertiary light sources. The field raster elements 5 are imaged by the pupil raster elements 9 and the field lens 12 into the image plane of the illumination system. In this plane the reticle 14 is arranged. Such an arrangement is characterized by an interlinked beam path of field and pupil planes from the source up to the entrance pupil of the subsequent projection objective. For this, the designation "Köhler illumination" is also often selected.

The illumination system according to FIG. 1 is considered segmentally below. If the light intensity and aperture distribution is known in the plane of the field raster elements, the system can be described independent of source type and collector unit.

Figure 2A:
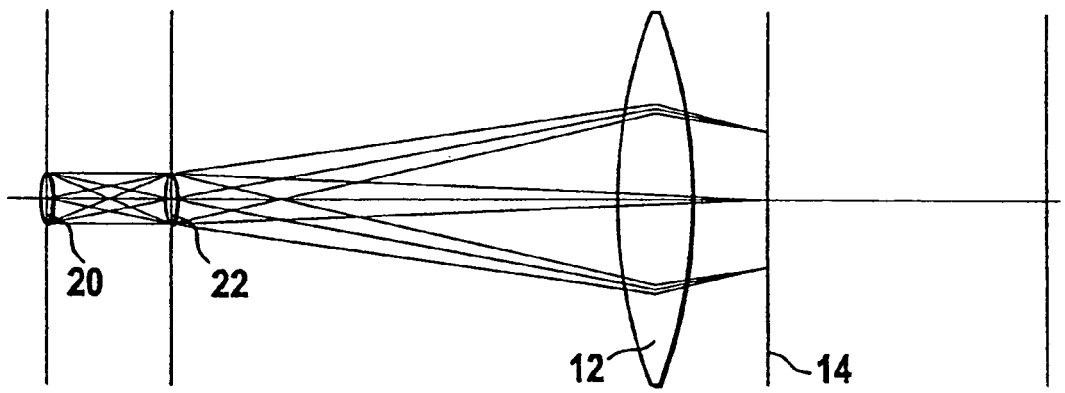
FIGS. 2a, 2b: Imaging of the field and pupil raster elements.
Figure 2B:
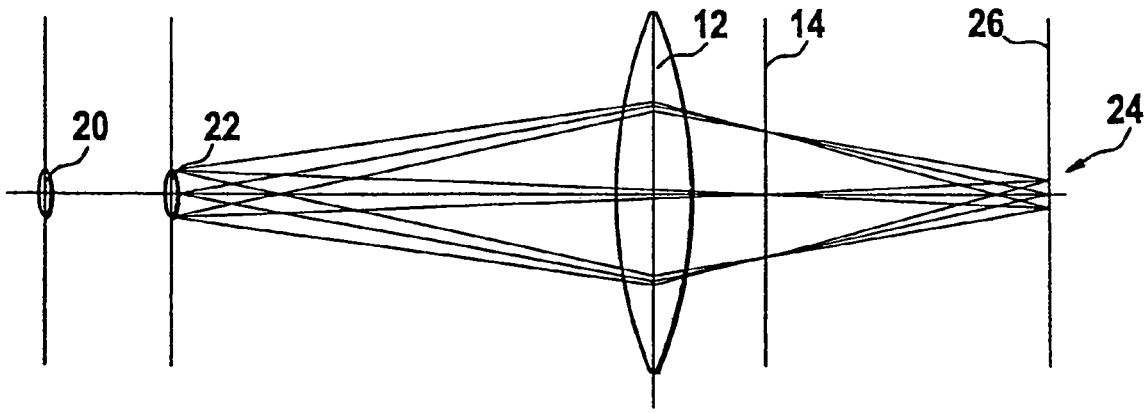

The field and pupil imaging are illustrated for the central pair of field raster element 20 and pupil raster element 22 in FIGS. 2A and 2B. The field raster element 20 is imaged on the reticle 14 or the mask by means of the pupil raster element 22 and the field lens 12. The geometric extension of the field raster element 20 determines the shape of the illuminated field in the reticle plane 14. The image scale is approximately given by the ratio of the distance from pupil raster element 22 to reticle 14 and the distance from field raster element 20 to pupil raster element 22. The field raster element 20 is designed such that an image of primary light source 1, a secondary light source, is formed at the site of pupil raster element 22. If the extension of the primary light source 1 is small, for example, approximately point-like, then all light rays run through the centers of the pupil raster elements 22. In such a case, an illumination device can be produced, in which the pupil raster element is dispensed with.

As is shown in FIG. 2B, the task of field lens 12 consists of imaging the secondary light sources in the entrance pupil 26 of projection objective 24 forming tertiary light sources. With the field lens the field imaging can be influenced in such a way that it forms the arc-shaped field by control of the distortion. The imaging scale of the field raster element image is thus almost not changed.

Figure 3:
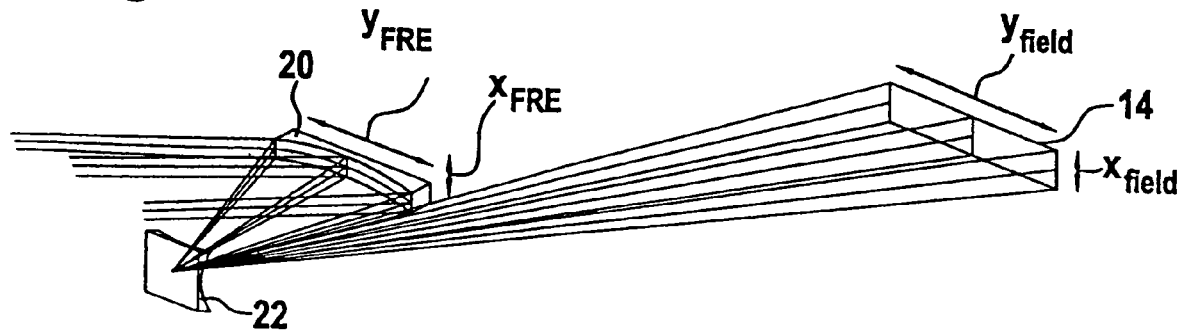
FIG. 3: Path of the light beam for a rectangular field raster element in combination with a pupil raster element.

A special geometrical form of a field raster element 20 and a pupil raster element 22 is shown in FIG. 3.

Figure 4:
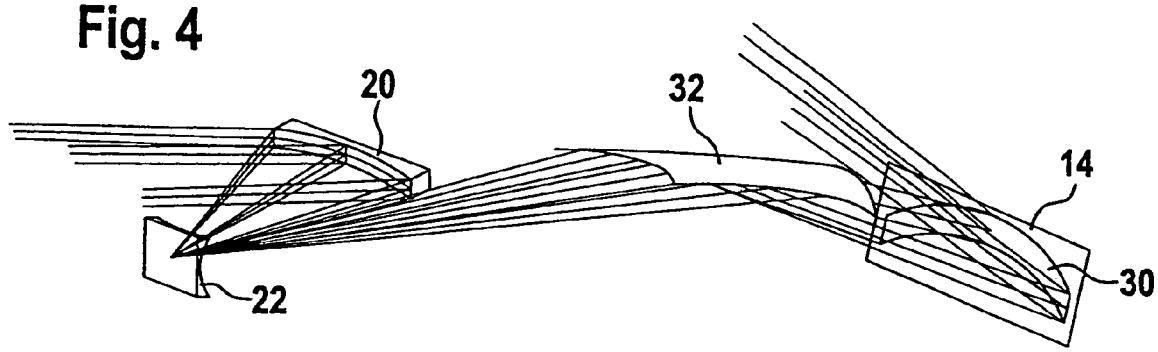
FIG. 4: Beam path according to FIG. 3 with field lens introduced in the beam path.

In the form of embodiment represented in FIG. 3, the shape of field raster element 20 is selected as a rectangle. Thus, the aspect ratio of the field raster element 20 corresponds approximately to the ratio of the arc length to the annular width of the required arc-shaped field in the reticle plane. The arc-shaped field is formed by the field lens 32, as shown in FIG. 4. Without the field lens 32, as shown in FIG. 3, a rectangular field is formed in the reticle plane.

According to the invention as shown in FIG. 4, one grazing-incidence field mirror 32 is used for the shaping of arc-shaped field 30. Under the constraint that the beam reflected by the reticle should not be directed back into the illumination system, one or two field mirrors 32 are required, depending on the position of the entrance pupil of the objective.

If the principal rays run divergently into the objective that is not shown, then one field mirror 32 is sufficient, as shown in FIG. 4. If only one field mirror for shaping the field is used according to the invention, the entrance pupil of the projection objective of the illumination system is situated in a light path from the primary light source to the reticle before the image plane. By definition, for an ideal system with a homocentric pupil, the principle rays associated to each field point of the field in the image plane intersects each other in the centre of the entrance pupil of the projection objective. The centre of the entrance pupil is defined by the intersection of the entrance pupil plane with the optical axis of the projection objective. In a non-ideal system the entrance pupil can be non-homocentric due to the design or aberrations of the projection objective, and the principle rays may not intersect at all due to aberrations of the illumination system. According to the invention if a reflective mask as a reticle is used, the plurality of principle rays are reflected divergent at the reflective mask into the projection objective.

Figure 5:
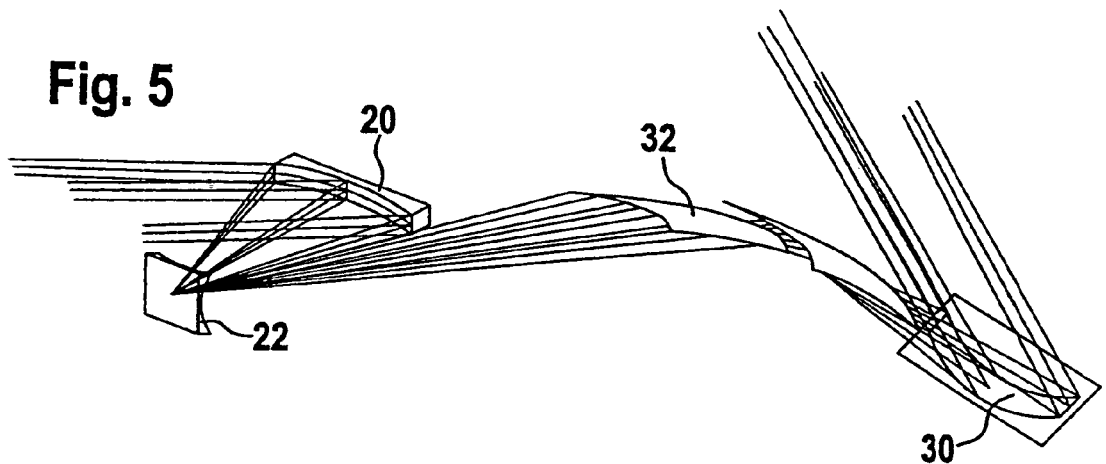
FIG. 5: Beam path according to FIG. 3 with two field mirrors introduced in the beam path.

In the case of principal rays entering the projection objective convergently, two field mirrors are required. The second field mirror must rotate the orientation of the ring 30. Such a configuration is shown in FIG. 5.

In the case of an illumination system in the EUV wavelength region, all components must be reflective ones.

Due to the high reflection losses at λ=10 nm–14 nm, it is advantageous that the number of reflections be kept as small as possible. Therefore a system with only one field shaping mirror and an entrance pupil situated in the light path from the primary light source to the reticle, before the reticle, can provide for a projection exposure system with a high transmission of light. Furthermore, due to the effect that the entrance pupil is situated before the reticle in the direction of the light path from the primary light source to the reticle, the system can be designed more compact compared, for example, with a system with two field mirrors and an entrance pupil situated in such a system in the direction of the light path behind the reticle.

In the construction of the reflective system, the mutual vignetting of the beams must be taken into consideration. This can occur due to construction of the system in a zigzag beam path or by operating with obscurations.

The design process will be described below for the preparation of a design for an EUV illumination system with any illumination in a plane, as an example.

Figure 6:
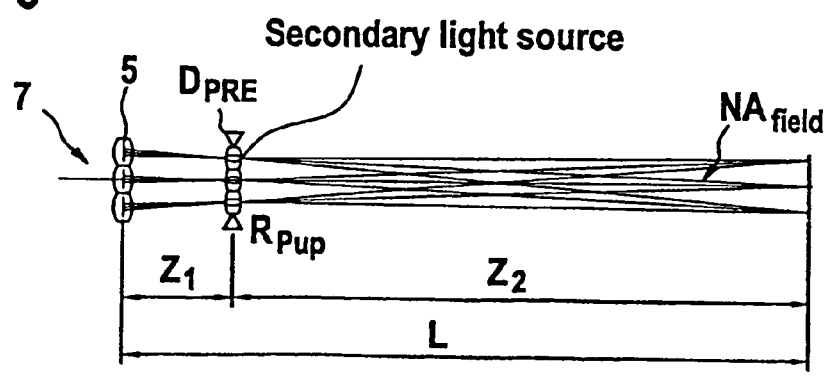
FIG. 6: System with field and pupil raster elements.

The definitions necessary for the design process are shown in FIG. 6.

First, the beam path is calculated for the central pair of raster elements.

In a first step, the size of field raster elements 5 of the field raster element plate 7 will be determined. As indicated previously, the aspect ratio (x/y) results for rectangular raster elements from the shape of the arc-shaped field in the reticle plane. The size of the field raster elements is determined by the illuminated area A of the intensity distribution of the arbitrary light source in the plane of the field raster elements and the number N of the field raster elements on the raster element plate, which in turn is given by the number of secondary light sources. The number of secondary light sources results in turn from the uniformity of the field and pupil illumination.

The raster element surface $A_{FRE}$ of a field raster element can be expressed as follows with $x_{FRE}$, $y_{FRE}$:

$$A_{FRE} = x_{FRE} \cdot y_{FRE} = (x_{field}/y_{field}) \cdot y^2_{FRE}$$

whereby $x_{field}$, $y_{field}$ describe the size of the rectangle, which establishes the arc-shaped field. Further, the following is valid for the number N of field raster elements:

$$N = A/A_{FRE} = A/[y^2_{FRE} \cdot (x_{field}/y_{field})].$$

From this, there results for the size of the individual field raster element:

$$y_{FRE} = \sqrt{A/[N \cdot (x_{field}/y_{field})]}$$

and $$x_{FRE} = (x_{field}/y_{field}) \cdot y_{FRE}$$

The raster element size and the size of the rectangular field in the reticle plane establish the imaging scale $\beta_{FRE}$ of the field raster element imaging and thus the ratio of the distances $z_1$ and $z_2$.

$$\beta_{FRE} = x_{field}/y_{field} = z_2/z_1$$

The pregiven structural length L for the illumination system and the imaging scale $\beta_{FRE}$ of the field raster element imaging determine the absolute size of $z_1$ and $z_2$ and thus the position of the pupil raster element plate. The following is valid:

$$z_1 = L/(1+\beta_{FRE})$$

$$z_2 = z_1 \cdot \beta_{FRE}$$

Then, $z_1$ and $z_2$ determine in turn the curvature of the pupil raster elements. The following is valid:

$$R_{FRE} = \frac{2 \cdot z_1 \cdot z_2}{z_1 + z_2}$$

In order to image the pupil raster elements in the entrance pupil of the projection objective and to remodel the rectangular field into an arc-shaped field, a field lens comprising one or more field mirrors, preferably of toroidal form, are introduced between the pupil raster element plate and the reticle. By introducing the field mirrors, the previously given structural length is increased, since among other things, the mirrors must maintain minimum distances in order to avoid light vignetting.

The positioning of the field raster elements depends on the intensity distribution in the plane of the field raster elements. The number N of the field raster elements is pregiven by the number of secondary light sources. The field raster elements will preferably be arranged on the field raster element plate in such a way that they cover the illuminated surfaces without mutually vignetting.

In order to position the pupil raster elements, the raster pattern of the tertiary light sources in the entrance pupil of the projection objective will be given in advance. The tertiary light sources are imaged by the field lens counter to the direction of light into the secondary light sources. The aperture stop plane of this imaging is in the reticle plane. The images of the tertiary light sources give the (x, y, z) positions of the pupil raster elements which are arranged at the positions of the secondary light sources. The tilt and rotational angles remain as degrees of freedom for producing the light path between the field and pupil raster elements.

If a pupil raster element is assigned to each field raster element in one configuration of the invention, then the light path will be produced by tilting and rotating field and pupil raster elements. Thereby the light beams, generated by the field raster elements, are deviated in such a way that the center rays of the light beams all intersect the optical axis in the reticle plane.

The assignment of field and pupil raster elements can be made freely. One possibility for arrangement would be to assign spatially adjacent field and pupil raster elements. Thereby, the deflecting angles become minimal. Another possibility consists of homogenizing the intensity distribution in the pupil plane. This is made, for example, if the intensity distribution has a non-homogenous distribution in the plane of the field raster elements. If the field and pupil raster elements have similar positions, the distribution is transferred to the pupil illumination. By intermixing the light beams the light distribution in the pupil plane can be homogenized.

Advantageously, the individual components of field raster element plate, pupil raster element plate and field mirrors of the illumination system are arranged in the beam path such that a beam path free of vignetting is possible. If such an arrangement has effects on the imaging, then the individual light channels and the field mirrors must be re-optimized.

With the design process described above, illumination systems for EUV lithography are obtained for any light distribution at the plate with the field raster elements with two normal-incidence reflections for the field and pupil raster elements and one to two normal or grazing-incidence reflections for the field lens. These systems have the following properties:

a. An homogeneous illumination of an arc-shaped field b. An homogeneous and field-independent pupil illumination c. The combining of the exit pupil of the illumination system and the entrance pupil of the projection objective d. The adjustment of a pregiven structural length e. The collection of nearly all light generated by the primary light source.

Arrangements of field raster elements and pupil raster elements will be described below for one form of embodiment of the invention with field and pupil raster element plates.

First, different arrangements of the field raster elements on the field raster element plate will be considered. The intensity distribution can be selected as desired.

The introduced examples are limited to simple geometric shapes of the light distributions, such as circle, rectangle, or the coupling of several circles or rectangles, but the present invention is not limited on these shapes.

The intensity distribution will be homogeneous within the illuminated region or have a slowly varying distribution. The aperture distribution will be independent of the position inside the light distribution.

Figure 7:
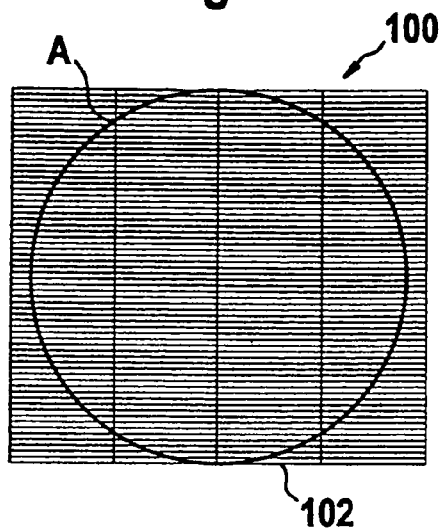
FIGS. 7–14: Different arrangements of field raster elements on a field raster element plate.
Figure 8:
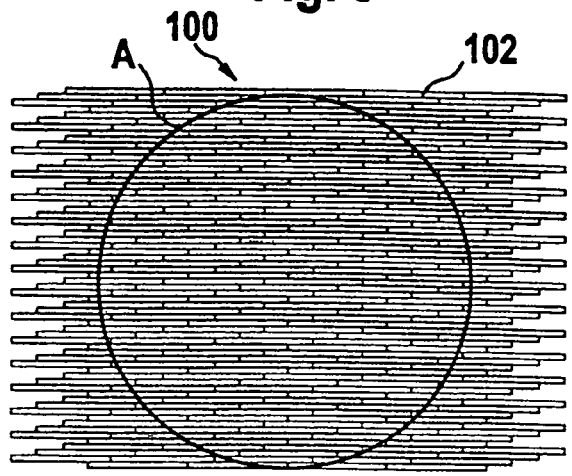

In the case of circular illumination A of field raster element plate 100, field raster elements 102 may be arranged, for example, in columns and rows, as shown in FIG. 7. As an alternative to this, the center points of the raster elements 102 can be distributed uniformly by shifting the rows over the surface, as shown in FIG. 8. The rows are displaced relatively to an adjacent row. This arrangement is better adapted to a uniform distribution of the secondary light sources in the pupil plane.

Figure 9:
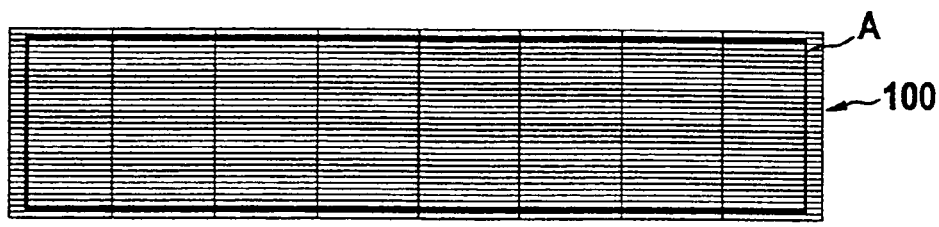
Figure 10:
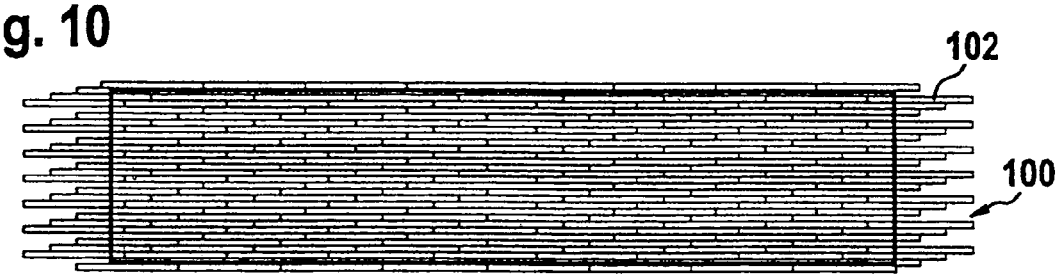

A rectangular illumination A with a arrangement of the field raster elements 102 in rows and columns is shown in FIG. 9. A displacement of the rows, as shown in FIG. 10, leads to a more uniform distribution of the secondary light sources in the pupil plane. However, without tilting the field raster elements 102 the secondary light sources are arranged within a rectangle corresponding to the arrangement of the field raster elements 102. Since the pupil raster elements are typically arranged inside a circle to get a circular illumination of the exit pupil of the illumination system. It is necessary to tilt the field and pupil raster elements to produce a continuous light path between the corresponding field and pupil raster elements.

Figure 11:
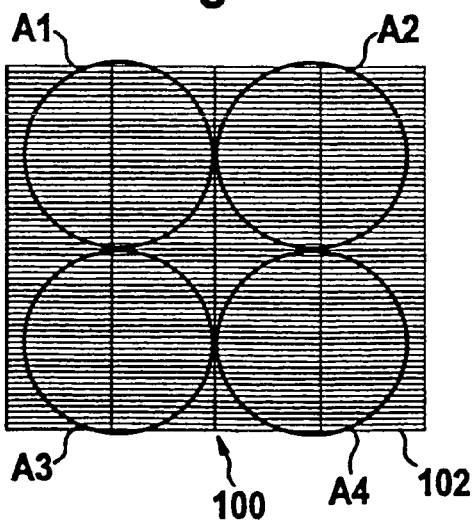
Figure 12:
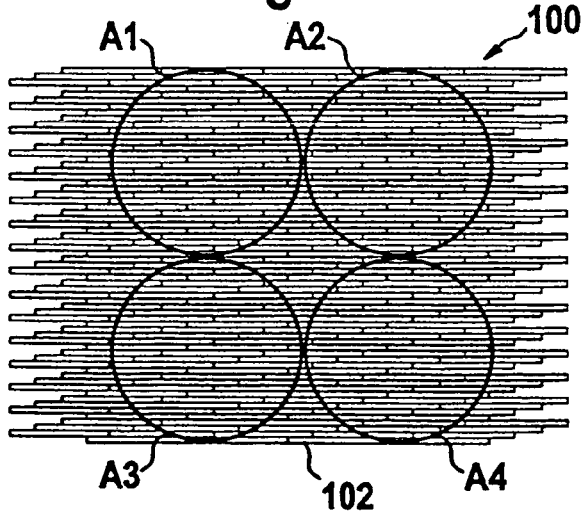

If illumination A of field raster element plate 100 comprises several circles, A1, A2, A3, A4, for example by coupling several sources, then, intermixing is insufficient with an arrangement of the raster elements 102 with a high (x/y)-aspect ratio in rows and columns according to FIG. 11. A more uniform illumination is obtained by shifting the raster element rows, as shown in FIG. 12.

Figure 13:
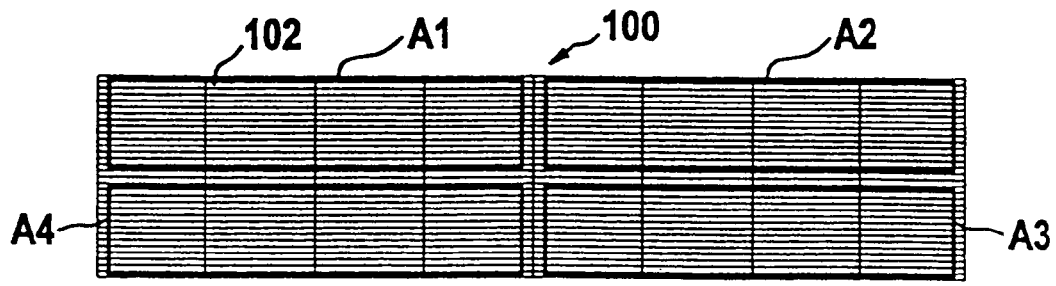
Figure 14:
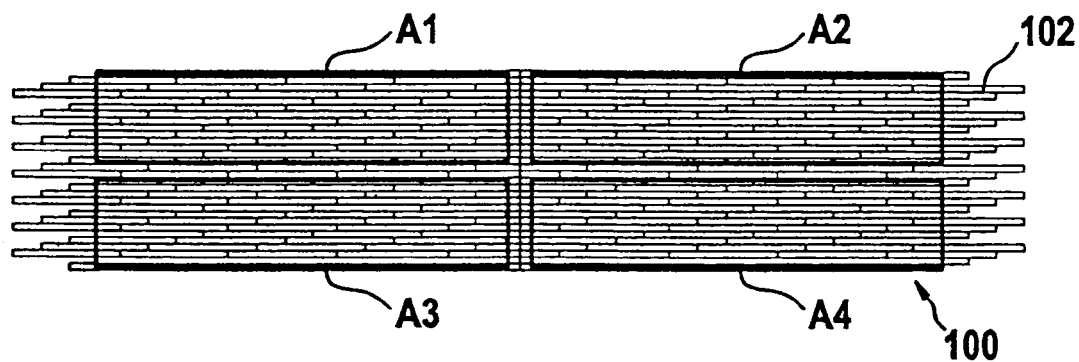

FIGS. 13 and 14 show the distribution of field raster elements 102 in the case of combined illumination from the individual rectangles A1, A2, A3, A4.

Now, for example, arrangements of the pupil raster elements on the pupil raster element plate will be described.

In the arrangement of pupil raster elements, two points of view are to be considered:

1. For minimizing the tilt angle of field and pupil raster elements for producing the light path, it is advantageous to maintain the arrangement of field raster elements. This is particularly advantageous with an approximately circular illumination of the field raster element plate.

2. For homogeneous filling of the pupil, the tertiary light sources, which are images of the secondary light sources, will be distributed uniformly in the entrance pupil of the projection objective. This can be achieved by providing a uniform raster pattern of tertiary light sources in the entrance pupil of the projection objective. These are imaged counter to the direction of light with the field lens in the plane of the pupil raster elements and determine in this way the ideal site of the pupil raster elements, which are arranged nearby the secondary light sources.

If the field lens is free of distortion, then the distribution of the pupil raster elements corresponds to the distribution of the tertiary light sources. However, since the field lens forms the arc-shaped field, distortion is purposely introduced. This does not involve rotational-symmetric distortion, but involves the bending of horizontal lines into arcs. In the ideal case, the y distance of the arcs remains almost constant. Real grazing-incidence field mirrors, however, also show an additional distortion in the y-direction.

Figure 15:
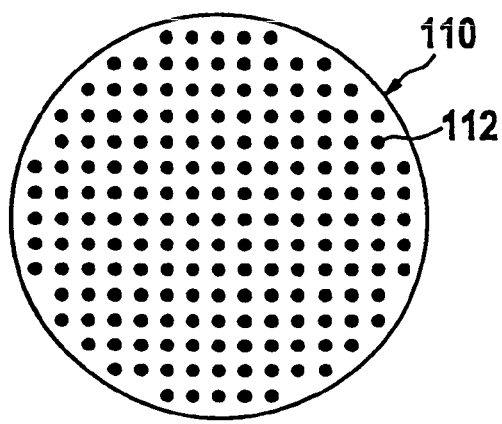
FIGS. 15–17: Raster of tertiary light sources in the entrance pupil of the projection objective.

A raster 110 of tertiary light sources 112 in the entrance pupil of the projection objective, which is also the exit pupil of the illumination system, is shown in FIG. 15, as it had been produced for distortion-free field lens imaging. The arrangement of the tertiary light sources 112 corresponds precisely to the pregiven arrangement of pupil raster elements.

Figure 16:
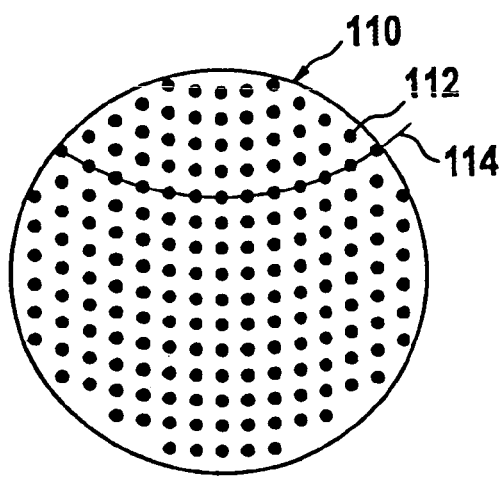

If the field lenses are utilized for shaping the arc-shaped field as in FIG. 16, then the tertiary light sources 112 lie on arcs 114. If the pupil raster elements of individual rows are placed on the arcs which compensate for the distortion, then one can place the tertiary light sources again on a regular raster.

Figure 17:
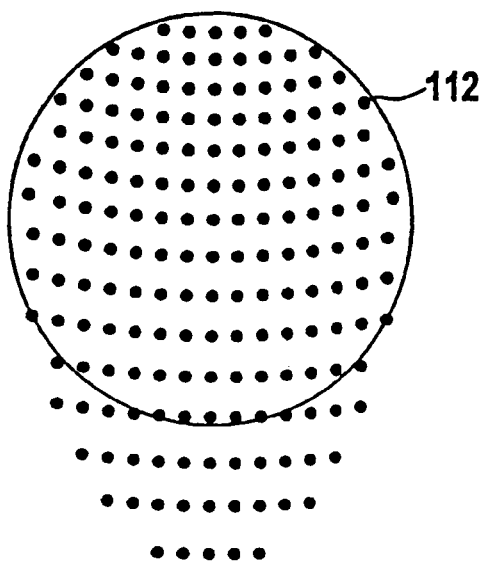

If the field lens also introduces distortion in the y-direction, then the distribution of the tertiary light sources is distorted in the y-direction, as shown in FIG. 17. This effect can be compensated by arranging the pupil raster elements on a grid which is distorted in y-direction.

The extent of the illuminated area onto the field raster element plate is determined by design of the collector unit. The extent of the illuminated area onto the pupil raster element plate is determined by the structural length of the illumination system and the aperture in the reticle plane.

As described above, the two surfaces must be fine-tuned to one another by rotating and tilting the field and pupil raster elements.

For illustration, the design of the illumination system will be explained with refractive elements. The examples, however, can be transferred directly to reflective systems. Various configurations can be distinguished for a circular illumination of field raster element plates, as presented below.

Figure 18:
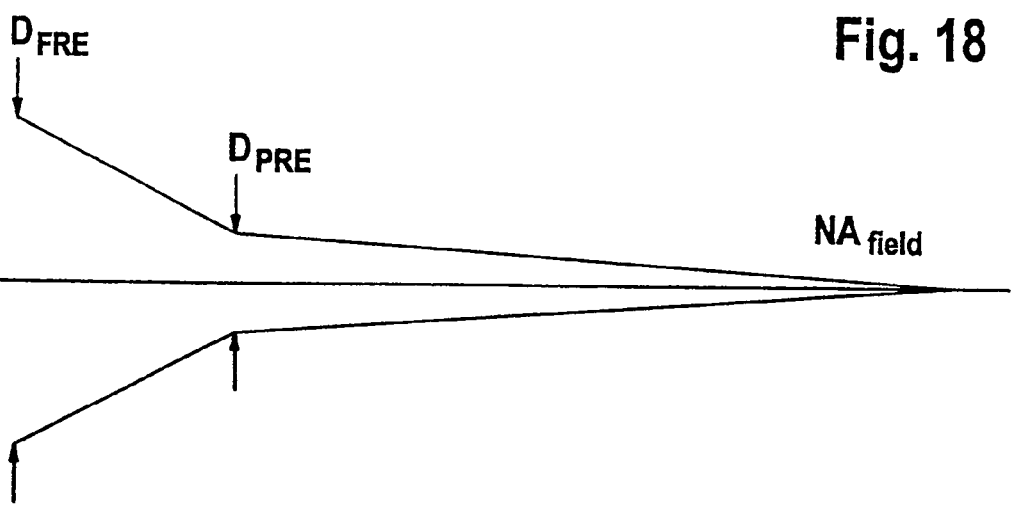
FIGS. 18–20: Relationship between illuminated surfaces of field raster element plate and pupil raster element plate as well as structural length and aperture in the reticle plane.

If a converging effect is introduced by tilting the field raster elements, and a diverging effect is introduced by tilting the pupil raster elements, then the beam cross section can be reduced. The tilt angles of the individual raster elements are determined by tracing the center rays for each pair of raster elements. The system acts like a telescope-system for the central rays, as shown in FIG. 18.

How far the field raster elements must be tilted, depends on the convergence of the impinging beam. If the convergence is adapted to the reduction of the beam cross section, the field raster elements can be arranged onto a planar substrate without tilting the field raster elements.

Figure 19:
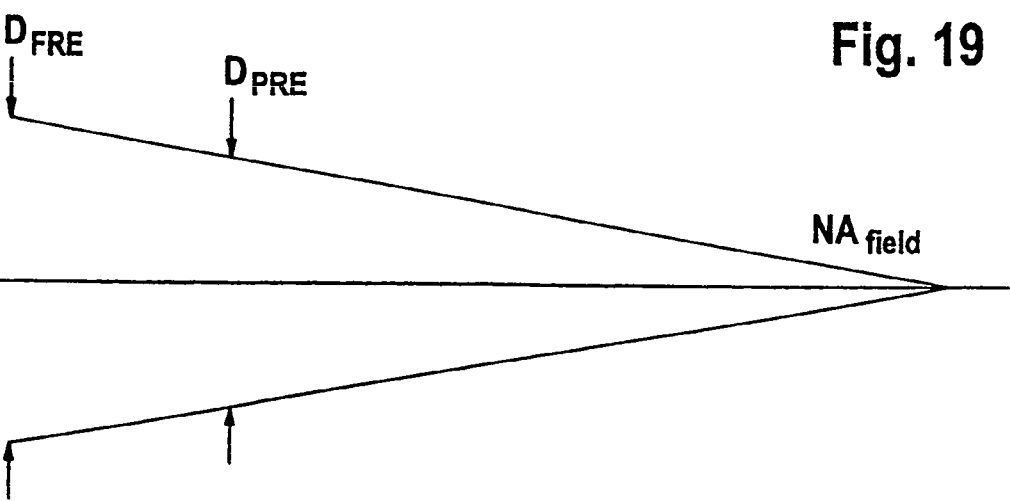

A special case results, if the convergence between the field and the pupil raster element plate corresponds to the aperture $NA_{field}$ at the reticle, as shown in FIG. 19.

No diverging effect must be introduced by the pupil raster elements, so they can be utilized without tilting the pupil raster elements. If the light source also has a very small etendue, the pupil raster element can be completely dispensed with.

Figure 20:
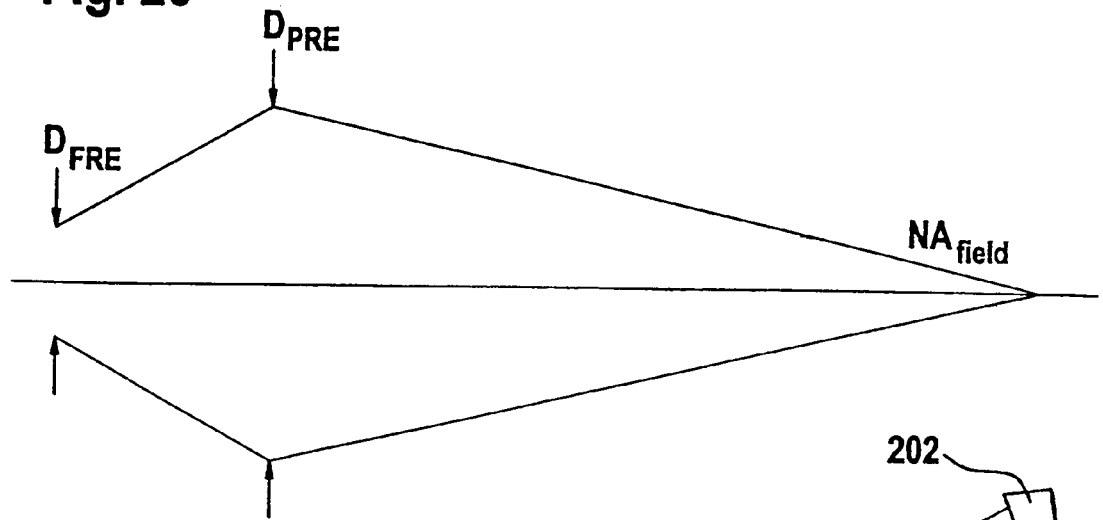

A magnification of the beam cross section is possible, if diverging effect is introduced by tilting of the field raster elements, and collecting effect is introduced by tilting the pupil raster elements. The system operates like a retro-focus system for the central rays, as shown in FIG. 20.

If the divergence of the impinging radiation corresponds to the beam divergence between field and pupil raster elements, then the field raster elements can be used without tilting the field raster elements.

Instead of the circular shape that has been described, rectangular or other shapes of illumination A of the field raster element plate are possible.

The following drawings describe one form of embodiment of the invention, in which a pinch-plasma source is used as the light source of the EUV illumination system.

Figure 21:
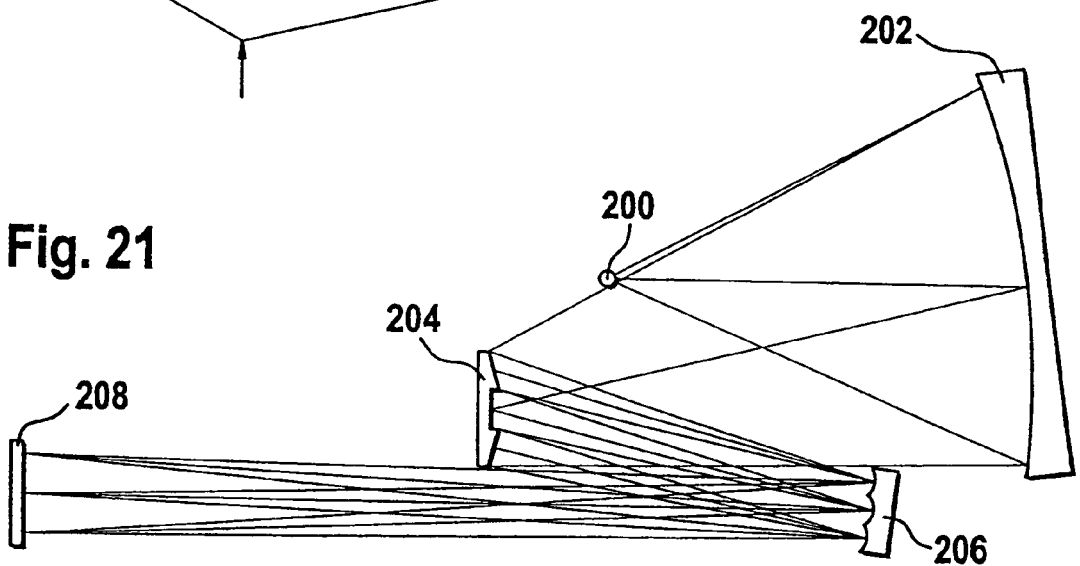
FIGS. 21–22: Illumination system with a collector unit, field and pupil raster elements.
Figure 22:
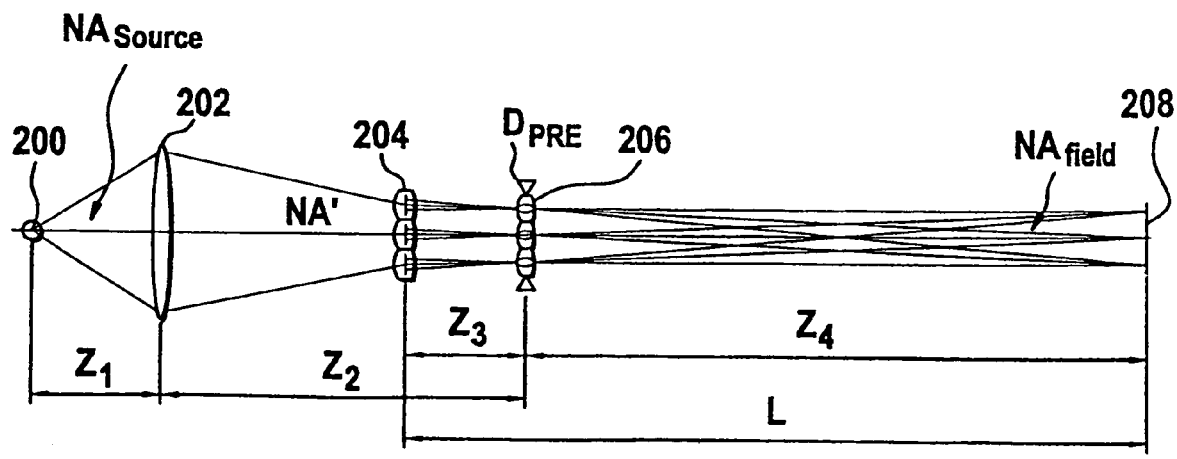

The principal construction without field lens of such a form of embodiment is shown in FIG. 21; FIG. 22 shows the abbreviations necessary for the system derivation, whereby for better representation, the system was plotted linearly and mirrors were indicated as lenses. An illumination system with pinch-plasma source 200 as primary light source, as shown in FIG. 21, comprises a light source 200, a collector mirror 202, which collects the light and reflects it to the field raster element plate 204. By reflection at the field raster elements, the light is directed to the corresponding pupil raster elements of pupil raster element plate 206 and from there to reticle 208. The pinch-plasma source is an expanded light source (approximately 1 mm) with a directional radiation in a relatively small steradian region of approximately $\Omega=0.3$ sr. Based on the etendue of the primary light source, a pupil raster element plate 206 is used.

The following specifications are used, for example, for an illumination system for EUV lithography:

a. Arc-shaped field: Radius $R_{field}=100$ mm, segment-angle 60°, field width±3.0 mm, which corresponds to a rectangular field of 105 mm×6 mm b. Aperture at the reticle: $NA_{field}=0.025$ c. Aperture at the source: $NA_{source}=0.3053$ d. Structural length L=1400.0 mm e. Number of field raster elements, which find place in an x-row: 4 f. $z_1=330.0$ mm.

With the following equations the optical design of the illumination system can be derived with the pregiven numbers:

$$NA_{field} = \frac{\frac{D_{FRE}}{2}}{L} \Rightarrow D_{FRE} = 2 \cdot L \cdot NA_{field}$$

$$\frac{D_{PRE}}{x_{FRE}} = 4.0 \Rightarrow x_{FRE} = \frac{D_{PRE}}{4.0}$$

$$\beta_{FRE} = \frac{x_{field}}{x_{FRE}} = \frac{z_4}{z_3} \Rightarrow \beta_{FRE} = \frac{x_{field}}{x_{FRE}}$$

$$\Rightarrow z_4 = z_3 \cdot \beta_{FRE}$$

$$L = z_3 + z_4 \Rightarrow z_3 = \frac{L}{1 + \beta_{FRE}}$$

$$NA' = \frac{\frac{D_{FRE}}{2}}{z_3} \Rightarrow NA' = \frac{\frac{D_{FRE}}{2}}{z_3}$$

$$\tan(\theta) = -\frac{(1-Ex)\cdot\sin(\theta')}{2\sqrt{Ex}-(1-Ex)\cdot\cos(\theta')} \Rightarrow Ex = f(NA_{source}, NA')$$

$$Ex_{col} = \left(\frac{sk-s1}{sk+s1}\right)^2 = \left(\frac{z_2-z_1}{z_2+z_1}\right)^2 \Rightarrow z_2 = z_1 \cdot \frac{1+\sqrt{Ex_{col}}}{1-\sqrt{Ex_{col}}}$$

$$Ex_{col} = 1 - \frac{R_{col}}{a} \Rightarrow R_{col} = \frac{z_1+z_2}{2} \cdot (1 - Ex_{col})$$

$$\frac{2}{R_{PRE}} = \frac{1}{z_3} + \frac{1}{z_4} \Rightarrow R_{PRE} = \frac{2 \cdot z_3 \cdot z_4}{z_3 + z_4}$$

$D_{FRE}$: diameter of the plate with the field raster elements
$x_{FRE}$: length of one field raster element
$y_{FRE}$: width of one field raster element
$\beta_{FRE}$: magnification ratio of the field raster elements
$D_{PRE}$: diameter of the plate with the pupil raster elements
$R_{col}$: Radius of the elliptical collector
$Ex_{col}$: conical constant of the elliptical collector
NA': aperture after the collector mirror With the pregiven specifications the following system parameters can be calculated:

$$D_{FRE} = 2 \cdot L \cdot NA_{field} = 2 \cdot 1400 \text{ mm} \cdot 0.025 = 70.0 \text{ mm}$$

$$x_{FRE} = \frac{D_{FRE}}{4.0} = \frac{70.0 \text{ mm}}{4.0} = 17.5 \text{ mm}$$

$$y_{FRE} = 1.0 \text{ mm}$$

$$\beta_{FRE} = \frac{x_{field}}{x_{FRE}} = \frac{105.0 \text{ mm}}{17.5 \text{ mm}} = 6.0$$

$$z_3 = \frac{L}{1+\beta_{FRE}} = \frac{1400.0 \text{ mm}}{1+6.0} = 200.0 \text{ mm}$$

$$z_4 = z_3 \cdot \beta_{FRE} = 200.0 \text{ mm} \cdot 6.0 = 1200.0 \text{ mm}$$

$$NA' = \frac{D_{DRE}/2}{z_3} = \frac{70.0 \text{ mm}/2}{200.0 \text{ mm}} = 0.175$$

$$Ex_{col} = f(NA_{source}, NA') = 0.078$$

$$z_2 = z_1 \cdot \frac{1+\sqrt{Ex_{col}}}{1-\sqrt{Ex_{col}}} = 100.0 \text{ mm} \cdot \frac{1+\sqrt{0.078}}{1-\sqrt{0.078}} = 585.757 \text{ mm}$$

$$R_{col} = \frac{z_1+z_2}{2} \cdot (1-Ex_{col}) = \frac{330.0 \text{ mm} + 585.757 \text{ mm}}{2} \cdot (1-0.078) = 422.164 \text{ mm}$$

$$R_{PRE} = \frac{2 \cdot z_3 \cdot z_4}{z_3+z_4} = \frac{2 \cdot 200 \cdot 1200}{200+1200} = 342.857 \text{ mm}$$

Figure 23:
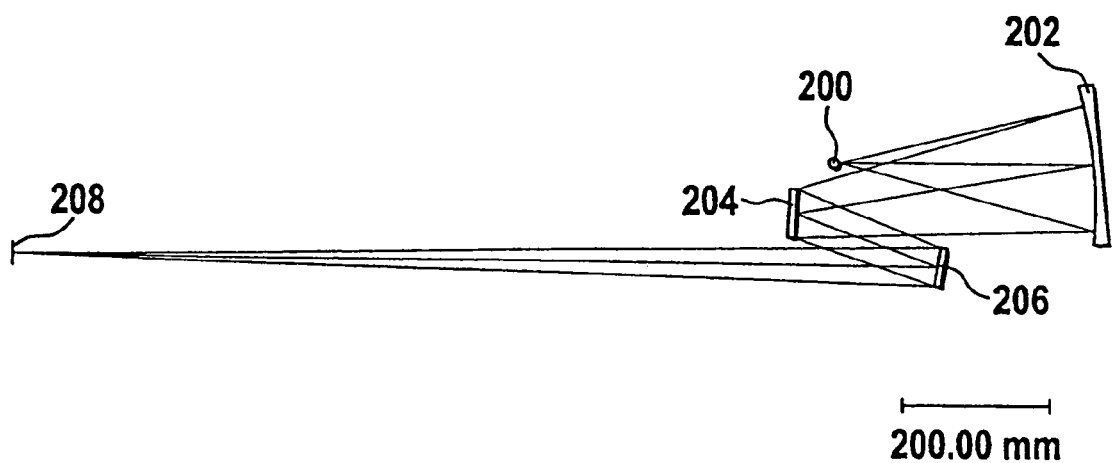
FIGS. 23–24: Beam path in a system with collector unit, field and pupil raster elements.

The total system with the previously indicated dimensions is shown in FIG. 23 up to the reticle plane 208 in the yz section. The central and the two marginal rays are drawn in. Secondary light sources are produced at the plate with the pupil raster elements 206 by the field raster elements 204. The pupil plane of the illumination system is arranged at the plate with the pupil raster elements 206.

Figure 24:
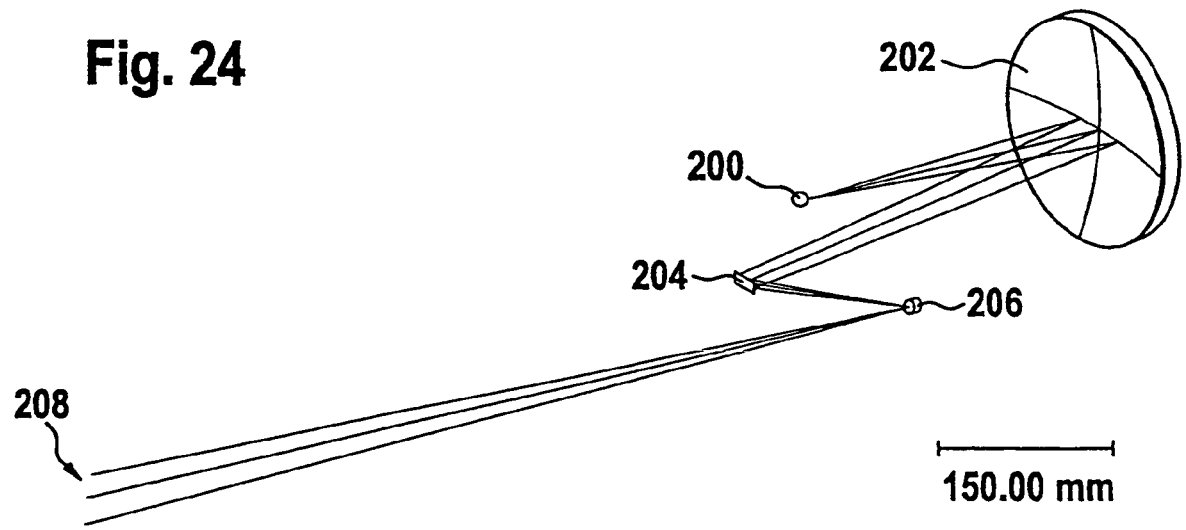

The total system is shown in FIG. 24 with an x-z fan of rays, which impinge on the central field raster element.

Figure 25:
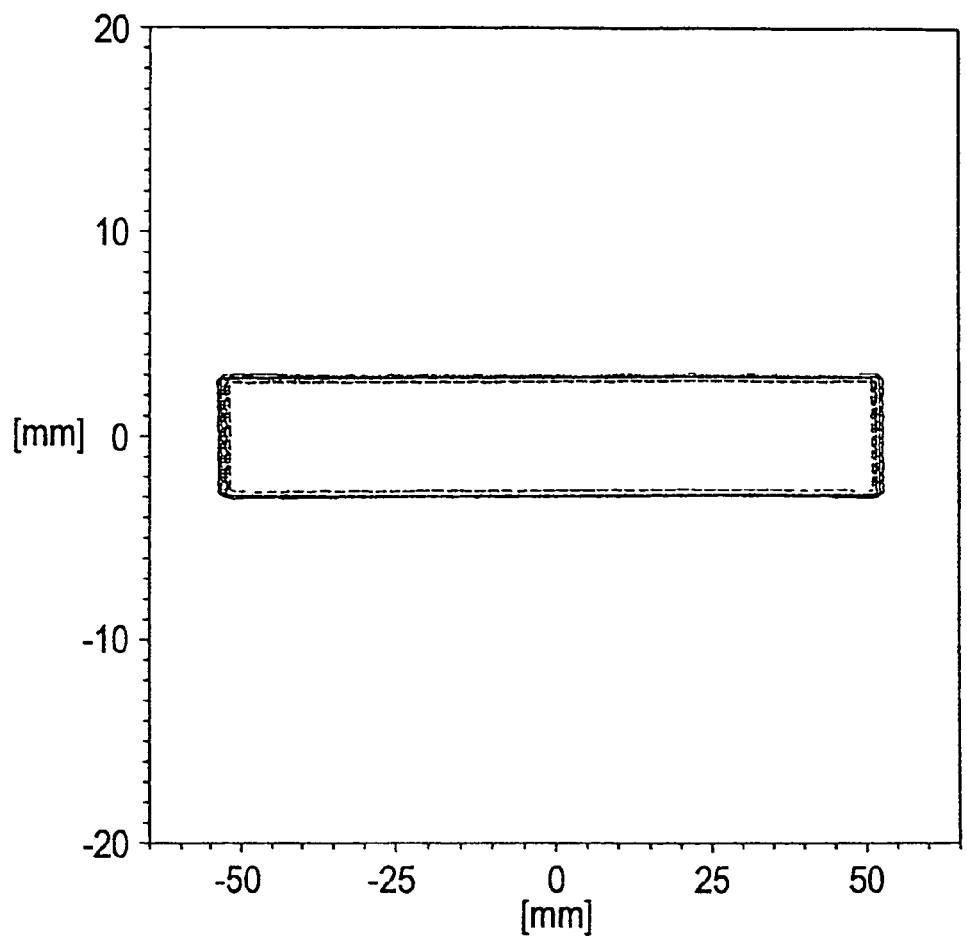
FIG. 25–26: Illumination of the reticle of a system according to FIGS. 23–24.
Figure 26:
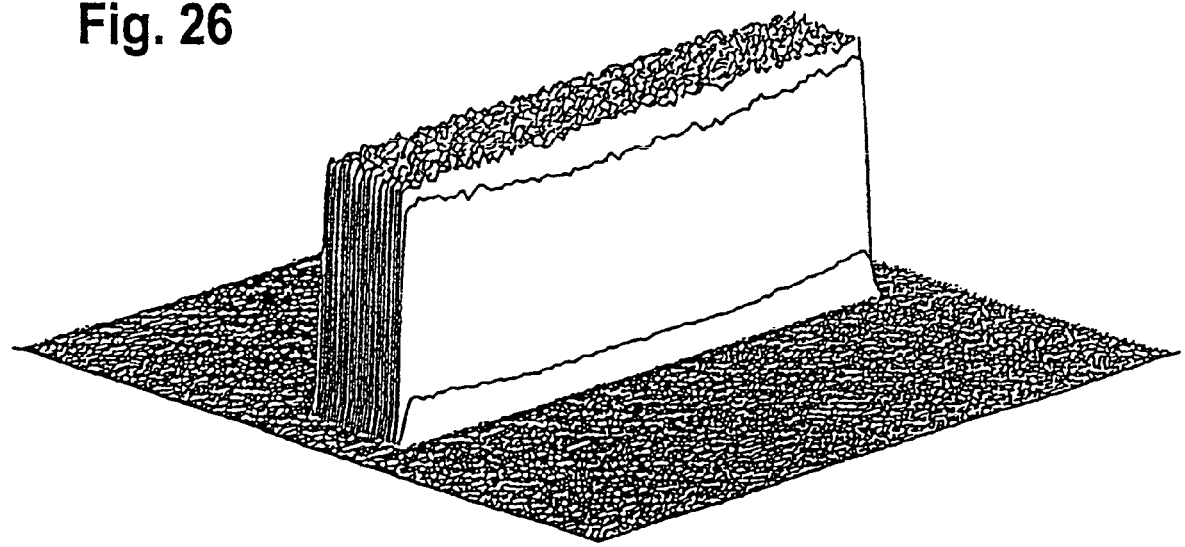

FIGS. 25 and 26 show the illumination of the reticle with the rectangular field (−52.5 mm<$x_{field}$<+52.5 mm; −3.0 mm<$x_{field}$<+3.0 mm). FIG. 25 shows a contour plot, FIG. 26 a-3D presentation. The images of the field raster elements are optimally superimposed in the reticle plane also in the case of the extended secondary light sources, which are produced by the pinch-plasma source, since a pupil raster element plate is used.

Figure 27:
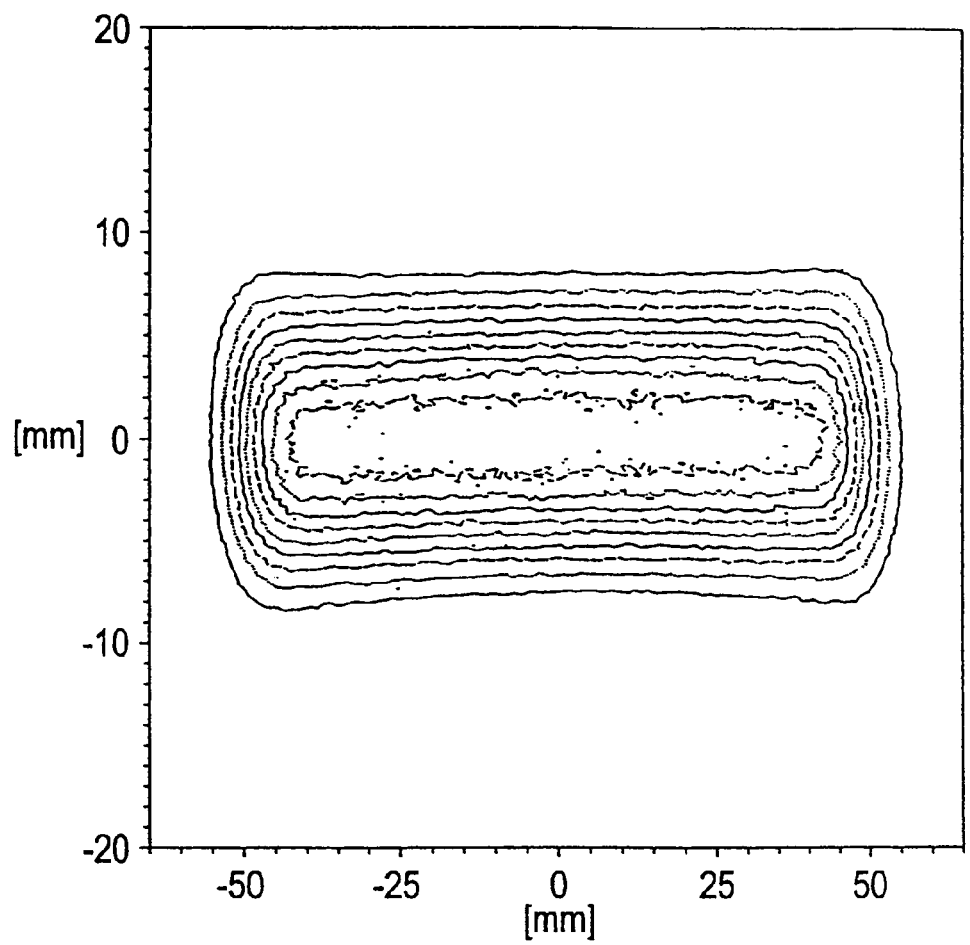
FIG. 27–28: Illumination of the reticle of a system according to FIGS. 23–24 without pupil raster elements.
Figure 28:
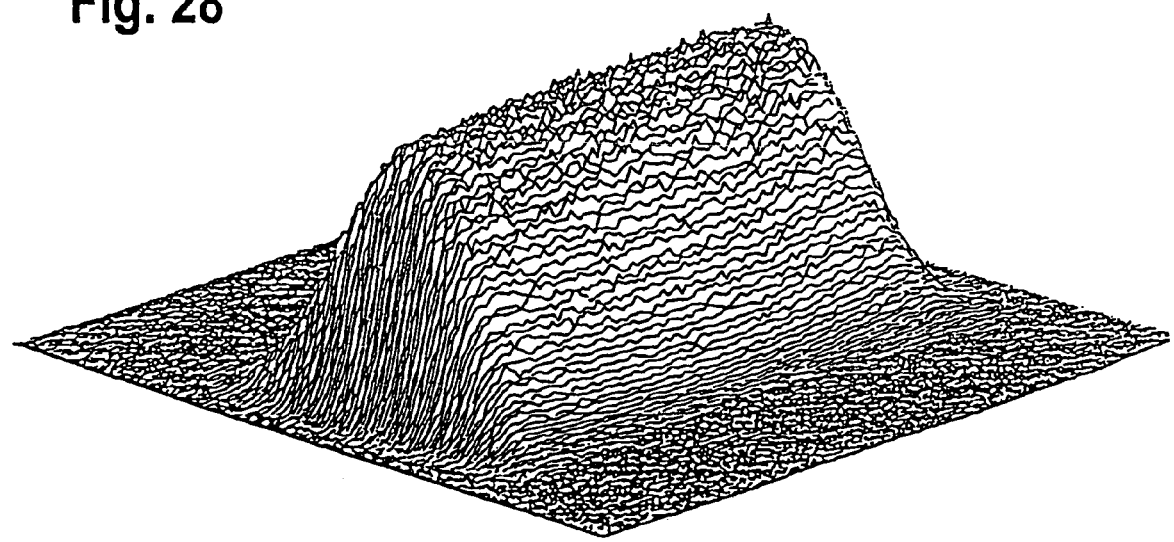

In comparison to this, the illumination of the reticle without pupil raster element plate is shown in contour lines and 3D representation in FIGS. 27 and 28. The images of the field raster elements are not sharply imaged due to the extended secondary light sources.

Figure 29:
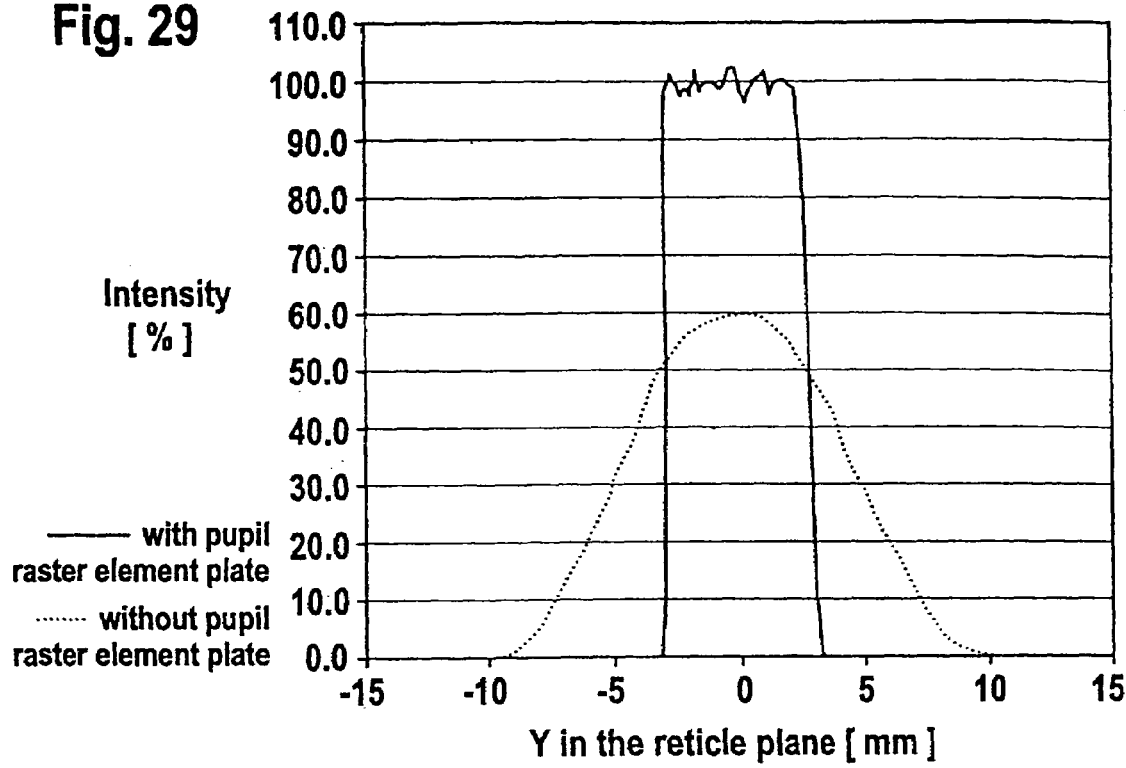
FIG. 29: Comparison of the intensity distribution of a system according to FIGS. 23–24 with and without pupil raster element plate.

FIG. 29 shows an intensity profile parallel to the y-axis for x=0.0 with and without pupil raster element plate. Whereas an almost ideal rectangular profile is formed with pupil facets, the profile decomposes without the pupil facets.

Figure 30:
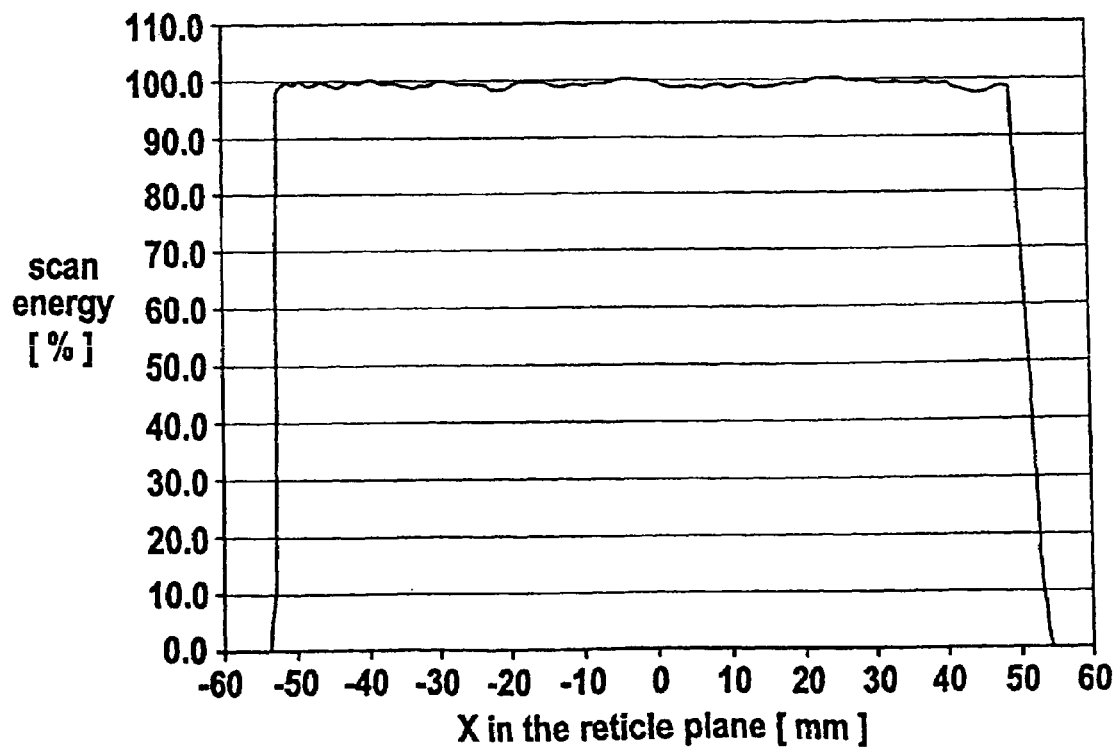
FIG. 30: Integral scanning energy in the reticle plane of a system according to FIGS. 23–24 with pupil raster element plate.

FIG. 30 shows the scanning energy distribution. The scan energy is defined as the line integral in scanning direction over the intensity distribution in the reticle plane. The homogeneous scanning energy distribution can be clearly recognized.

Figure 31:
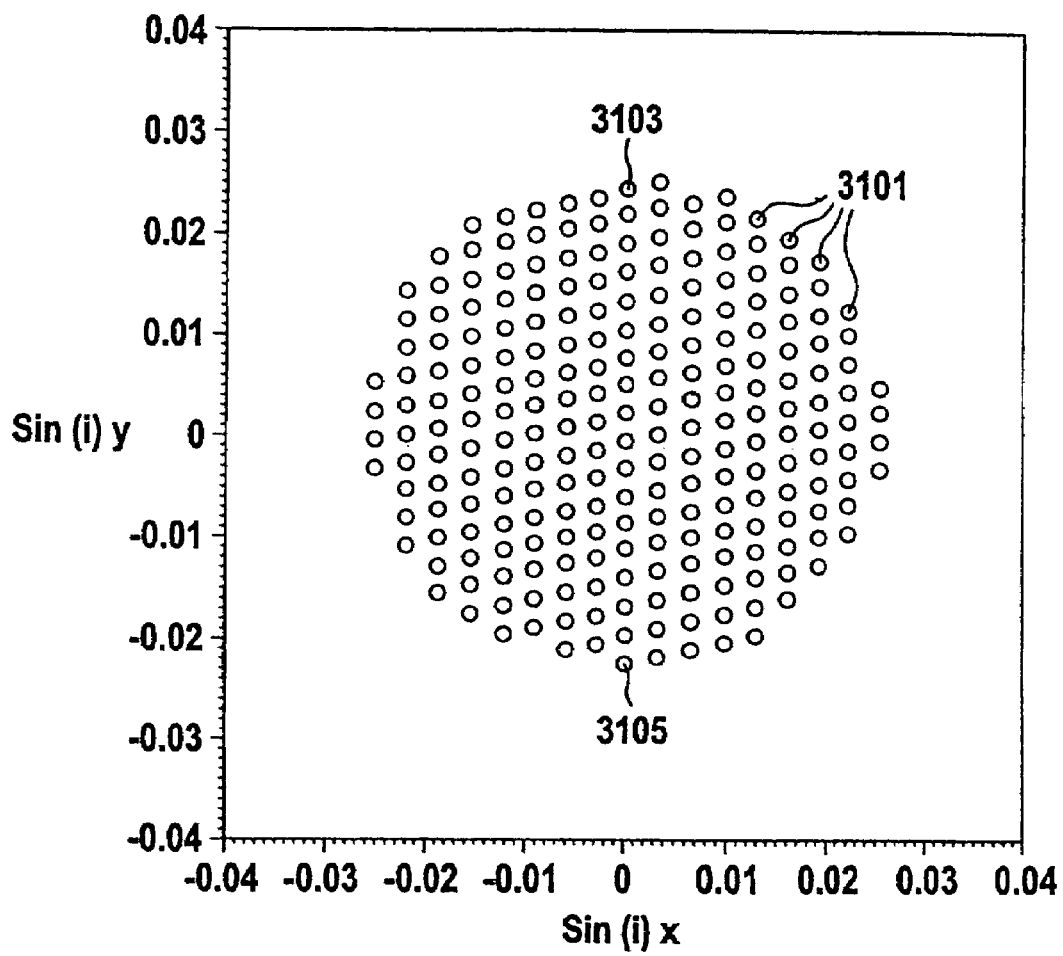
FIG. 31: Pupil illumination for an object point in the center of the illuminated field of a system according to FIGS. 23–24 with pupil raster element plate.

In FIG. 31, the illumination of the exit pupil is shown for a object point in the center of the illuminated field. The x- and y-axis represent not the extent in "mm", but in the sine of the ray angles in the reticle plane. Corresponding to the arrangement of the pupil raster elements, tertiary light sources 3101 are produced in the exit pupil of the illumination system. The maximum aperture amounts to $NA_{field}=0.025$.

Figure 32:
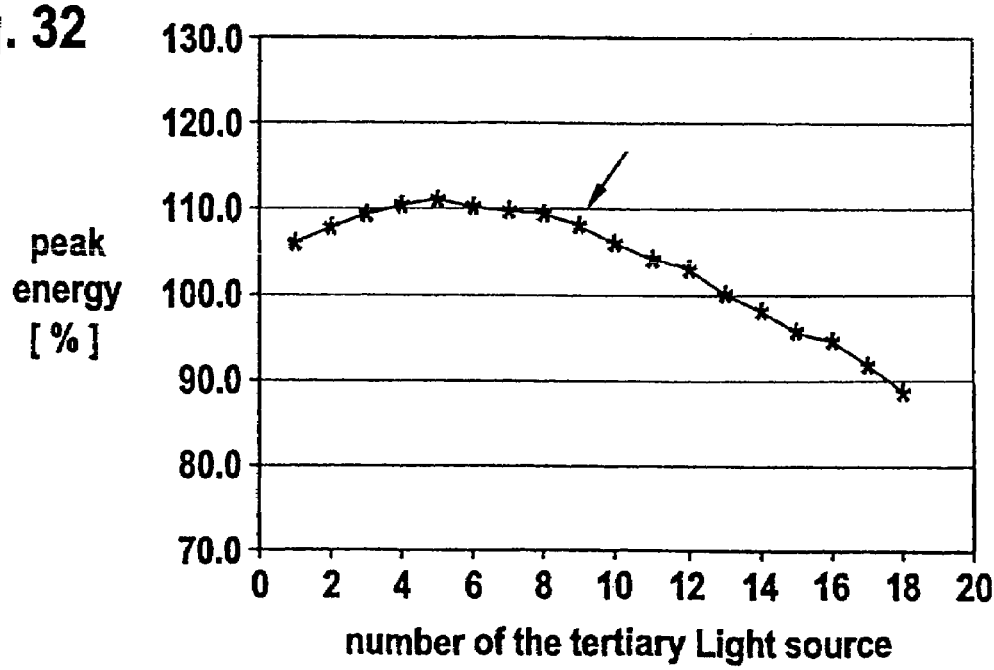
FIG. 32: Total energy of the tertiary light sources of a system according to FIGS. 23–24 along the Y-axis.

In FIG. 31, 18 tertiary light sources are shown with $\sin(i_x)=0$. The total energy of the 18 tertiary light sources with $\sin(i_x)=0$ is plotted in FIG. 32. The tertiary light source 3101 has the number 1 in FIG. 32, the tertiary light source 3105 the number 18. The intensity distribution in the exit pupil has a y-tilt due to the distortion errors introduced by the mirrors tilted about the x-axis. The total energy of the individual tertiary light sources can be adjusted via the reflectivity of the individual raster elements, so that the energy of the tertiary light sources can at least be controlled in a rotational symmetric manner. Another possibility to get a rotational symmetric intensity distribution in the exit pupil of the illumination system is a collector mirror with a spatial dependent reflectivity.

The forms of embodiment of the invention, which use different light sources, for example, are described below.

In FIGS. 33–39, another form of embodiment of the invention is explained with a laser-plasma source as the primary light source. If the field raster elements are not tilted, then the aperture in the reticle plane ($NA_{theoretical}=0.025$) is given in advance by the ellipsoid or collector mirror. Since the distance from the light source to the ellipsoid or collector mirror should amount to at least 100 mm in order to avoid contaminations, a rigid relationship between structural length and collection efficiency results as presented in the following table:

TABLE 1

| Structural length L | Collection angle θ | Collection efficiency π (0°–90°): 0°: Beam cone is emitted horizontally 90°: Rays are emitted in a torus with a mean angle of 90°. |
| --- | --- | --- |
| 1000 mm | 14.3° | 2%–12% |
| 2000 mm | 28.1° | 6%–24% |
| 3000 mm | 41.1° | 12%–35% |
| 4000 mm | 53.1° | 20%–45% |
| 5000 mm | 90.0° | 50%–71% |

As can be seen from this, the collection efficiency for a structural length of 3000 mm is maximum 35%.

In order to achieve high collection efficiencies for justifiable structural lengths, in the particularly advantageous form of embodiment of the invention according to FIGS. 35–39, the illumination system comprises a telescope system.

In the represented form of embodiment, a laser-plasma source is used as the primary light source, whereby the field raster element plate is arranged in the convergent beam path of a collector mirror.

In order to reduce the structural length of the illumination system, the illumination system is formed as a telescope system (tele-system). One form of embodiment for forming such a telescope system consists of arranging the field raster elements of the field raster element plate on a collecting surface, and of arranging the pupil raster elements of the pupil raster element plate on a diverging surface. In this way, the surface normal lines of the raster element centers are adapted to the surface normal lines of the supporting surface. As an alternative to this, one can superimpose prismatic components for the raster elements on a planar plate. This would correspond to a Fresnel lens as a carrier surface.

The above-described tele-raster element condenser thus represents a superimposition of the classical telescope system and the raster element condenser. The compression of the diameter of the field raster element plate to the diameter of the pupil raster element plates is possible until the secondary light sources overlap.

In FIGS. 33 to 36, different arrangements are shown schematically, from which the drastic reduction in structural length, which can be achieved with a telescope system, becomes apparent.

Figure 33:
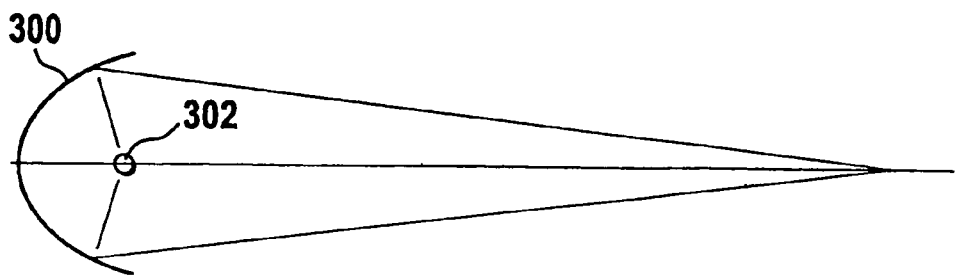
FIGS. 33–39: Illumination system with a laser plasma source as a light source as well as a collector unit and two mirror units, which form a tele-system.

FIG. 33 shows an arrangement with collector mirror 300 and laser-plasma light source 302.

Figure 34:
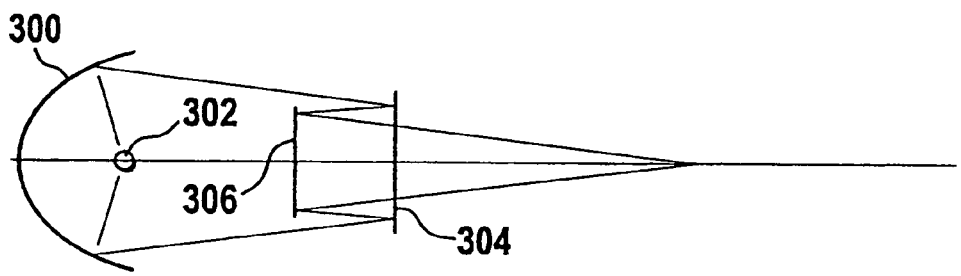

With a arrangement of collector mirror, plate 304 with non-tilted field raster elements and plate 306 with non-tilted pupil raster elements, as shown in FIG. 34, the structural length can be shortened only by the zigzag light path. Since the etendue of a point-like source is approximately zero, the field raster element plate 304, is, in fact, fully illuminated, but the pupil raster element plate 306 is illuminated only with individual intensity peaks.

Figure 35:
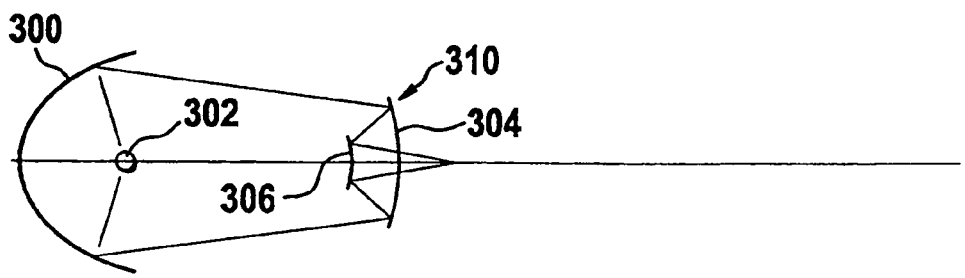

However, now if the raster elements are introduced onto curved supporting surfaces, i.e., the system is configured as a telescope system with a collecting mirror and a diverging mirror, as shown in FIG. 35, then the structural length can be shortened.

Figure 36:
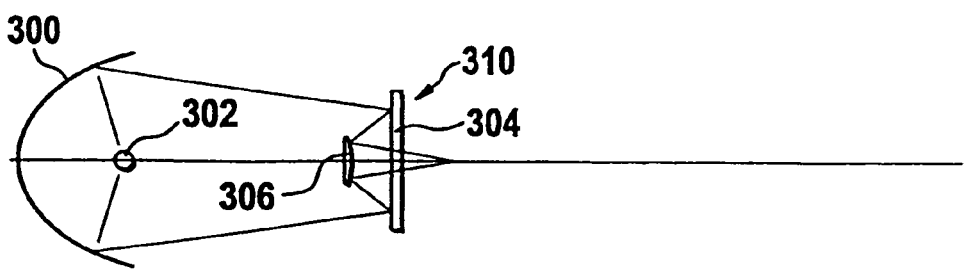

In the case of the design according to FIG. 36, the individual raster elements are arranged tilted on a planar carrier surface.

The pupil raster elements of the pupil raster element plate have the task of imaging the field raster elements into the reticle in the case of expanded secondary light sources and to superimpose these images. However, if a sufficiently good point-like light source is present, then the pupil raster element plate is not necessary. The field raster elements can then be introduced either onto the collecting or onto the diverging tele-mirror. If the field raster elements are arranged on the collecting tele-mirror, they can be designed as either concave or planar mirrors. The field raster elements on the diverging telescope mirror can be designed as convex, concave or planar mirrors. Collecting raster elements lead to a real pupil plane; diverging raster elements lead to a virtual pupil plane.

Collector lens 300 and tele-raster element condenser or tele-system 310 produce the pregiven rectangular field illumination of 6 mm×105 mm with correct aperture $NA_{field}=0.025$ in the image plane of the illumination system. As in the previous examples, with the help of one or more field lenses 314 arranged between tele-raster element condenser 310 and reticle 316, the arc-shaped field is formed and the exit pupil of the illumination system is arranged at the entrance pupil of the projection objective.

An interface plane for the design of the field lens 314 is the plane of the secondary light sources. These secondary light sources must be imaged by the field lens 314 in the entrance pupil of the projection objective forming tertiary light sources. The pupil plane of this imaging is in the reticle plane, in which the arc-shaped field must be produced.

Figure 37:
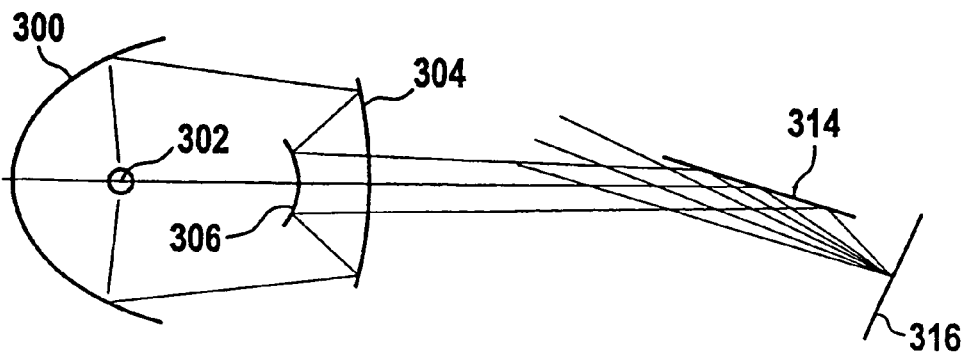
Figure 38:
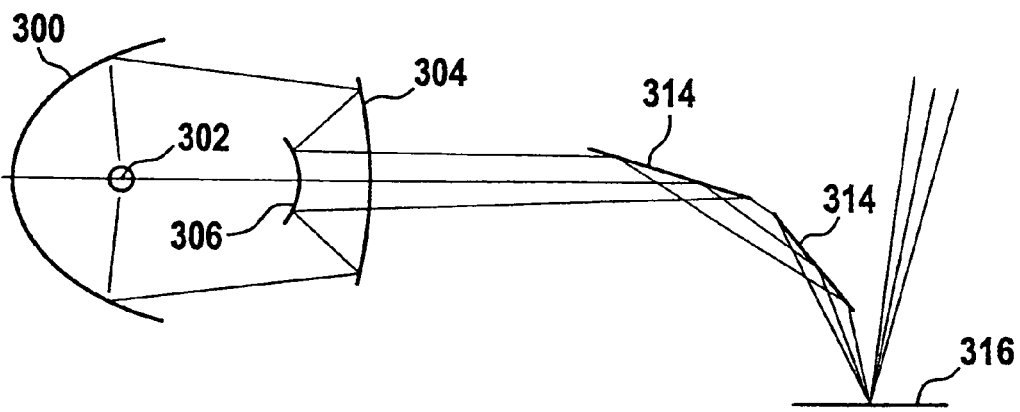

In FIG. 37, a form of embodiment of the invention with only one field mirror 314 is shown. In the form of embodiment with one field mirror, the arc-shaped field can be produced and the entrance pupil of the illumination system can be arranged at the exit pupil of the projection objective. Since reticle 316, however, is illuminated with chief ray angles about 2.97°, there is the danger that the light beam will run back into the illumination system. It is provided in a particularly advantageous form of embodiment to use as field mirrors two grazing-incidence mirrors as shown in FIG. 38. This way, the orientation of the arc-shaped field is inverted and the light beam leaves the illumination system "behind" the field lens 314. With such a configuration the illumination system can be well separated from the projection objective. By using two field mirrors, one also has more degrees of freedom in order to adjust telecentricity and uniformity of the light distribution.

The design of the illumination systems will now be described on the basis of examples of embodiment, whereby the numerical data not will represent a limitation of the system according to the invention.

In the first example of embodiment the illumination system comprises a collector unit, a diverging mirror and a collecting mirror forming a telescope system as well as field lenses, whereby the raster elements are introduced only onto the diverging mirror. All raster elements are identical and lie on a curved supporting surface.

Figure 39:
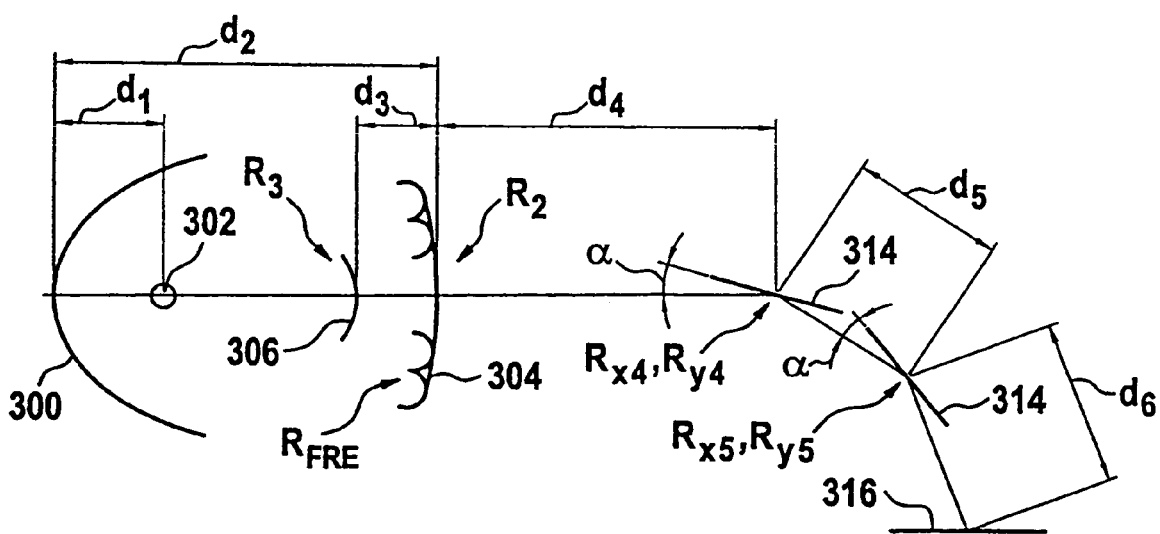

The parameters used are represented in FIG. 39 and are selected as follows below:

a. Arc-shaped field: $R_{field}$=100 mm, segment=60°, field height±3.0 mm.
b. Position of the entrance pupil (Distance between reticle plane and entrance pupil of the projection objective): $z_{EP}$=1927.4 mm. This corresponds to a principal ray angle of $i_{PB}$=2.97° for y=100 mm.
c. Aperture at the reticle: $NA_{field}$=0.025.
d. Aperture at the source: $NA_{source}$=0.999.
e. Distance between the source and the collector mirror: $d_1$=100.0 mm.
f. Field raster element size: $y_{FRE}$=1, $x_{FRE}$=17.5 mm.
g. $d_3$=100 mm.
h. Compression factor $D_{FRE}/D_{PRE}$=4:1.
i. Tilt angle α of the grazing-incidence mirrors, α=80°.
j. Collector mirror is designed as an ellipsoid with $R_{col}$ and $Ex_{col}$.
k. Curvatures of the supporting surfaces $R_2$ and $R_3$: spherical.
l. Curvature $R_{FRE}$ of the field raster element: spherical.
m. The Field mirrors are torical mirrors without conical contributions having the curvatures: $R_{4x}$, $R_{4y}$, $R_{5x}$, $R_{5y}$.

Figure 40:
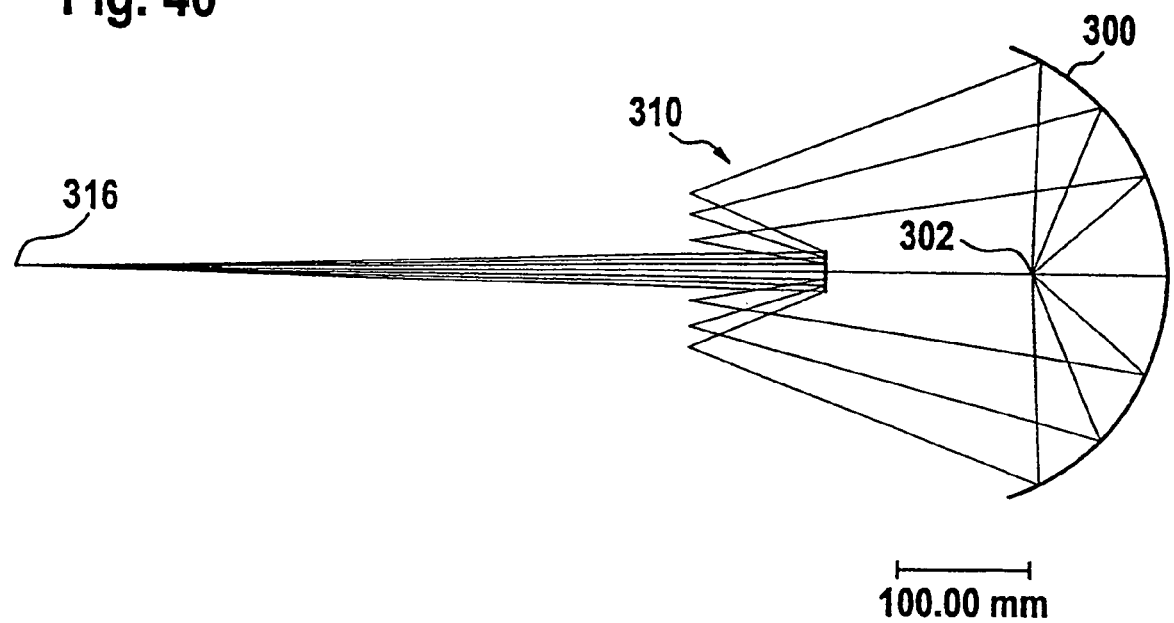
Figure 41:
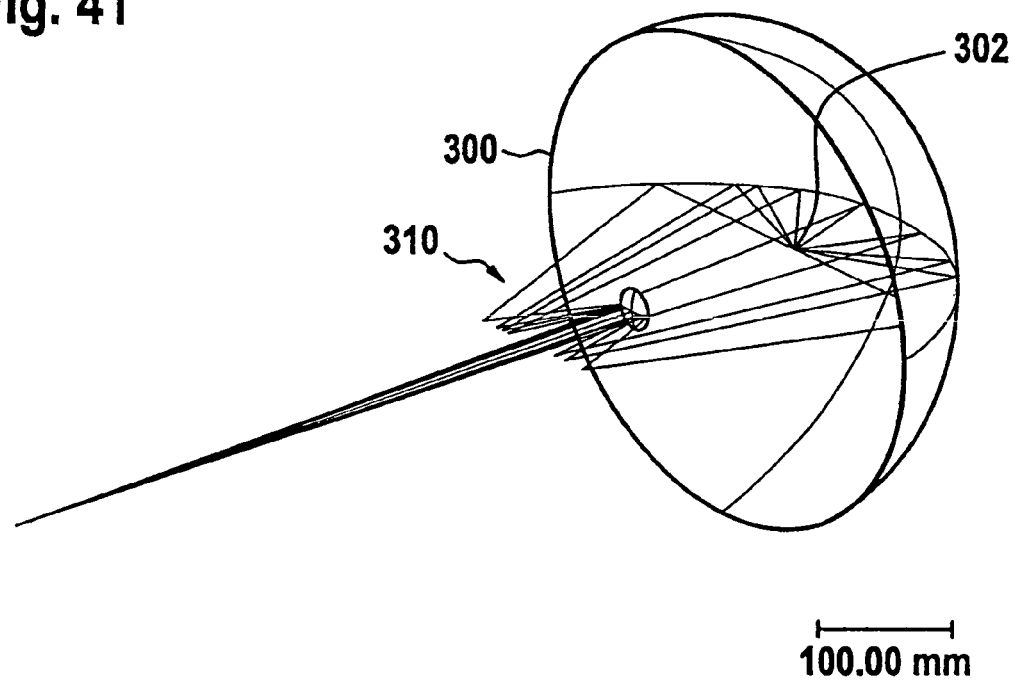

FIG. 40 shows an arrangement of a illumination system with collector mirror 300, whereby the first tele-mirror of the telescope system 310 is not structured with field raster elements. The two tele-mirrors of the telescope system 310 show a compression factor of 4:1. The shortening of the structural length due to the telescope system 310 is obvious. With the telescope system, the structural length amounts to 852.3 mm, but without the telescope system, it would amount to 8000.0 mm. In FIG. 41, a fan of rays is shown in the x-z plane for the system according to FIG. 40. Since there are no field raster elements the light source 302 is imaged into the reticle plane.

FIG. 42 in turn represents a fan of rays in the x-z plane, whereby the mirrors of the system according to FIG. 40 are now structured and have field raster elements. Secondary light sources are formed on the second mirror of the telescope system 310 due to the field raster elements on the first mirror of the telescope system 310. In the illuminated field, the light beams from the several field raster elements are correctly overlaid, and a strip with −52.5 mm<$x_{field}$<+52.5 mm is homogeneously illuminated.

In FIG. 43, the total system up to the entrance pupil 318 of the projection objective is shown. The total system comprises: primary light source 302, collector mirror 300, tele-raster element condenser 310, field mirrors 314, reticle 316 and entrance pupil of the projection objective 318. The drawn-in marginal rays 320, 322 impinge on the reticle and are drawn up to the entrance pupil 318 of the projection objective.

Figure 44:
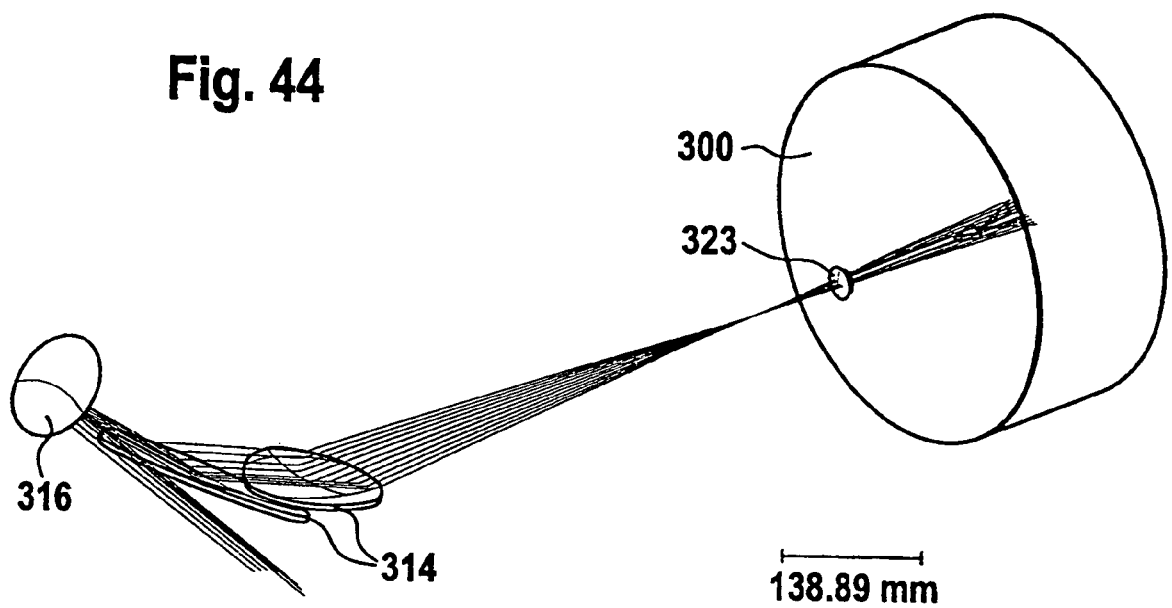

FIG. 44 shows an x-z fan of rays of a configuration according to FIG. 43, which passes through the central field raster element 323. This pencil is in fact physically not meaningful, since it would be vignetted by the second tele-mirror, but shows well the path of the light. One sees on field mirrors 314 how the orientation of the arc-shaped field is rotated through the second field mirror. The rays can run undisturbed into the projection objective (not shown) after reflection at reticle 316.

Figure 45:
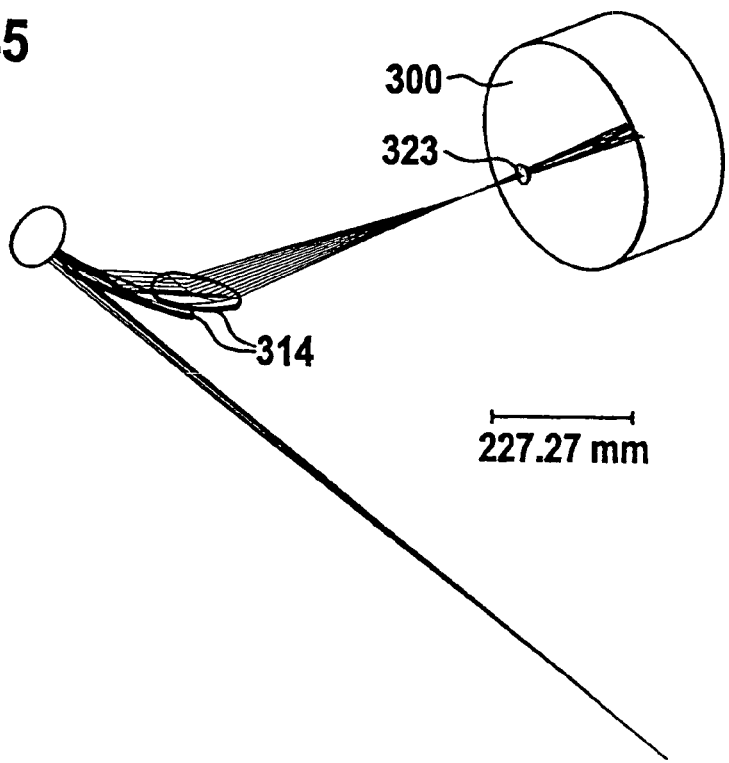

FIG. 45 shows a fan of rays, which passes through the central field raster element 323 as in FIG. 44, runs along the optical axis and is focused in the center of the entrance pupil.

Figure 46:
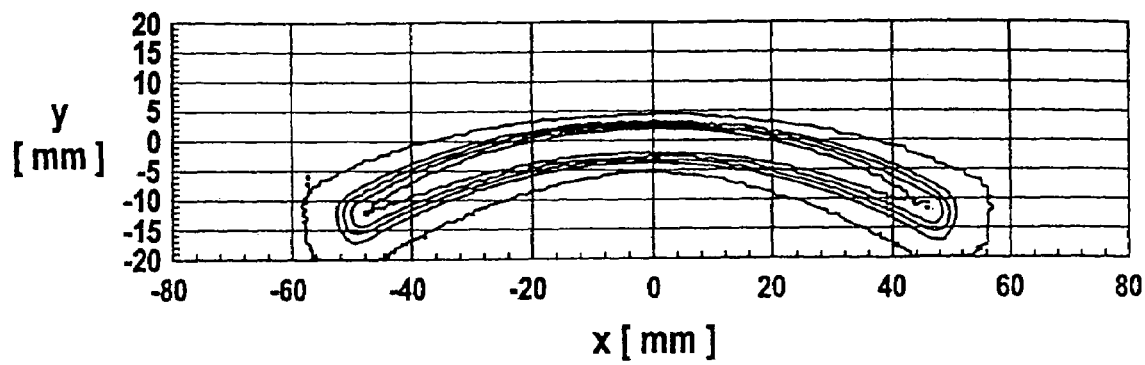
FIG. 46: Illumination of the reticle of an arrangement according to FIGS. 44–45.

FIG. 46 describes the illumination of the reticle field with the arc-shaped field produced by the configuration according to FIGS. 40 to 45 ($R_{field}$=100 mm, segment=60°, field height±3.0 mm).

Figure 47:
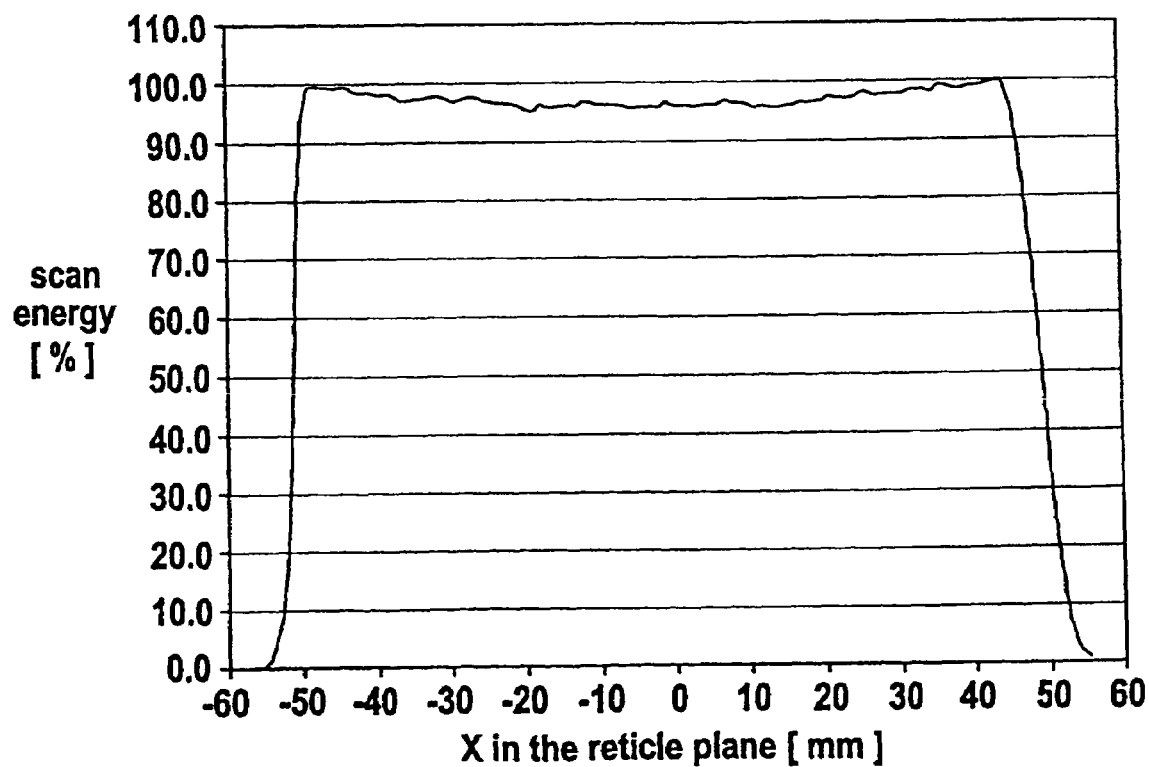
FIG. 47: Integral scanning energy of an arrangement according to FIGS. 40–45.

In FIG. 47, the scanning energy is shown for an arrangement according to FIGS. 40 to 46. The scanning energy varies between 95% and 100%. The uniformity thus amounts to ±2.5%.

Figure 48:
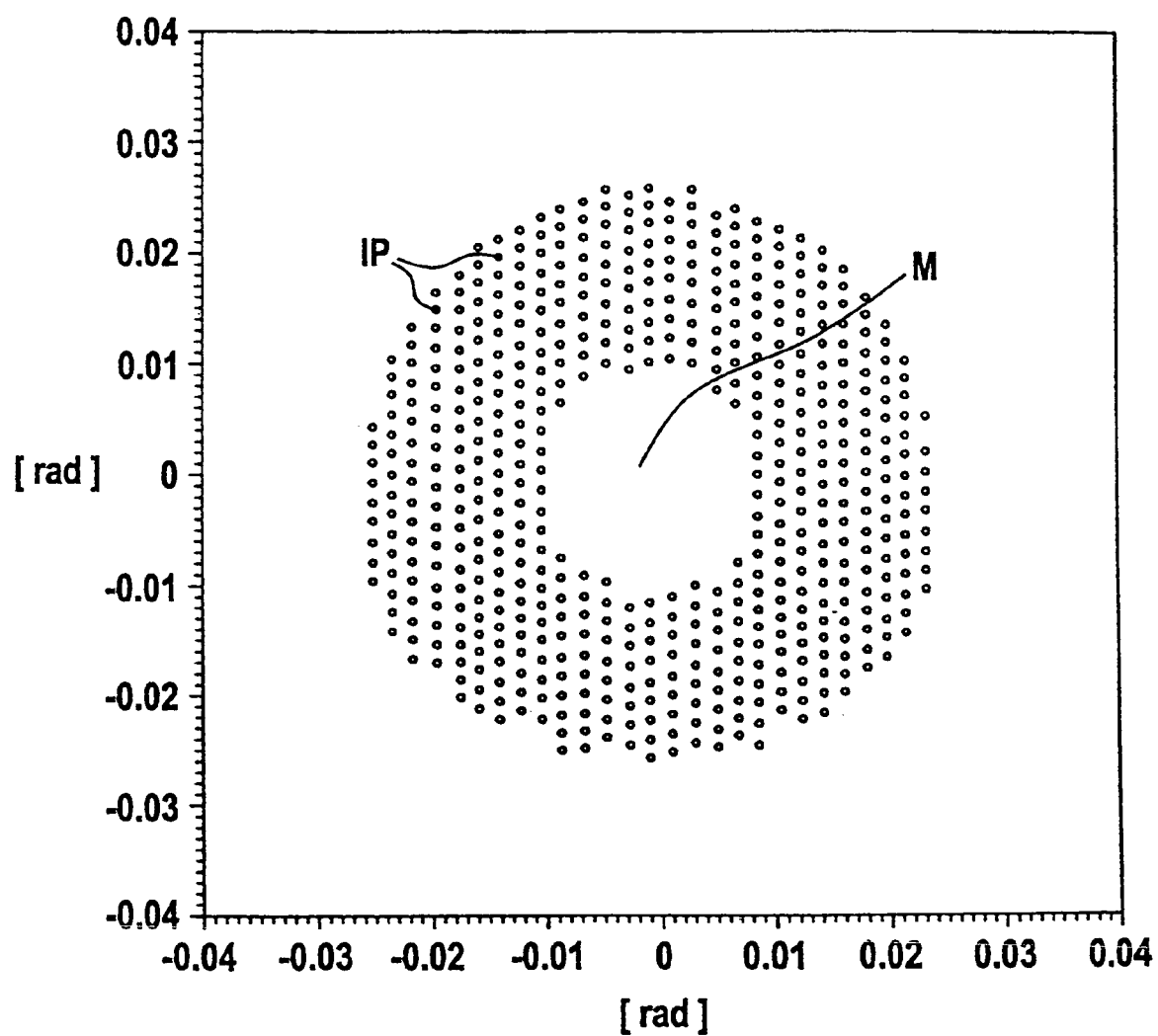
FIG. 48: Pupil illumination of a system according to FIGS. 40–45.

In FIG. 48, the pupil illumination for an object point in the center of the illuminated field is shown. The ray angles are referred to the centroid ray. Corresponding to the distribution of the field raster elements, circular intensity peaks IP result in the pupil illumination. The obscuration in the center M is caused by the second tele-mirror.

The illumination system described in FIGS. 31 to 48 has the advantage that the collecting angle can be increased to above 90°, since the ellipsoid can also enclose the source.

Further, the structural length can be adjusted by the tele-system. A reduction of structural length is limited due to the angular acceptance of the coating with multilayers and the imaging errors of the surfaces with a high optical power.

Figure 48A:
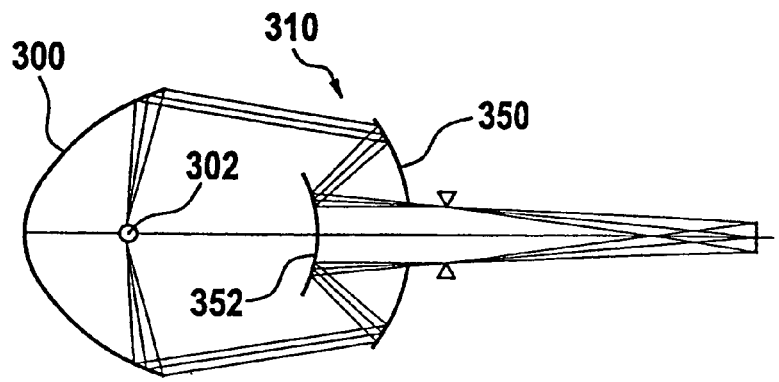
FIGS. 48A–48C: System for a laser-plasma source with diameter $\leq 50$ μm and without pupil raster element plate.

For point-like light sources, for example, a laser-plasma source with a diameter ≦50 μm, an arrangement can be produced with only one plate with field raster elements. Pupil raster elements are in this case not necessary. Then the field raster elements can be introduced onto collecting mirror 350 of the tele-system or onto the diverging second tele-mirror 352. This is shown in FIGS. 48A–48C.

The introduction onto the second tele-mirror 352 has several advantages: In the case of collecting field raster elements, a real pupil plane is formed in "air", which is freely accessible, as shown in FIG. 48A.

Figure 48B:
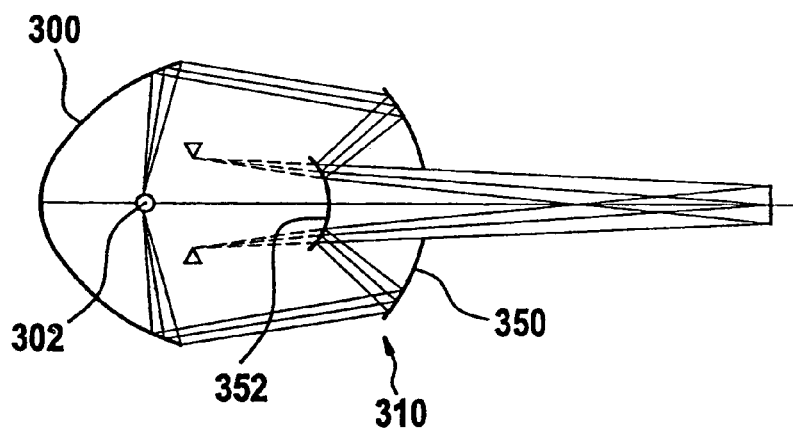

In the case of diverging field raster elements, in fact a virtual pupil plane is formed, which is not accessible, as shown in FIG. 48B. The negative focal length of the field raster elements, however, can be increased.

Figure 48C:
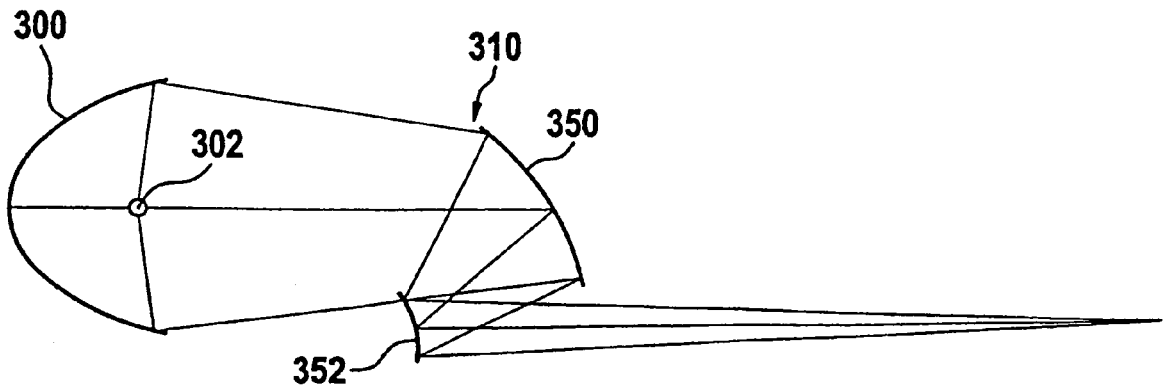

In order to avoid an obscuration, as shown in FIG. 48C, the mirrors of the tele-system 350, 352, can be tilted toward one another, so that the light beam will be not vignetted by the components.

A second example of embodiment for a illumination system will be described below, which comprises a plate with planar raster elements. The system is particularly characterized by the fact that the collector unit and the plate with the field raster elements form a telescope system. The converging effect of the telescope system is then completely transferred onto the collector mirror, wherein the diverging effect is caused by the tilt angles of the field raster elements.

Such a system has a high system efficiency of 27% with two normal-incidence mirrors (reflectivity ≈65%) for the collector mirror and the plate with the field raster elements and two grazing-incidence mirrors (reflectivity ≈80%) for the two field mirrors.

Further, a large collecting efficiency can be realized, whereby the collecting steradian amounts to $2\pi$, but which can still be increased.

Based on the zigzag beam path, there are no obscurations in the pupil illumination. In addition, in the described form of embodiment, the structural length can be easily adjusted.

The collector or ellipsoid mirror collects the light radiated from the laser-plasma source and images the primary light source on a secondary light source. A multiple number of individual planar field raster elements are arranged in a tilted manner on a supporting plate. The field raster elements divide the collimated light beam into partial light beams and superimpose these in the reticle plane. The shape of the field raster elements corresponds to the rectangular field of the field to be illuminated. Further, the illumination system has two grazing-incidence toroid mirrors, which form the arc-shaped field, correctly illuminate the entrance pupil of the projection objective, and assure the uniformity of the light distribution in the reticle plane.

In contrast to the first example of embodiment of a tele-system with collector unit as well as a telescope system formed with two additional mirrors, in the presently described form of embodiment, the laser-plasma source alone is imaged by the ellipsoid mirror in the secondary light source. This saves one normal-incidence mirror and permits the use of planar field raster elements. Such a saving presupposes that no pupil raster elements are necessary, i.e., the light source is essentially point-like.

The design will be described in more detail on the basis of FIGS. 49–51.

FIG. 49 shows the imaging of the laser-plasma source 400 through ellipsoid minor 402. One secondary light source 410 is formed. In the imaging of FIG. 50, a tilted planar mirror 404 deflects the light beam to the reticle plane 406.

In the imaging of FIG. 51, tilted field raster elements 408 are dividing the light beam and superimpose the partial light bundles in the reticle plane 406. In this way, a multiple number of secondary light sources 410 are produced, which are distributed uniformly over the pupil plane. The tilt angles of the individual field raster elements 408 correspond, at the center points of the field raster elements, approximately to the curvatures of a hyperboloid, which would image the laser-plasma source 400 in the reticle plane 406, together with the ellipsoid mirror 402. The diverging effect of the telescope system is thus introduced by the tilt angles of the field raster elements.

In FIG. 52, the abbreviations are drawn in, as they are used in the following system derivation. For better presentation, the system was drawn linearly with refractive components.

The following values are used as a basis for the example of embodiment described below, without the numerical data being seen as a limitation:

a. Arc-shaped field radius: $R_{field}=100$ mm, segment angle 60°, field width $\pm 3.0$ mm, which corresponds to a rectangular field of 105 mm×6 mm.
b. Aperture at the reticle: $NA_{field}=0.025$.
c. Aperture at the source: $NA_{source}=0.999$.
d. $z_1=100.0$ mm
e. Structural length $L=z_3+z_4=1400$ mm.
f. Number of field raster elements within an x-row=4.

With the following equations the basic configuration of the illumination system can be derived:

$$NA_{field} = \frac{\frac{D_{FRE}}{2}}{L} \Rightarrow D_{FRE} = 2 \cdot L \cdot NA_{field}$$

$$\frac{D_{PRE}}{x_{FRE}} = 4.0 \Rightarrow x_{FRE} = \frac{D_{PRE}}{4.0}$$

$$\beta_{FRE} = \frac{x_{field}}{x_{FRE}} = \frac{z_4}{z_3} \Rightarrow \beta_{FRE} = \frac{x_{field}}{x_{FRE}}$$

$$\Rightarrow z_4 = z_3 \cdot \beta_{FRE}$$

$$L = z_3 + z_4 \Rightarrow z_3 = \frac{L}{1+\beta_{FRE}}$$

$$NA' = \frac{\frac{D_{FRE}}{2}}{z_3} \Rightarrow NA' = \frac{\frac{D_{FRE}}{2}}{z_3}$$

$$\tan(\theta) = -\frac{(1-Ex) \cdot \sin(\theta')}{2\sqrt{Ex} - (1-Ex) \cdot \cos(\theta')} \Rightarrow Ex = f(NA_{source}, NA')$$

$$Ex_{col} = \left(\frac{sk-s1}{sk+s1}\right)^2 = \left(\frac{z_2-z_1}{z_2+z_1}\right)^2 \Rightarrow z_2 = z_1 \cdot \frac{1+\sqrt{Ex_{col}}}{1-\sqrt{Ex_{col}}}$$

$$Ex_{col} = 1 - \frac{R_{col}}{a} \Rightarrow R_{col} = \frac{z_1+z_2}{2} \cdot (1-Ex_{col})$$

$D_{FRE}$: diameter of the plate with the field raster elements
$x_{FRE}$: length of one field raster element
$y_{FRE}$: width of one field raster element
$\beta_{FRE}$: magnification ratio of the imaging of field raster elements
$D_{PRE}$: diameter of the plate with the pupil raster elements
$R_{col}$: curvature of the elliptical collector
$Ex_{col}$: conical constant of the elliptical collector
$NA'$: aperture after the collector mirror With the pregiven specifications the following system parameters can be calculated:

$$D_{FRE} = 2 \cdot L \cdot NA_{field} = 2 \cdot 1400 \text{ mm} \cdot 0.25 = 70.0 \text{ mm}$$

$$x_{FRE} = \frac{D_{FRE}}{4.0} = \frac{70.0 \text{ mm}}{4.0} = 17.5 \text{ mm}$$

$$y_{FRE} = 1.0 \text{ mm}$$

$$\beta_{FRE} = \frac{x_{field}}{x_{FRE}} = \frac{105.0 \text{ mm}}{17.5 \text{ mm}} = 6.0$$

$$z_3 = \frac{L}{1+\beta_{FRE}} = \frac{1400.0 \text{ mm}}{1+6.0} = 200.0 \text{ mm}$$

$$z_4 = z_3 \cdot \beta_{FRE} = 200.0 \text{ mm} \cdot 6.0 = 1200.0 \text{ mm}$$

$$NA' = \frac{D_{DRE}/2}{z_3} = \frac{70.0 \text{ mm}/2}{200.0 \text{ mm}} = 0.075$$

$$Ex_{col} = f(NA_{source}, NA') = 0.695$$

$$z_2 = z_1 \cdot \frac{1+\sqrt{Ex_{col}}}{1-\sqrt{Ex_{col}}} = 100.0 \text{ mm} \cdot \frac{1+\sqrt{0.695}}{1-\sqrt{0.695}} = 1101.678 \text{ mm}$$

$$R_{col} = \frac{z_1+z_2}{2} \cdot (1-Ex_{col}) =$$

$$\frac{100.0 \text{ mm} + 1101.678 \text{ mm}}{2} \cdot (1-0.695) = 183.357 \text{ mm}$$

The field mirrors are constructed similar to the case of the first example of embodiment of a illumination system, i.e., two toroid mirrors are again used as field mirrors.

In FIGS. 53–58, the propagation of the light rays is shown in an illumination system according to the previously given parameters as an example.

Figure 53:
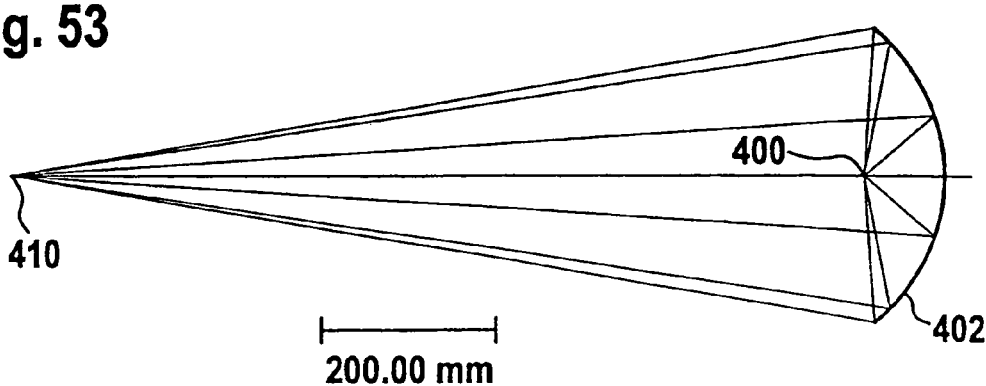
FIGS. 53–58: Beam path in a system according to FIGS. 49–52.

In FIG. 53, the ray propagation is shown for an ellipsoid mirror 402, which is designed for a source aperture NA=0.999 and which images the primary light source 400 on a secondary light source 410.

Figure 54:
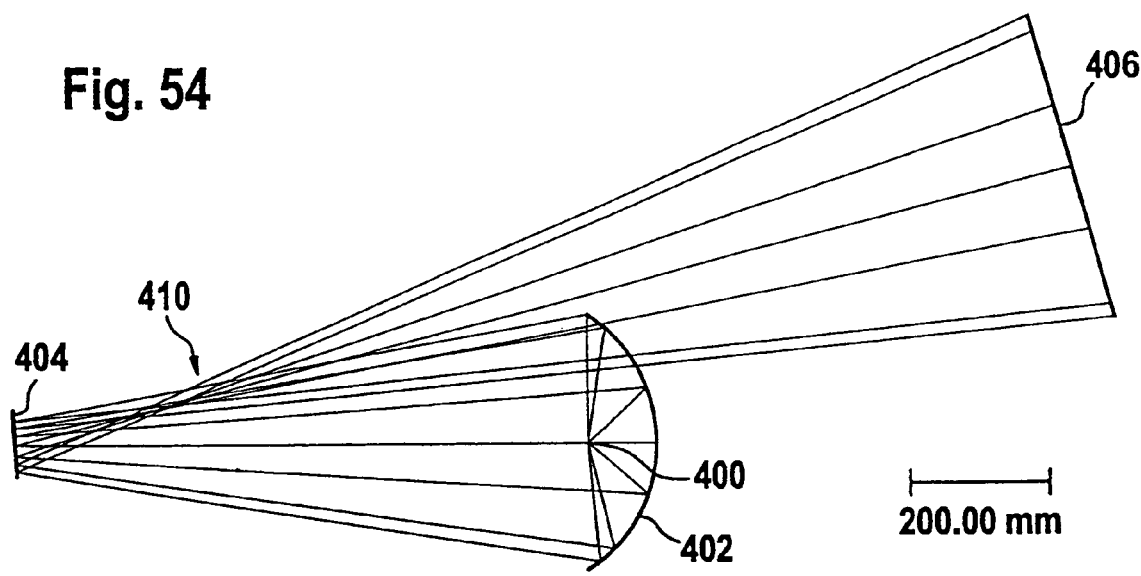

In the form of embodiment according to FIG. 54, a planar mirror 404 is arranged at the position of the field raster element plate, which reflects the light beam. The rays are propagated up to the reticle plane 406.

Figure 55:
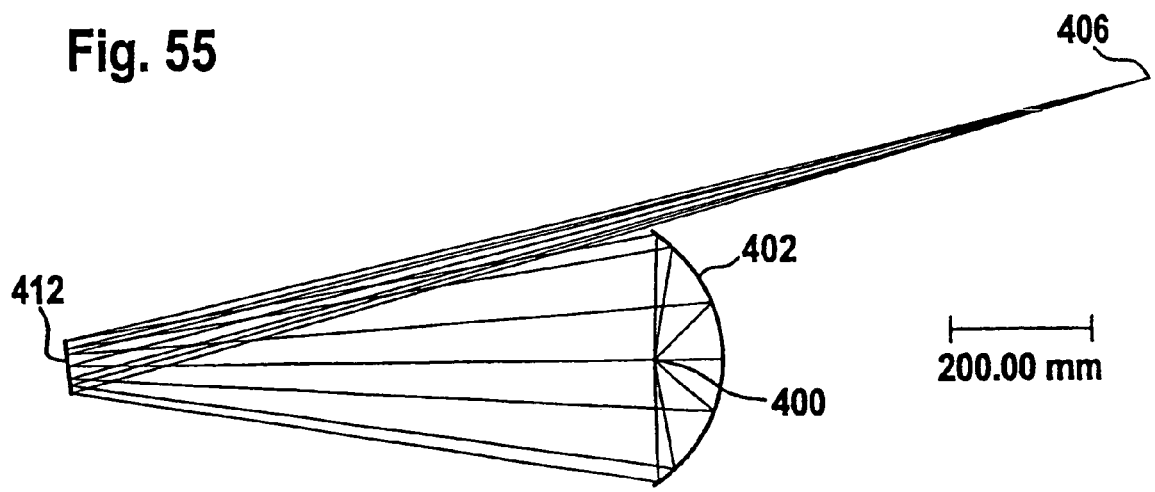

Finally, in FIG. 55, the construction according to the invention is shown, in which mirror 404 is replaced by the field raster element plate 412. A fan of rays is depicted, wherein each ray goes through the center of the individual field raster elements. These rays intersect on the optical axis in the reticle plane 406.

In this configuration the primary light source 400 is arranged in the object plane of the collector mirror 402, wherein the secondary light source 410 is arranged in the image plane of the collector mirror 402. If the collector unit consists only of one collector mirror 402 the image-side principal plane of the collector unit is located at the vertex of the collector mirror 402. The optical distance between the vertex of the collector mirror 402 and the secondary light source 410 is in this configuration equal to the sum of the optical distance between the vertex of the collector mirror 402 and the plate 412 with the field raster elements and the optical distance between the plate 412 with the field raster elements and the secondary light source 410. If the refraction index is equal to 1.0, the optical distance is equal to the geometrical distance.

Figure 56:
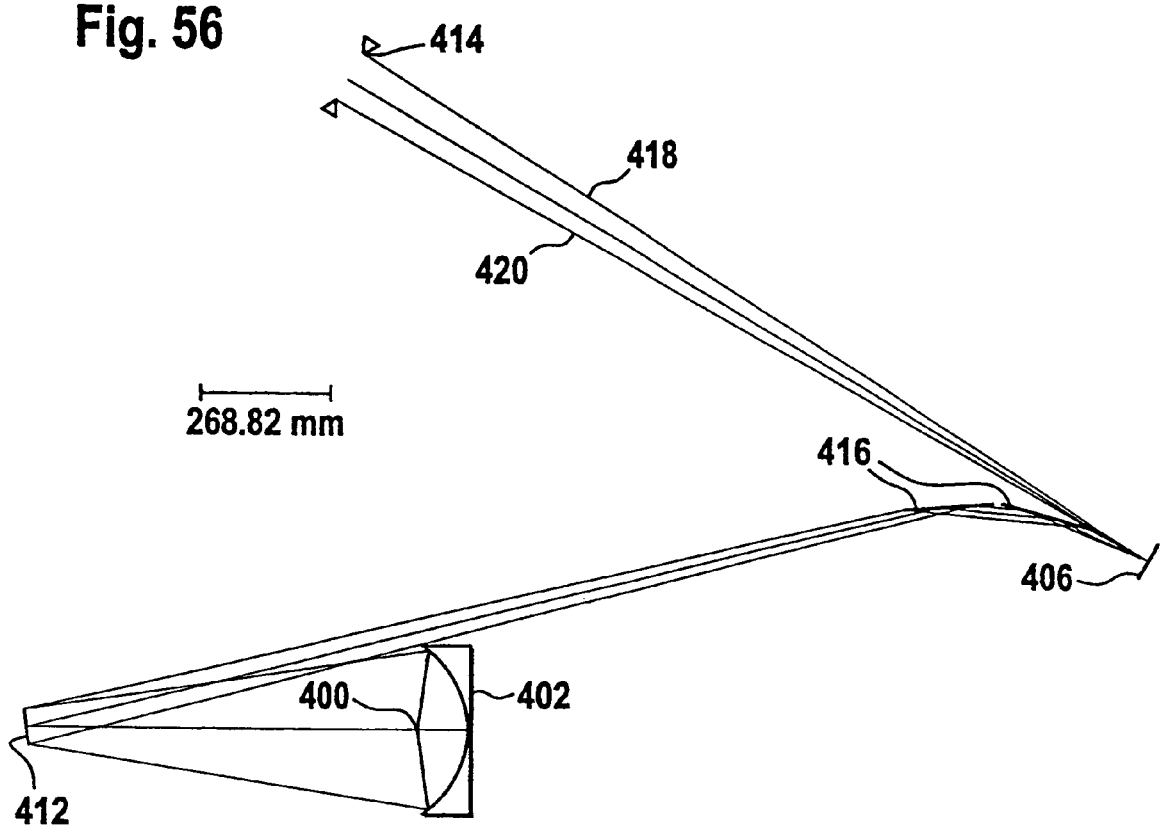

FIG. 56 finally shows the total illumination system up to entrance pupil 414 of the projection objective with two field mirrors 416. The marginal rays 418, 420 strike on reticle 406 and are further propagated up to the entrance pupil 414 of the projection objective.

Figure 57:
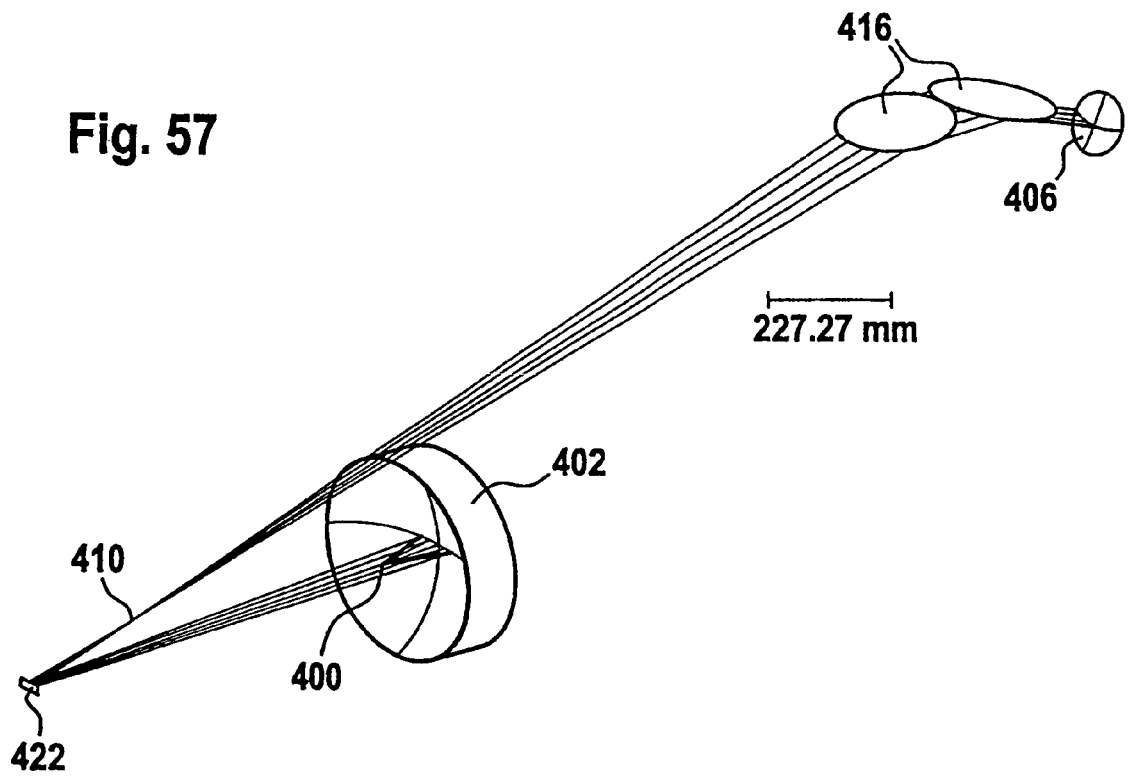

In FIG. 57, an x-z fan of rays is depicted for the system of FIG. 56, and this fan strikes the central field raster element 422. The rays illuminate the arc-shaped field on reticle 406 with the correct orientation.

Figure 58:
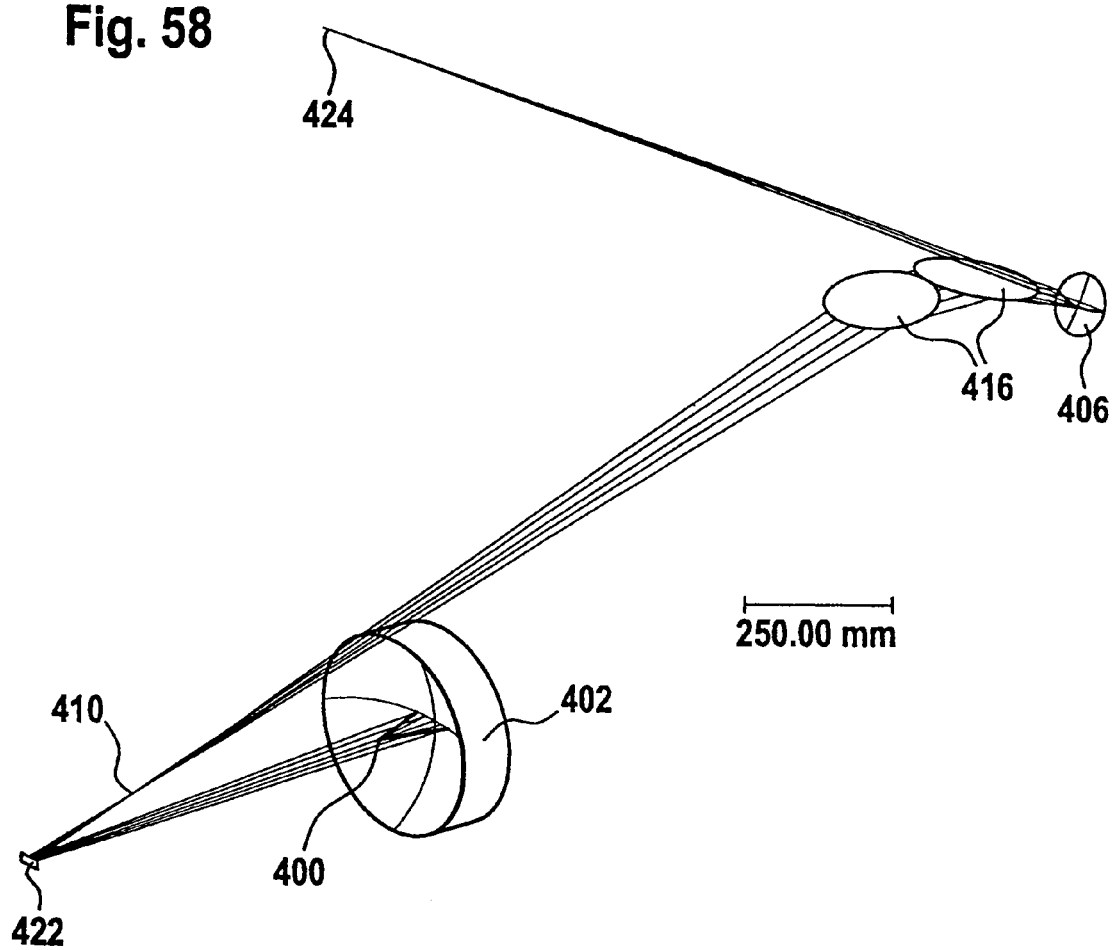

In FIG. 58, in addition, the entrance pupil 424 of the projection objective is represented. The depicted rays are propagated along the optical axis and are focused in the center of the entrance pupil. The primary light source 400 is imaged into the secondary light source 410 by the collector mirror 402, wherein the field mirrors 416 image the secondary light source 410 into a tertiary light source in the center of the entrance pupil 424 of the projection objective.

Figure 59:
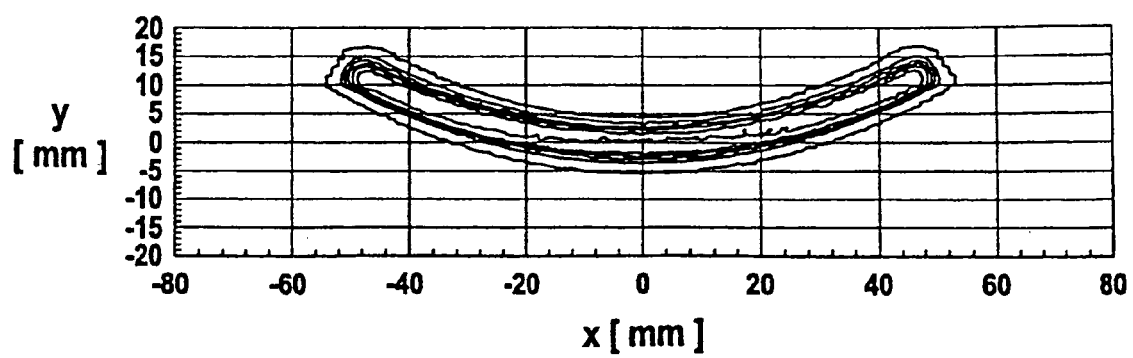
FIG. 59: Illumination of the reticle with an illumination arrangement according to FIGS. 52–58.

In FIG. 59, the illumination of the reticle is shown with an arc-shaped field ($R_{field}$=100 mm, segment=60°, field height±3.0 mm), which is based on an illumination arrangement according to FIGS. 52–58.

Figure 60:
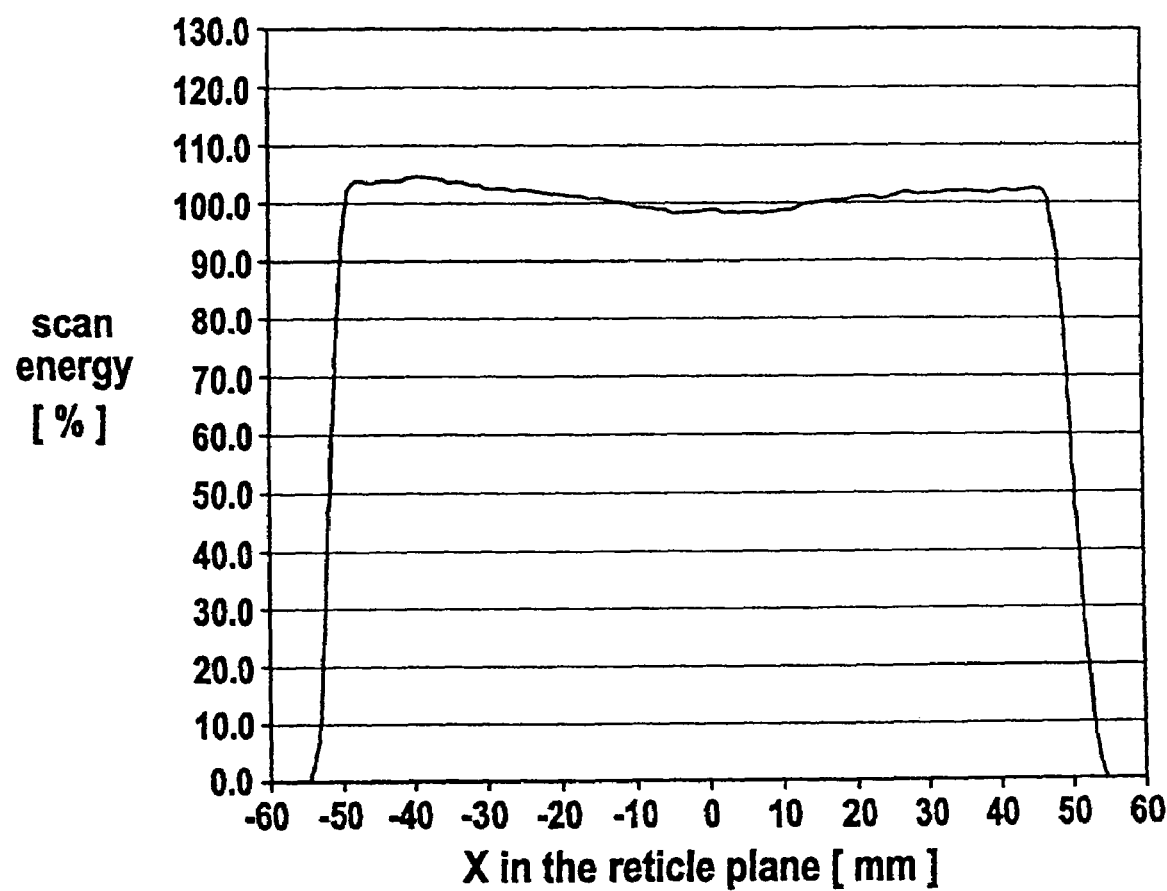
FIG. 60: Integral scanning energy in the reticle plane of a system according to FIGS. 52–58.

The integral scanning energy is shown in FIG. 60. The integral scan energy varies between 100% and 105%. The uniformity or homogeneity thus amounts to ±2.5%.

Figure 61:
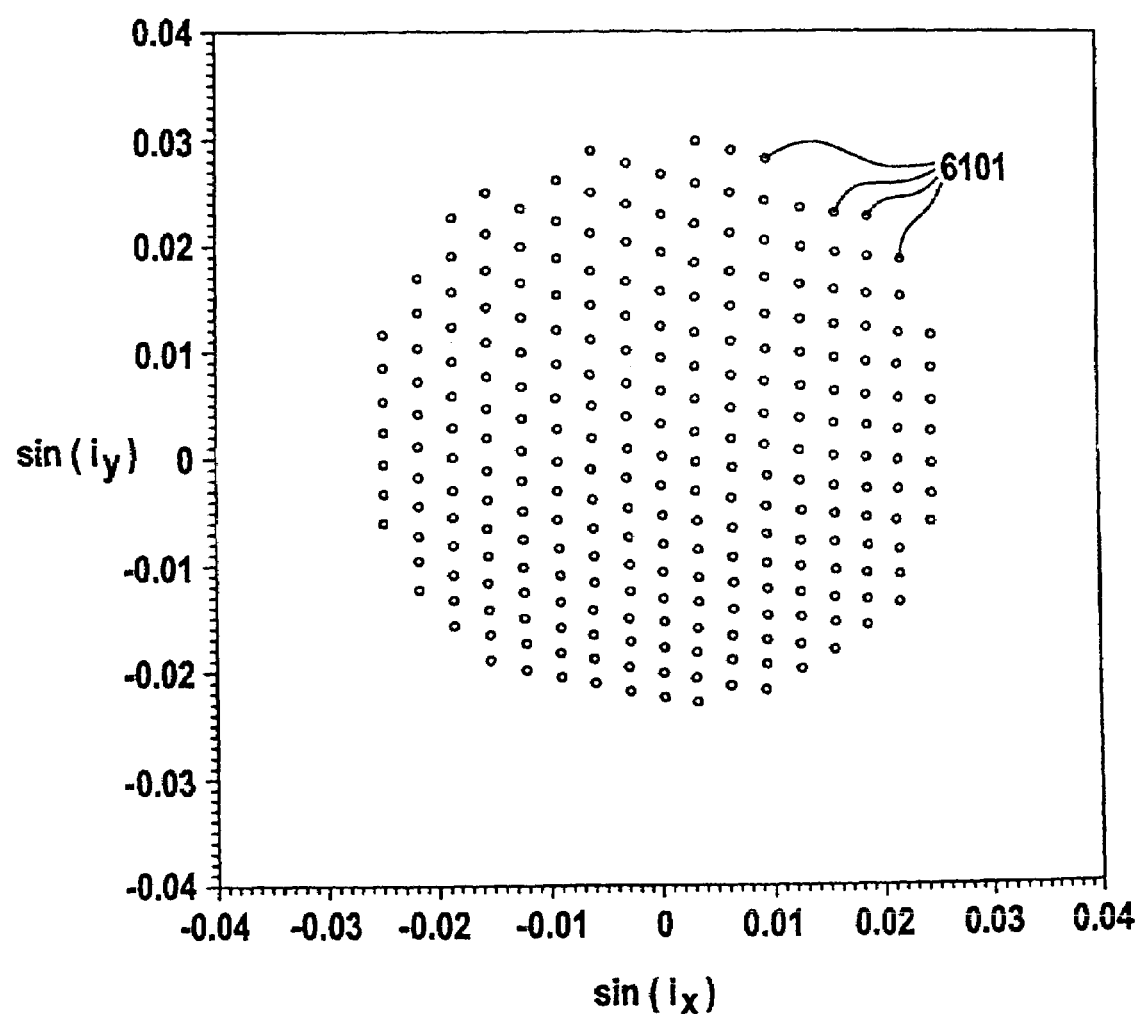
FIG. 61: Pupil illumination of a system according to FIGS. 52–58.

FIG. 61 represents the pupil illumination of the above-described system for an object point in the center of the illuminated field. The sines of the ray angles are referred to the direction of the centroid ray. Corresponding to the field raster element distribution, a distribution of tertiary light sources 6101 is produced in the pupil illumination. The tertiary light sources 6101 are uniformly distributed. There are no center obscurations, since in the case of the described second form of embodiment, the mirrors are arranged in zigzag configuration.

Figure 62:
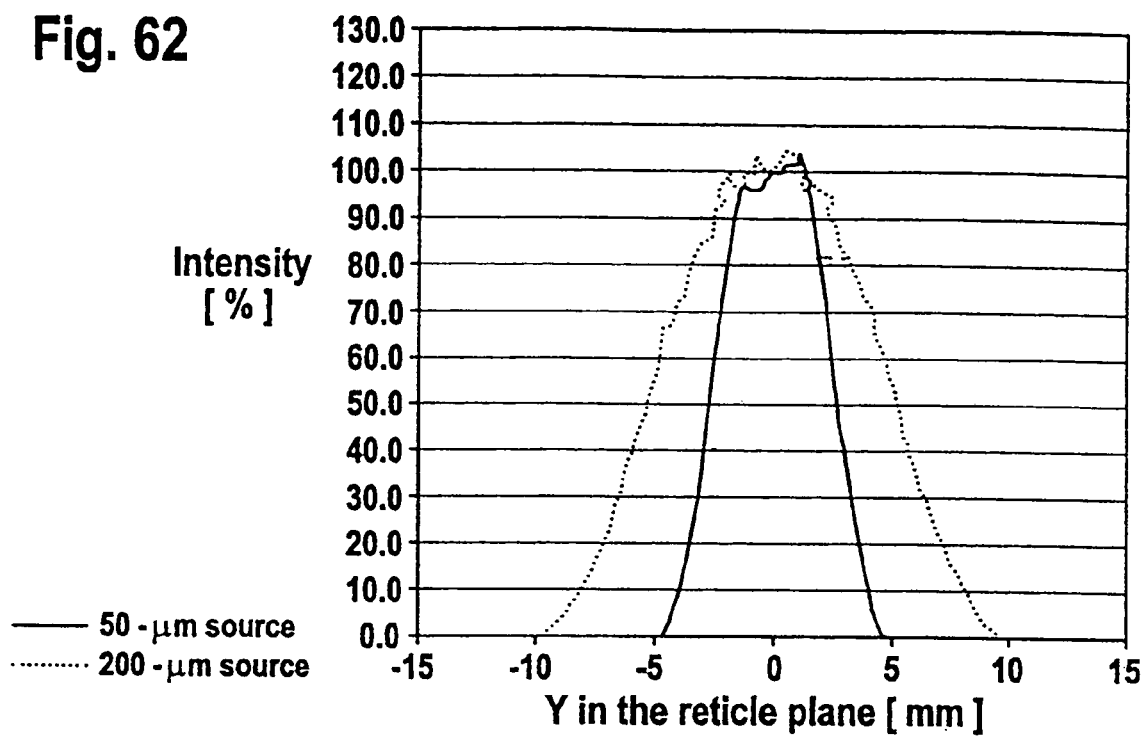
FIG. 62: Intensity distribution in the scan direction of a system according to FIGS. 52–58.

In FIG. 62, a profile of the intensity distribution at x=0 mm is shown in the scan direction with the use of two different laser-plasma sources. Whereas without the pupil raster elements for the 50-μm source, the desired rectangular profile is obtained, the 200-μm source shows at the edges a clear blurring. This source can no longer be considered point-like. The use of pupil raster elements, such as, for example, in the case of the pinch-plasma source, is necessary for the correct imaging of the field raster elements into the reticle plane.

Figure 63A:
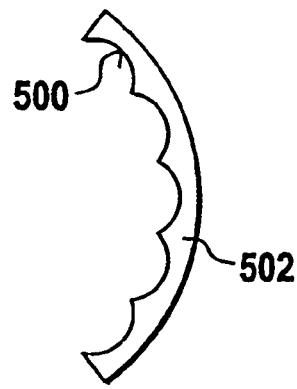
FIG. 63A: Raster element plate with individual raster elements on a curved supporting surface.
Figure 63B:
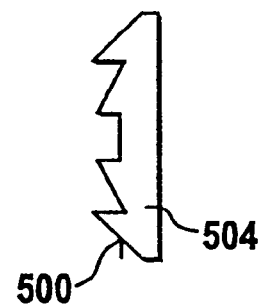
FIG. 63B: Raster element plate with tilted raster elements on a planar supporting plate.

In FIGS. 63A+63B two possibilities are shown for the formation of the field raster element plate. In FIG. 63A, the raster elements 500 are arranged on a curved supporting surface 502. Thus the inclination of the raster elements corresponds to the slope of the supporting surface. Such plates are described, for example, in the case of the first form of embodiment with a collector mirror and a telescope system comprising two mirrors.

If the field raster elements 500 are shaped in planar manner, such as, for example, in the case of the second form of embodiment that is described, in which collector unit and field raster element plate are combined into a telescope system, then the individual field raster elements are arranged under a pregiven tilt angle on the raster element plate 504. Depending on the distribution of the tilt angles on the plate, one obtains either collecting or diverging effects. A plate with a diverging effect is illustrated.

Of course, raster element plates with planar field raster elements can be used also in systems according to the first example of embodiment with a collector unit and two tele-mirrors. In the case of such a system, the raster elements are then tilted onto one of the mirrors such that a diverging effect is produced and onto the other in such a way that a collecting effect is produced.

Figure 64:
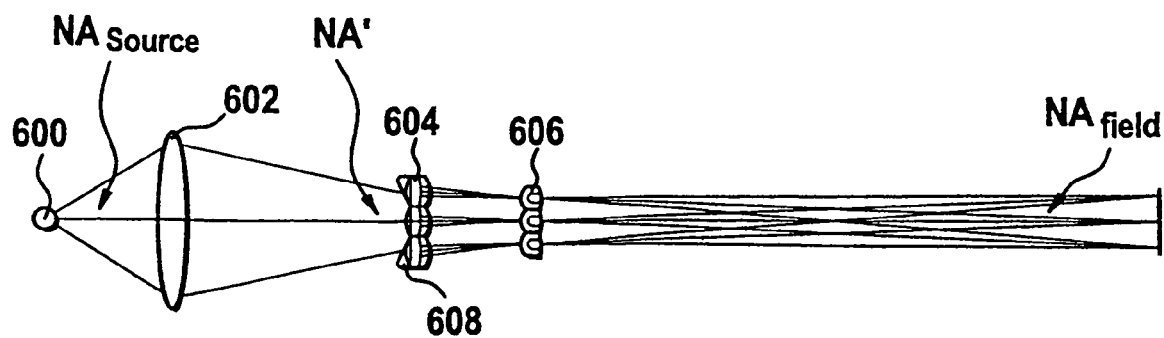
FIG. 64: A configuration of the invention with lenslets and prisms as raster elements in schematic presentation.

FIG. 64 shows a form of embodiment of the invention, which is designed as a refractive system with lenses for wavelengths, for example, of 193 nm or 157 nm. The system comprises a light source 600, a collector lens 602, as well as a field raster element plate 604 and a pupil raster element plate 606. Prisms 608 arranged in front of the field raster elements serve for adjusting the light path between the field raster element plate 604 and the pupil raster element plate 606.

Figure 65:
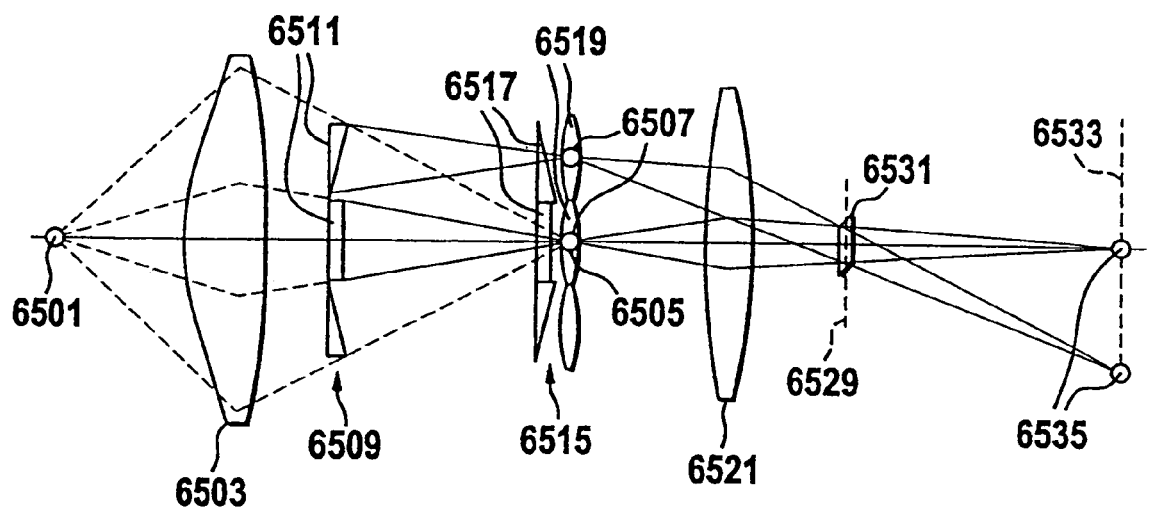
FIG. 65: A schematic view of a refractive embodiment with prisms as field raster elements.

FIG. 65 shows another embodiment for a purely refractive system in a schematically view. The beam cone of the light source 6501 is collected by the aspherical collector lens 6503 and is directed to the plate with the field raster elements 6509. The collector lens 6503 is designed to generate an image 6505 of the light source 6501 at the plate with the pupil raster elements 6515 as shown with the dashed lines if the plate with the field raster elements 6509 is not in the beam path. Therefore without the plate with the field raster elements 6509 one secondary light source 6505 would be produced at the plate with the pupil raster elements. This imaginary secondary light source 6505 is divided into a plurality of secondary light sources 6507 by the field raster elements 6509 formed as field prisms 6511. The arrangement of the secondary light sources 6507 at the plate with the pupil raster elements 6515 is produced by the deflection angles of the field prisms 6511. These field prisms 6511 have rectangular surfaces and generate rectangular light bundles. However, they can have any other shape. The pupil raster elements 6515 are arranged nearby each of the secondary light sources 6507 to image the corresponding field raster elements 6509 into the reticle plane 6529 and to superimpose the rectangular images of the field raster elements 6509 in the field 6531 to be illuminated. The pupil raster elements 6515 are designed as combinations of a pupil prism 6517 and a pupil lenslet 6519 with positive optical power. The pupil prisms 6517 deflect the incoming ray bundles to superimpose the images of the field raster elements 6509 in the reticle plane 6529. The pupil lenslets 6519 are designed together with the field lens 6521 to image the field raster elements 6509 into the reticle plane 6529. Therefore with the prismatic deflection of the ray bundles at the field raster elements 6509 and pupil raster elements 6515 an arbitrary assignment between field raster elements 6509 and pupil raster elements 6515 is possible. The pupil prisms 6517 and the pupil lenslets 6519 can also be made integrally to form a pupil raster element 6515 with positive and prismatic optical power. The field lens 6521 images the secondary light sources 6507 into the exit pupil 6533 of the illumination system forming tertiary light sources 6535 there.

Figure 66:
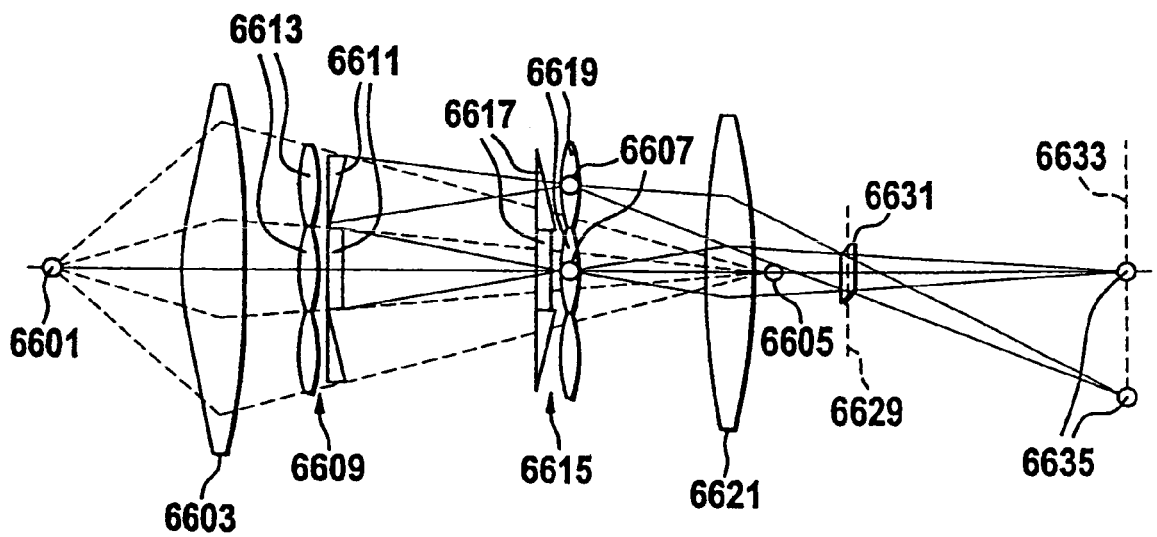
FIG. 66: A schematic view of a refractive embodiment with field raster elements having positive and prismatic optical power.

FIG. 66 shows another embodiment for a purely refractive system in a schematically view. Corresponding elements have the same reference numbers as those in FIG. 65 increased by 300. Therefore, the description to these elements is found in the description to FIG. 65. The aspherical collector lens 6603 is designed to focus the light rays of the light source 6601 in a plane 6605 which is arranged behind the plate with the pupil raster elements 6615 as indicated by the dashed lines. Therefore the field raster elements 6609 have a positive optical power to produce the secondary light sources 6607 at the plate with the pupil raster elements 6615. The field raster elements 6609 are designed as combinations of a field prism 6611 and a field lenslet 6613. The field prisms 6611 deflect the incoming ray bundles to the corresponding secondary light sources 6607. The field lenslets 6613 are designed to generate the secondary light sources 6607 at the corresponding pupil raster elements 6615. The field prisms 6611 and the field lenslets 6613 can also be made integrally to form field raster elements 6609 with positive and prismatic optical power.

Figure 67:
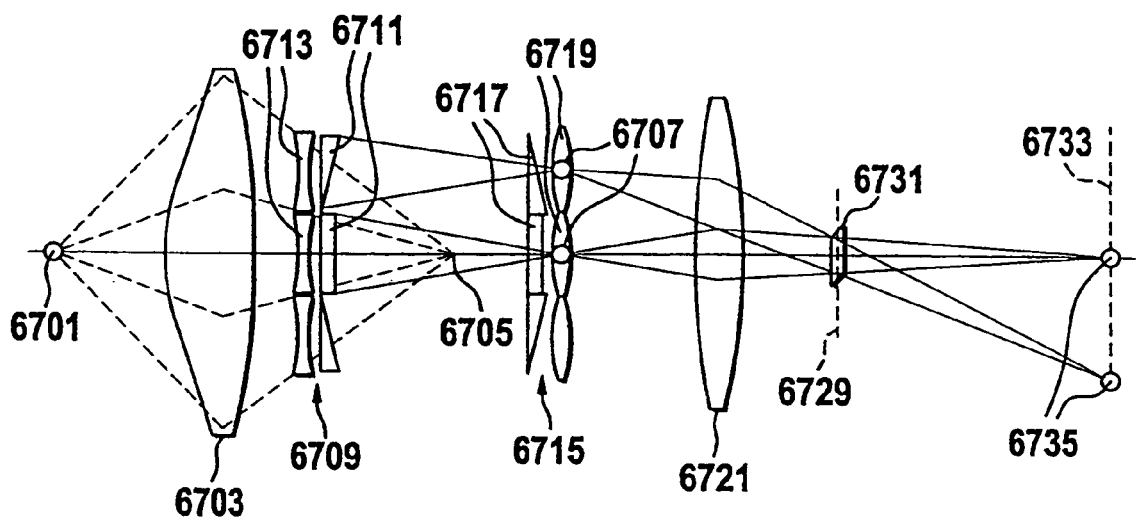
FIG. 67: A schematic view of a refractive embodiment with field raster elements having negative and prismatic optical power.

FIG. 67 shows another embodiment for a purely refractive system in a schematically view. Corresponding elements have the same reference numbers as those in FIG. 66 increased by 100. Therefore, the description to these elements is found in the description to FIG. 66. The aspheric collector lens 6703 is designed to focus the light rays of the light source 6701 in a plane 6705 which is arranged between the plate with the field raster elements 6709 and the plate with the pupil raster elements 6715 as indicated by the dashed lines. Therefore the field raster elements 6709 have negative optical power to produce the secondary light sources 6707 at the plate with the pupil raster elements 6715. The field raster elements 6709 are designed as combinations of a field prism 6711 and a field lenslet 6713. The field prisms 6711 deflect the incoming ray bundles to the corresponding secondary light sources 6707. The field lenslets 6713 are designed to generate the secondary light sources 6707 at the corresponding pupil raster elements 6715. The field prisms 6711 and the field lenslets 6713 can also be made integrally to form field raster elements 6709 with negative and prismatic optical power.

Figure 68:
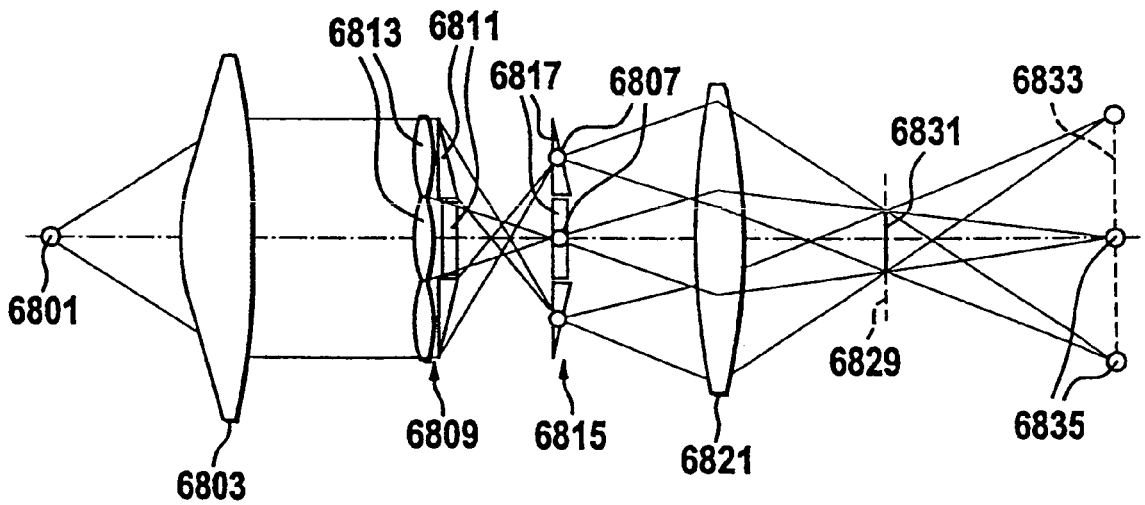
FIG. 68: A schematic view of a refractive embodiment with field raster elements having positive and prismatic optical power and prisms as pupil raster elements.

FIG. 68 shows another embodiment for a purely refractive system in a schematically view. Corresponding elements have the same reference numbers as those in FIG. 67 increased by 100. Therefore, the description to these elements is found in the description to FIG. 67. The aspheric collector lens 6803 is designed to generate a parallel light bundle. Wherein in FIGS. 65 to 67 the plate with the field raster elements is arranged in a convergent beam path, the plate with the field raster elements 6809 in FIG. 68 is arranged in a parallel beam path. The field raster elements 6809 are designed as combinations of a field prism 6811 and a field lenslet 6813. The field prisms 6811 deflect the incoming ray bundles to the corresponding secondary light sources 6807. The field lenslets 6813 are designed to generate the secondary light sources 6807 at the corresponding pupil raster elements 6815. They have positive optical power and a focal length which corresponds to the distance between the field raster elements 6809 and the pupil raster elements 6815. Since the light source 6801 is a point-like source, also the secondary light sources 6807 are point-like. Therefore, the pupil raster elements 6815 are designed as prisms 6817.

Figure 69:
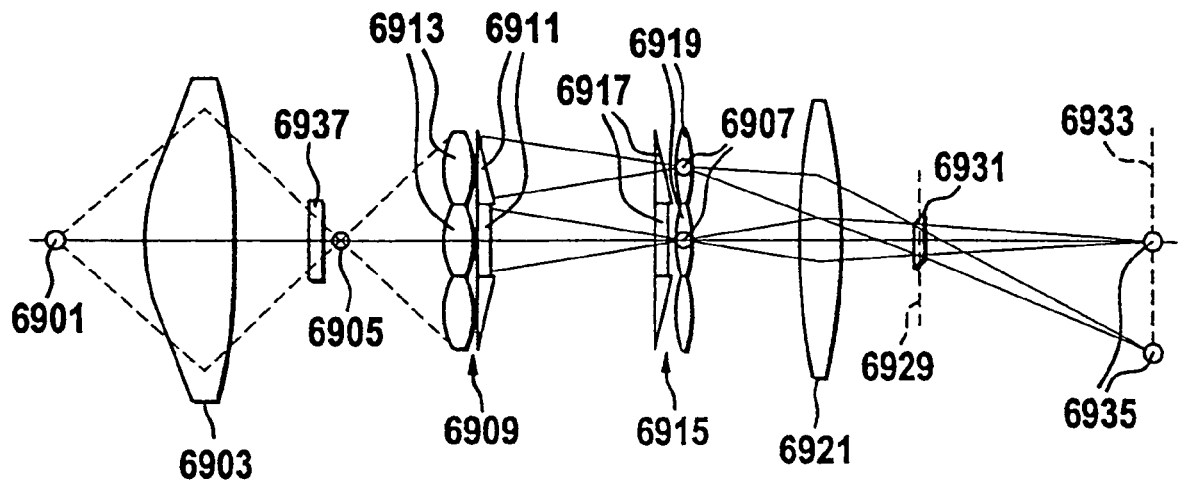
FIG. 69: A schematic view of a refractive embodiment having an intermediate image of the primary light source.

FIG. 69 shows another embodiment for a purely refractive system in a schematically view. Corresponding elements have the same reference numbers as those in FIG. 66 increased by 300. Therefore, the description to these elements is found in the description to FIG. 65. The aspheric collector lens 603 is designed to focus the light rays of the light source 6601 in a plane 6905 which is arranged in front of the plate with the field raster elements 6909 as indicated by with the dashed lines. Nearby this image of the light source a transmissions filter 6937 is arranged. This filter can also be used to select the used wavelength range. In the plane 6905 also a shutter can be arranged. The field raster elements 6909 have a positive optical power to produce the secondary light sources 6907 at the plate with the pupil raster elements 6915.

Figure 70:
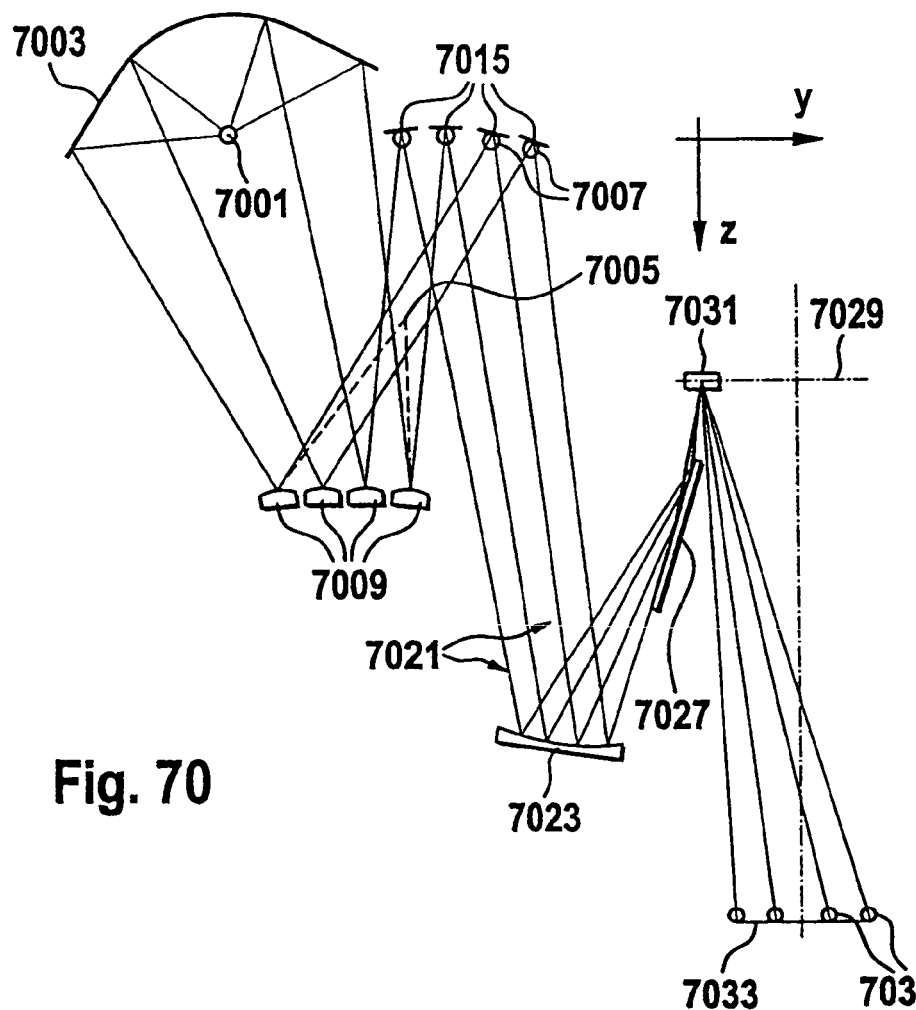
FIG. 70: A schematic view of a reflective embodiment with convex mirrors as field raster elements and planar mirrors as pupil raster elements.

FIG. 70 shows an embodiment for a purely reflective system in a schematically view. Corresponding elements have the same reference numbers as those in FIG. 69 increased by 100. Therefore, the description to these elements is found in the description to FIG. 69. The beam cone of the light source 7001 is collected by the ellipsoidal collector mirror 7003 and is directed to the plate with the field raster elements 7009. The collector mirror 7003 is designed to generate an image 7005 of the light source 7001 between the plate with the field raster elements 7009 and the plate with the pupil raster elements 7015 if the plate with the field raster elements 7009 would be a planar mirror as indicated by the dashed lines. The convex field raster elements 7009 are designed to generate point-like secondary light sources 7007 at the pupil raster elements 7015, since the light source 7001 is also point-like. Therefore the pupil raster elements 7015 are designs as planar mirrors. Since the intensity at the point-like secondary light sources 7007 is very high, the planar pupil raster elements 7015 can alternatively be arranged defocused from the secondary light sources 7007. The distance between the secondary light sources 7007 and the pupil raster elements 7015 should not exceed 20% of the distance between the field raster elements and the pupil raster elements. The pupil raster elements 7015 are tilted to superimpose the images of the field raster elements 7009 together with the field lens 7021 formed as the field mirrors 7023 and 7027 in the field 7031 to be illuminated. Both, the field raster elements 7009 and the pupil raster elements 7015 are tilted. Therefore the assignment between the field raster elements 7009 and pupil raster elements 7015 is defined by the user. In the embodiment of FIG. 70 the field raster elements 7009 at the center of the plate with the field raster elements 7009 correspond to the pupil raster elements 7015 at the border of the plate with the pupil raster elements 7015 and vice versa. The tilt angles and the tilt axes of the field raster elements are determined by the directions of the incoming ray bundles and by the positions of the corresponding pupil raster elements 7015. Since for each field raster element 7009 the tilt angle and the tilt axis is different, also the planes of incidence defined by the incoming and reflected centroid rays are not parallel. The tilt angles and the tilt axes of the pupil raster elements 7015 are determined by the positions of the corresponding field raster elements 7009 and the requirement that the images of the field raster elements 7009 has to be superimposed in the field 7031 to be illuminated. The concave field mirror 7023 images the secondary light sources 7007 into the exit pupil 7033 of the illumination system forming tertiary light sources 7035, wherein the convex field mirror 7027 being arranged at grazing incidence transforms the rectangular images of the rectangular field raster elements 7009 into arc-shaped images.

Figure 71:
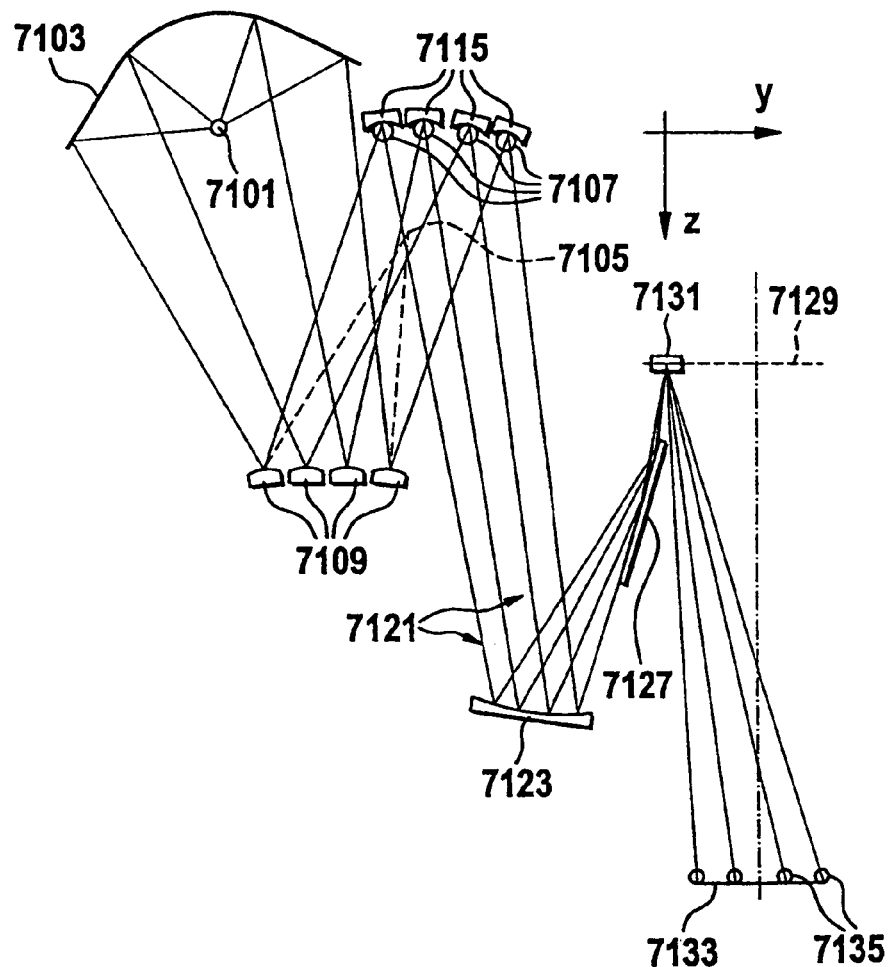
FIG. 71: A schematic view of a reflective embodiment with convex mirrors as field raster elements and concave mirrors as pupil raster elements.

FIG. 71 shows another embodiment for a purely reflective system in a schematically view. Corresponding elements have the same reference numbers as those in FIG. 70 increased by 100. Therefore, the description to these elements is found in the description to FIG. 70. In this embodiment the light source 7101 and therefore also the secondary light sources 7107 are extended. The pupil raster elements 7115 are designed as concave mirrors to image the field raster elements 7109 into the image plane 7129. It is also possible to arrange the pupil raster elements 7115 not at the secondary light sources 7107, but defocused. The influence of the defocus on the imaging of the field raster elements 7109 has to be consider in the optical power of the pupil raster elements.

Figure 72:
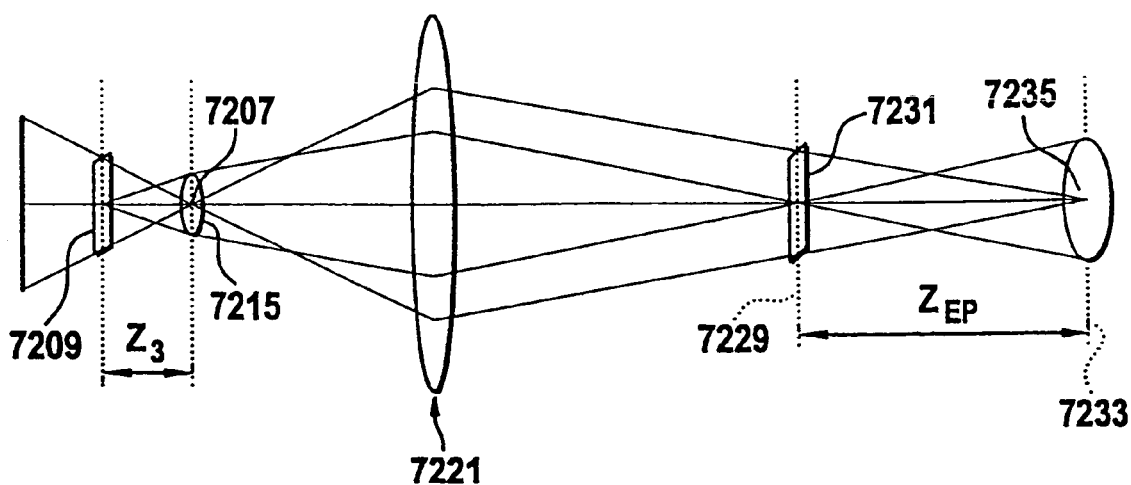
FIG. 72: A schematic view of the principal setup of the illumination system.

FIG. 72 shows in a schematic view the imaging of one field raster element 7209 into the reticle plane 7229 forming an image 7231 and the imaging of the corresponding secondary light source 7207 into the exit pupil 7233 of the illumination system forming a tertiary light source 7235. Corresponding elements have the same reference numbers as those in FIG. 70 increased by 200. Therefore, the description to these elements is found in the description to FIG. 70.

The field raster elements 7209 are rectangular and have a length $X_{FRE}$ and a width $Y_{FRE}$. All field raster elements 7209 are arranged on a nearly circular plate with a diameter $D_{FRE}$. They are imaged into the image plane 7229 and superimposed on a field 7233 with a length $X_{field}$ and a width $Y_{field}$, wherein the maximum aperture in the image plane 7229 is denoted by $NA_{field}$. The field size corresponds to the size of the object field of the projection objective, for which the illumination system is adapted to.

The plate with the pupil raster elements 7215 is arranged in a distance of $Z_3$ from the plate with the pupil raster elements 7215. The shape of the pupil raster elements 7215 depends on the shape of the secondary light sources 7207. For circular secondary light sources 7207 the pupil raster elements 7215 are circular or hexagonal for a dense packaging of the pupil raster elements 7215. The diameter of the plate with the pupil raster elements 7215 is denoted by $D_{PRE}$.

The pupil raster elements 7215 are imaged by the field lens 7221 into the exit pupil 7233 having a diameter of $D_{EP}$. The distance between the image plane 7229 of the illumination system and the exit pupil 7233 is denoted with $Z_{EP}$. Since the exit pupil 7233 of the illumination system corresponds to the entrance pupil of the projection objective, the distance $Z_{EP}$ and the diameter $D_{EP}$ are predetermined values. The entrance pupil of the projection objective is typically illuminated up to a user-defined filling ratio σ.

The data for a preliminary design of the illumination system can be calculated with the equations and data given below. The values for the parameters are typical for a EUV projection exposure apparatus. But there is no limitation to these values. Wherein the schematic design is shown for a refractive linear system, it can be easily adapted for reflective systems by exchanging the lenses with mirrors.

The field 7231 to be illuminated is defined by a segment of an annulus. The Radius of the annulus is $R_{field}$=138 mm.

The length and the width of the segment are $X_{field}$=88 mm, $Y_{field}$=8 mm

Without the field-forming field mirror which transforms the rectangular images of the field raster elements into arc-shaped images the field to be illuminated is rectangular with the length and width defined by the segment of the annulus.

The distance from the image plane to the exit pupil is $Z_{EP}$=1320 mm.

The object field of the projection objective is an off-axis field. The distance between the center of the field and the optical axis of the projection objective is given by the radius $R_{field}$. Therefore the incidence angle of the centroid ray in the center of the field is 6°.

The aperture at the image plane of the projection objective is $NA_{wafer}$=0.25. For a reduction projection objective with a magnification ratio of $β_{proj}$=−0.25 and a filling ratio of σ=0.8 the aperture at the image plane of the illumination system is $$NA_{field} = σ · \frac{NA_{wafer}}{4} = 0.05$$

$D_{EP}$=2 tan [arc sin($NA_{field}$)]·$Z_{EP}$≈2$NA_{EP}$·$Z_{EP}$≈132 mm

The distance $Z_3$ between the field raster elements and the pupil raster elements is related to the distance $Z_{EP}$ between the image plane and the exit pupil by the depth magnification α:

$Z_{EP}$=α·$Z_3$

The size of the field raster elements is related to the field size by the lateral magnification $β_{field}$:

$X_{field}$=$β_{field}$·$X_{FRE}$ $Y_{field}$=$β_{field}$·$Y_{FRE}$

The diameter $D_{PRE}$ of the plate with the pupil raster elements and the diameter $D_{EP}$ of the exit pupil are related by the lateral magnification $β_{pupil}$:

$D_{EP}$=$β_{pupil}$·$D_{PRE}$

The depth magnification ac is defined by the product of the lateral magnifications $β_{field}$ and $β_{pupil}$:

α=$β_{field}$·$β_{pupil}$

The number of raster elements being superimposed at the field is set to 200. With this high number of superimposed images the required field illumination uniformity can be achieved.

Another requirement is to minimize the incidence angles on the components. For a reflective system the beam path is bent at the plate with the field raster elements and at the plate with the pupil raster elements. The bending angles and therefore the incidence angles are minimal for equal diameters of the two plates:

$D_{PRE}$=$D_{FRE}$ $$200 \cdot X_{PRE} \cdot Y_{PRE} = 200 \cdot \frac{X_{field} \cdot Y_{field}}{\beta_{field}^2} = \frac{D_{EP}^2}{\beta_{pupil}^2} = \frac{\beta_{field}^2}{\alpha^2} D_{EP}^2$$

The distance $Z_3$ is set to $Z_3$=900 mm. This distance is a compromise between low incidence angles and a reduced overall length of the illumination system.

$$\alpha = \frac{Z_{EP}}{Z_3} = 1.47$$

Therefore $$|\beta_{field}| \approx \sqrt[4]{\frac{200 \cdot X_{field} \cdot Y_{field}}{D_{EP}^2} \alpha^2} \approx 2.05$$

$$|\beta_{pupil}| \approx \frac{\alpha}{\beta_{field}} \approx 0.7$$

$$D_{FRE} = D_{PRE} = \frac{\beta_{field}}{\alpha} D_{EP} \approx 200 \text{ mm}$$

$$X_{FRE} = \frac{X_{field}}{\beta_{field}} \approx 43 \text{ mm}$$

$$Y_{FRE} = \frac{Y_{field}}{\beta_{field}} \approx 4 \text{ mm}$$

With these values the principal layout of the illumination system is known.

Figure 73:
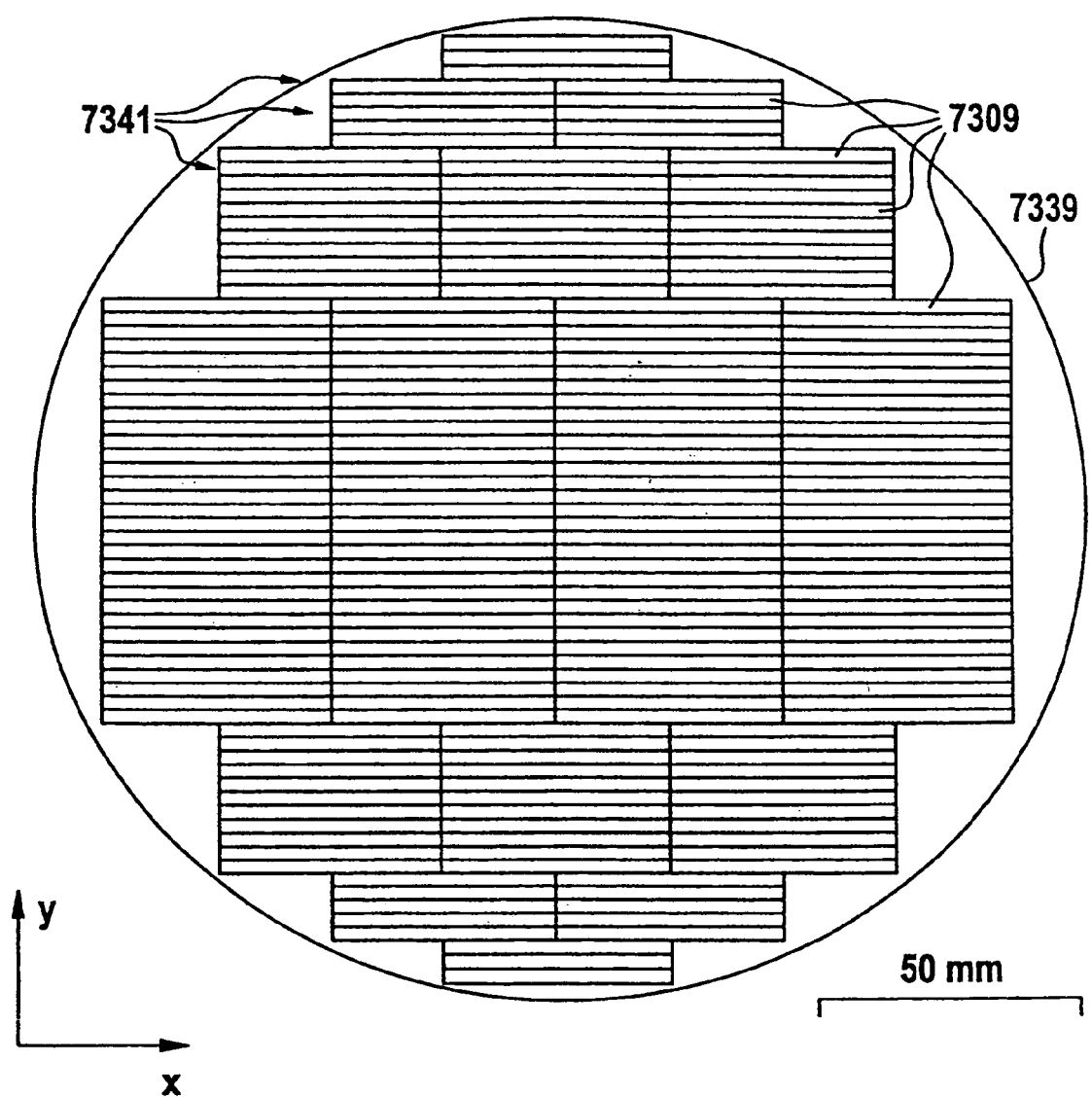
FIG. 73: An Arrangement of the field raster elements.

In a next step the field raster elements 7309 have to be distributed on the plate as shown in FIG. 73. The two-dimensional arrangement of the field raster elements 7309 is optimized for efficiency. Therefore the distance between the field raster elements 7309 is as small as possible. Field raster elements 7309, which are only partially illuminated, will lead to uniformity errors of the intensity distribution in the image plane, especially in the case of a restricted number of field raster elements 7309. Therefore only these field raster elements 7309 are imaged into the image plane which are illuminated almost completely FIG. 73 shows a possible arrangement of 216 field raster elements 7309. The solid line 7339 represents the border of the circular illumination of the plate with the field raster elements 7309. Therefore the filling efficiency is approximately 90%. The rectangular field raster elements 7309 have a length $X_{FRE}$=46.0 mm and a width $Y_{FRE}$=2.8 mm. All field raster elements 7309 are inside the circle 7339 with a diameter of 200 mm. The field raster elements 7309 are arranged in 69 rows 7341 being arranged one among another. The field raster elements 7309 in the rows 7341 are attached at the smaller y-side of the field raster elements 7309. The rows 7341 consist of one, two, three or four field raster elements 7309. Some rows 7341 are displaced relative to the adjacent rows 7341 to distribute the field raster elements 7309 inside the circle 7339. The distribution is symmetrical to the y-axis.

Figure 74:
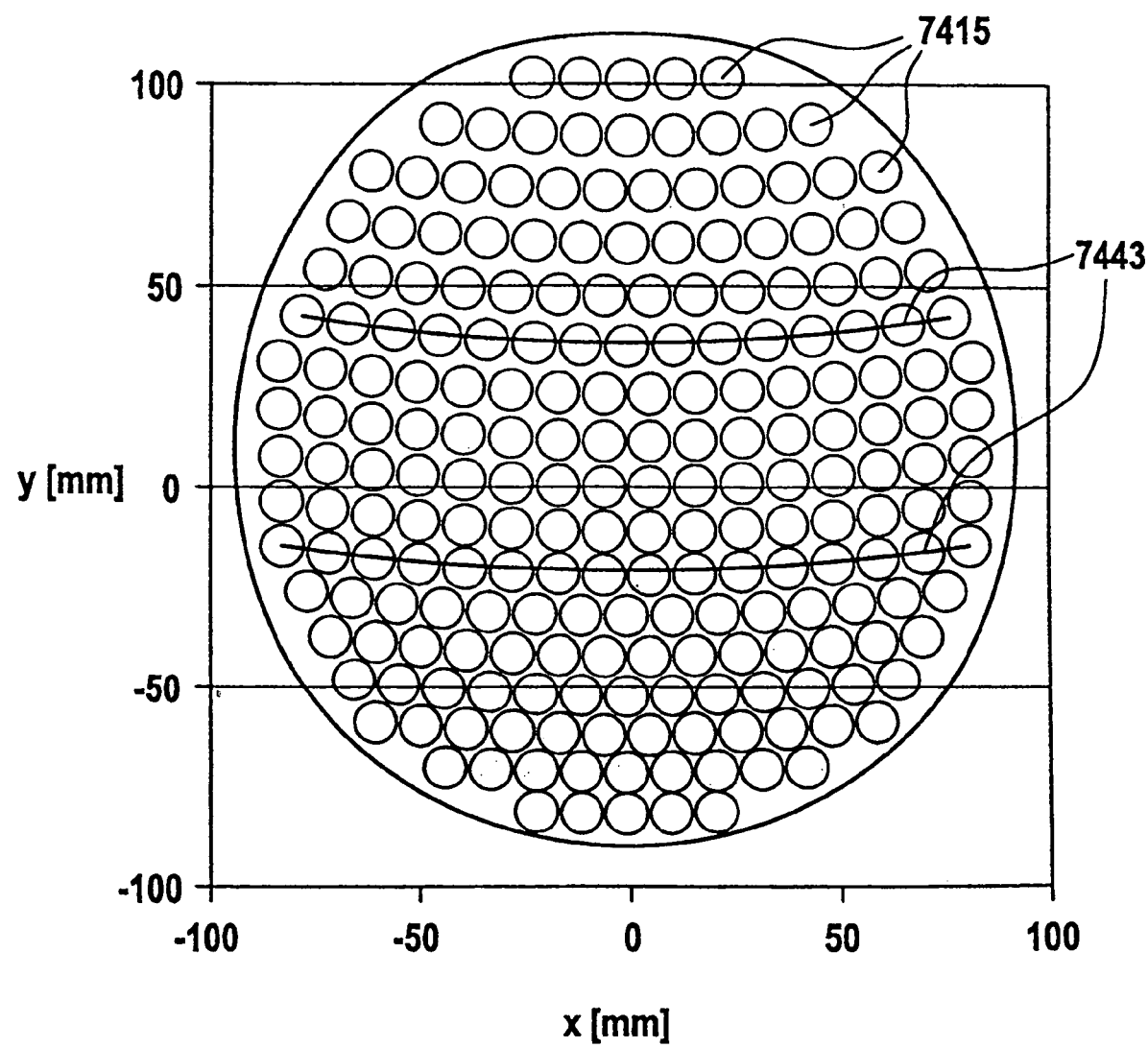
FIG. 74: An Arrangement of the pupil raster elements.

FIG. 74 shows the arrangement of the pupil raster elements 7415. They are arranged on a distorted grid to compensate for distortion errors of the field lens. If this distorted grid of pupil raster elements 7415 is imaged into the exit pupil of the illumination system by the field lens a undistorted regular grid of tertiary light sources will be generated. The pupil raster elements 7415 are arranged on curved lines 7443 to compensate the distortion introduced by the field-forming field mirror. The distance between adjacent pupil raster elements 7415 is increased in y-direction to compensate the distortion introduced by field mirrors being tilted about the x-axis. Therefore the pupil raster elements 7415 are not arranged inside a circle. The size of the pupil raster elements 7415 depends on the source size or source étendue. If the source étendue is much smaller than the required étendue in the image plane, the secondary light sources will not fill the plate with the pupil raster elements 7415 completely. In this case the pupil raster elements 7415 need only to cover the area of the secondary light sources plus some overlay to compensate for source movements and imaging aberrations of the collector-field raster element unit. In FIG. 74 circular pupil raster elements 7415 are shown.

Each field raster element 7309 correspond to one of the pupil raster elements 7415 according to a assignment table and is tilted to deflect an incoming ray bundle to the corresponding pupil raster element 7415. A ray coming from the center of the light source and intersecting the field raster element 7309 at its center is deflected to intersect the center of the corresponding pupil raster element 7415. The tilt angle and tilt axis of the pupil raster element 7415 is designed to deflect this ray in such a way, that the ray intersects the field in its center.

The field lens images the plate with the pupil raster elements into the exit pupil and generates the arc-shaped field with the desired radius $R_{field}$. For $R_{field}$=138 mm, the field forming gracing incidence field mirror has only low negative optical power. The optical power of the field-forming field mirror has to be negative to get the correct orientation of the arc-shaped field. Since the magnification ratio of the field lens has to be positive, another field mirror with positive optical power is required. Wherein for apertures $NA_{field}$ lower than 0.025 the field mirror with positive optical power can be a grazing incidence mirror, for higher apertures the field mirror with positive optical power should be a normal incidence mirror.

Figure 75:
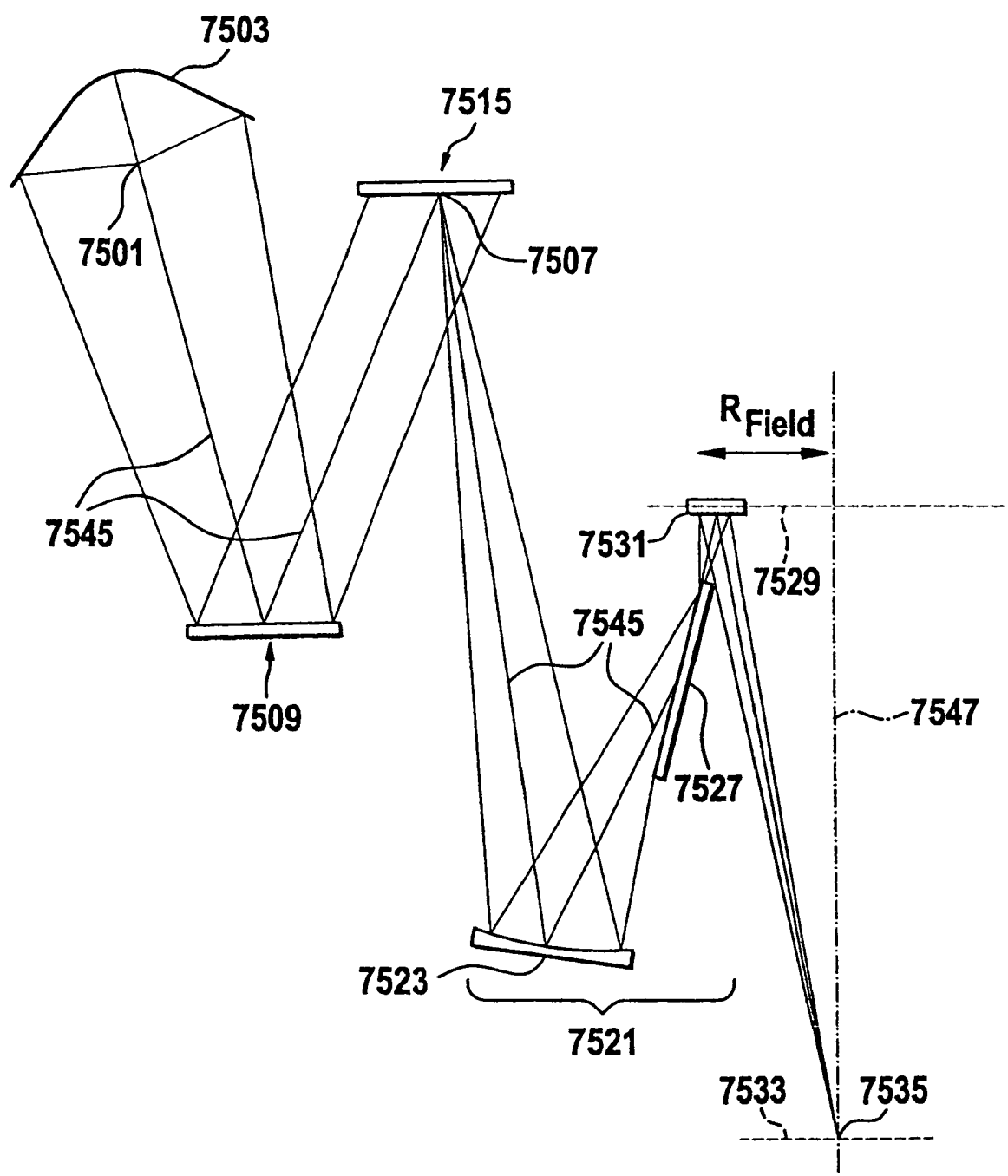
FIG. 75: A schematic view of a reflective embodiment with a concave pupil-imaging field mirror and a convex field-forming field mirror.

FIG. 75 shows a schematic view of a embodiment comprising a light source 7501, a collector mirror 7503, a plate with the field raster elements 7509, a plate with the pupil raster elements 7515, a field lens 7521, a image plane 7529 and a exit pupil 7535. The field lens 7521 has one normal-incidence mirror 7523 with positive optical power for pupil imaging and one grazing-incidence mirror 7527 with negative optical power for field shaping. Exemplary for the imaging of all secondary light sources, the imaging of one secondary light source 7507 into the exit pupil 7533 forming a tertiary light source 7535 is shown. The optical axis 7545 of the illumination system is not a straight line but is defined by the connection lines between the single components being intersected by the optical axis 7545 at the centers of the components. Therefore, the illumination system is a non-centered system having an optical axis 7545 being bent at each component to get a beam path free of vignetting. There is no common axis of symmetry for the optical components. Projection objectives for EUV exposure apparatus are typically centered systems with a straight optical axis and with an off-axis object field. The optical axis 7547 of the projection objective is shown as a dashed line. The distance between the center of the field 7531 and the optical axis 7547 of the projection objective is equal to the field radius $R_{field}$. The pupil imaging field mirror 7523 and the field-forming field mirror 7527 are designed as on-axis toroidal mirrors, which means that the optical axis 7545 paths through the vertices of the on-axis toroidal mirrors 7523 and 7527.

Figure 76:
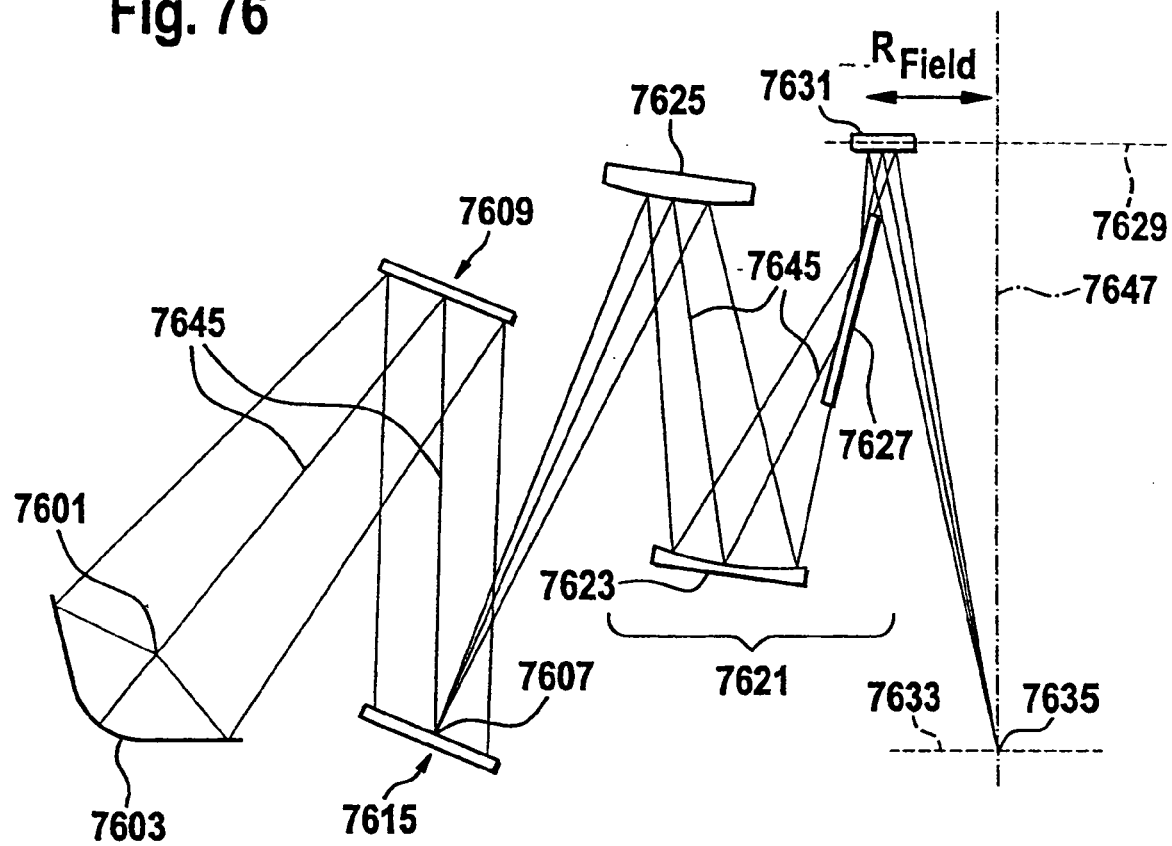
FIG. 76: A schematic view of a reflective embodiment with a field lens comprising a telescope system and a convex field-forming field mirror.

In another embodiment as shown in FIG. 76, a telescope objective in the field lens 7621 comprising the field mirror 7623 with positive optical power, the field mirror 7625 with negative optical power and the field mirror 7627 is applied to reduce the track length. Corresponding elements have the same reference numbers as those in FIG. 75 increased by 100. Therefore, the description to these elements is found in the description to FIG. 75. The field mirror 7625 and the field mirror 7623 of the telescope objective in FIG. 74 are formed as an off-axis Cassegrainian configuration. The telescope objective has an object plane at the secondary light sources 7601 and an image plane at the exit pupil 7633 of the illumination system. The pupil plane of the telescope objective is arranged at the image plane 7629 of the illumination system. In this configuration, having five normal-incidence reflections at the mirrors 7603, 7609, 7615, 7625 and 7623 and one grazing-incidence reflection at the mirror 7627, all mirrors are arranged below the image plane 7629 of the illumination system. Therefore, there is enough space to install the reticle and the reticle support system.

Figure 77:
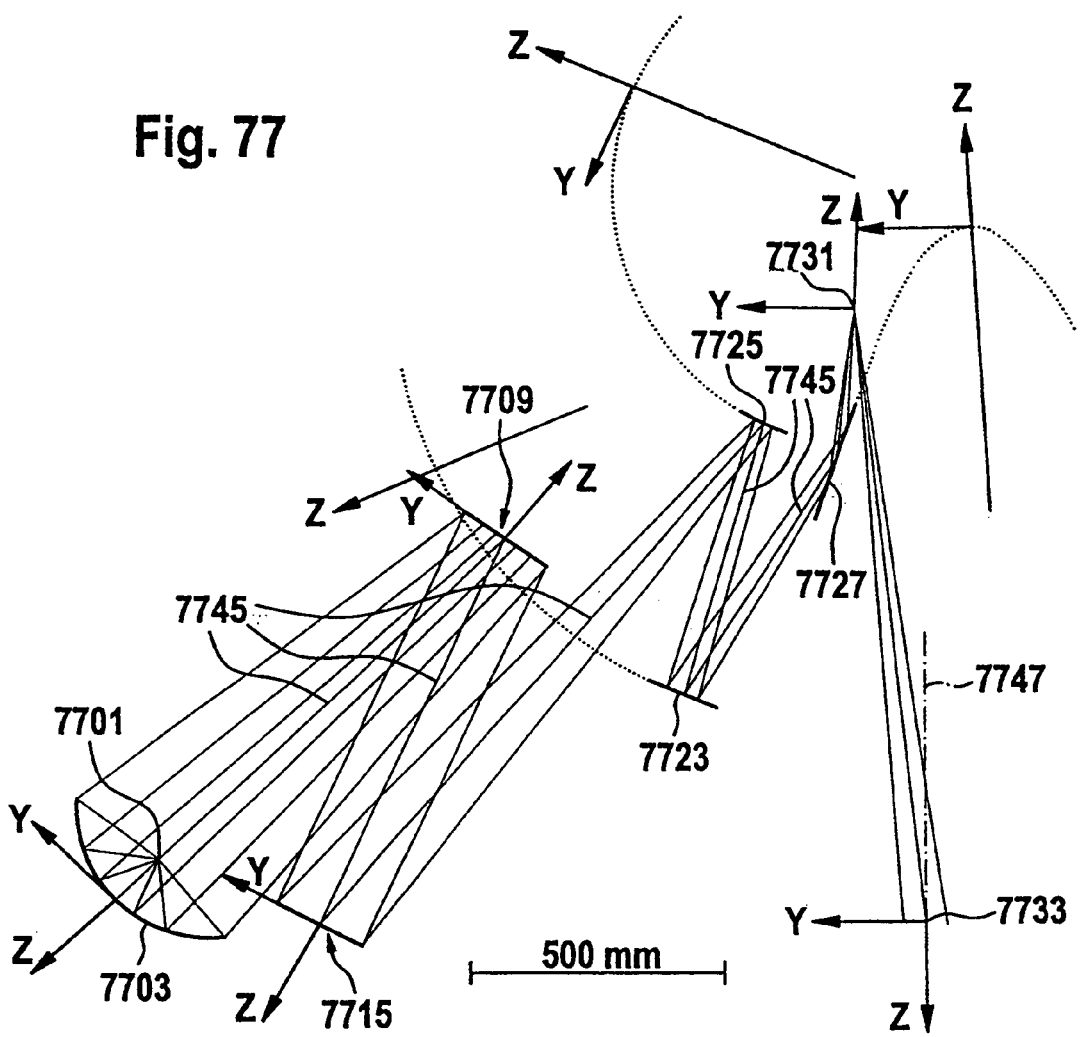
FIG. 77: A detailed view of the embodiment of FIG. 76.

In FIG. 77 a detailed view of the embodiment of FIG. 76 is shown. Corresponding elements have the same reference numbers as those in FIG. 76 increased by 100. Therefore, the description to these elements is found in the description to FIG. 76. The components are shown in a y-z-sectional view, wherein for each component the local co-ordinate system with the y- and z-axis is shown. For the collector mirror 7703 and the field mirrors 7723, 7725 and 7727 the local co-ordinate systems are defined at the vertices of the mirrors. For the two plates with the raster elements the local co-ordinate systems are defined at the centers of the plates. In table 2 the arrangement of the local co-ordinate systems with respect to the local co-ordinate system of the light source 7701 is given. The tilt angles α, β and γ about the x-, y- and z-axis are defined in a right-handed system.

TABLE 2

Co-ordinate systems of vertices of mirrors

| | X [mm] | Y[mm] | Z[mm] | α [°] | β [°] | γ[°] |
|---|---|---|---|---|---|---|
| Light source 7701 | 0.0 | 0.0 | 0.0 | 0.0 | 0.0 | 0.0 |
| Collector mirror 7703 | 0.0 | 0.0 | 125.0 | 0.0 | 0.0 | 0.0 |
| Plate with field raster elements 7709 | 0.0 | 0.0 | −975.0 | 10.5 | 180.0 | 0.0 |
| Plate with pupil raster elements 7715 | 0.0 | −322.5 | −134.8 | 13.5 | 0.0 | 180.0 |
| Field mirror 7725 | 0.0 | 508.4 | −1836.1 | −67.8 | 0.0 | 180.0 |
| Field mirror 7723 | 0.0 | 204.8 | −989.7 | −19.7 | 0.0 | 180.0 |
| Field mirror 7727 | 0.0 | −163.2 | −2106.2 | 49.4 | 180.0 | 0.0 |
| Image plane 7731 | 0.0 | −132.1 | −1820.2 | 45.0 | 0.0 | 0.0 |
| Exit pupil 7733 | 0.0 | −1158.1 | −989.4 | 45.0 | 0.0 | 0.0 |

The surface data are given in table 3. The radius R and the conical constant K define the surface shape of the mirrors according to the formula $$z = \frac{\frac{1}{R}h^2}{1+\sqrt{1-(1+K)\left(\frac{1}{R}\right)^2 h^2}},$$

wherein h is the radial distance of a surface point from the z-axis.

TABLE 3

Optical data of the components

| | Collector mirror 7703 | Field raster element 7709 | Pupil raster element 7715 | Field mirror 7725 | Field mirror 7723 | Field mirror 7727 |
|---|---|---|---|---|---|---|
| R [mm] | −235.3 | ∞ | −1239.7 | −534.7 | −937.7 | −65.5 |
| K | −0.77855 | 0.0 | 0.0 | −0.0435 | −0.0378 | −1.1186 |

TABLE 3-continued

Optical data of the components

| | Collector mirror 7703 | Field raster element 7709 | Pupil raster element 7715 | Field mirror 7725 | Field mirror 7723 | Field mirror 7727 |
|---|---|---|---|---|---|---|
| Focal length f [mm] | — | ∞ | 617.6 | −279.4 | 477.0 | −757.1 |

The light source 7701 in this embodiment is a Laser-Produced-Plasma source having a diameter of approximately 0.3 mm generating a beam cone with an opening angle of 83°. To decrease the contamination of the collector mirror 7703 by debris of the source 7701 the distance to the collector mirror 7703 is set to 125 mm.

The collector mirror 7703 is an elliptical mirror, wherein the light source 7701 is arranged in the first focal point of the ellipsoid and wherein the plate with the pupil raster elements 7715 is arranged in the second focal point of the ellipsoid. Therefore the field raster elements 7709 can be designed as planar mirrors. The distance between the vertex of the collector mirror 7703 and the center of the plate with the field raster elements 7709 is 1100 mm. The field raster elements 7709 are rectangular with a length $X_{FRE}$=46.0 mm and a width $Y_{FRE}$=2.8 mm. The arrangement of the field raster elements is shown in FIG. 73. The tilt angles and tilt axis are different for each field raster element 7709, wherein the field raster elements are tilted to direct the incoming ray bundles to the corresponding pupil raster elements 7715. The tilt angles are in the range of −4° to 4°. The mean incidence angle of the rays on the field raster elements is 10.5°. Therefore the field raster elements 7709 are used at normal incidence.

The plate with the pupil raster elements 7715 is arranged in a distance of 900 mm from the plate with the field raster elements 7709. The pupil raster elements 7715 are concave mirrors. The arrangement of the pupil raster elements 7715 is shown in FIG. 72. The tilt angles and tilt axis are different for each pupil raster element 7715, wherein the pupil raster elements 7715 are tilted to superimpose the images of the field raster elements 7709 in the image plane 7731. The tilt angles are in the range of −4° to 4°. The mean incidence angle of the rays on the pupil raster elements 7715 is 7.5°. Therefore the pupil raster elements 7715 are used at normal incidence.

The field mirror 7725 is a convex mirror. The used area of this mirror defined by the incoming rays is an off-axis segment of a rotational symmetric conic surface. The mirror surface is drawn in FIG. 75 from the vertex up to the used area as dashed line. The distance between the center of the plate with the pupil raster elements 7715 and the center of the used area on the field mirror 7725 is 1400 mm. The mean incidence angle of the rays on the field mirror 7725 is 12°. Therefore the field mirror 7725 is used at normal incidence.

The field mirror 7723 is a concave mirror. The used area of this mirror defined by the incoming rays is an off-axis segment of a rotational symmetric conical surface. The mirror surface is drawn in FIG. 75 from the vertex up to the used area as dashed line. The distance between the center of the used area on the field mirror 7725 and the center of the used area on the field mirror 7723 is 600 mm. The mean incidence angle of the rays on the field mirror 7723 is 7.5°. Therefore the field mirror 7723 is used at normal incidence.

The field mirror 727 is a convex mirror. The used area of this mirror defined by the incoming rays is an off-axis segment of a rotational symmetric conic surface. The mirror surface is drawn in FIG. 75 from the vertex up to the used area as dashed line. The distance between the center of the used area on the field mirror 7723 and the center of the used area on the field mirror 7727 is 600 mm. The mean incidence angle of the rays on the field mirror 7727 is 78°. Therefore the field mirror 7727 is used at grazing incidence. The distance between the field mirror 7727 and the image plane 7731 is 300 mm.

In another embodiment the field mirror and the field mirror are replaced with on-axis toroidal mirrors. The vertices of these mirrors are arranged in the centers of the used areas. The convex field mirror has a radius $R_y$=571.3 mm in the y-z-section and a radius $R_x$=546.6 mm in the x-z-section. This mirror is tilted about the local x-axis about 12° to the local optical axis 7745 defined as the connection lines between the centers of the used areas of the mirrors. The concave field mirror has a radius $R_y$=962.14 mm in the y-z-section and a radius $R_x$=−945.75 mm in the x-z-section. This mirror is tilted about the local x-axis about 7.5° to the local optical axis 7745.

Figure 78:
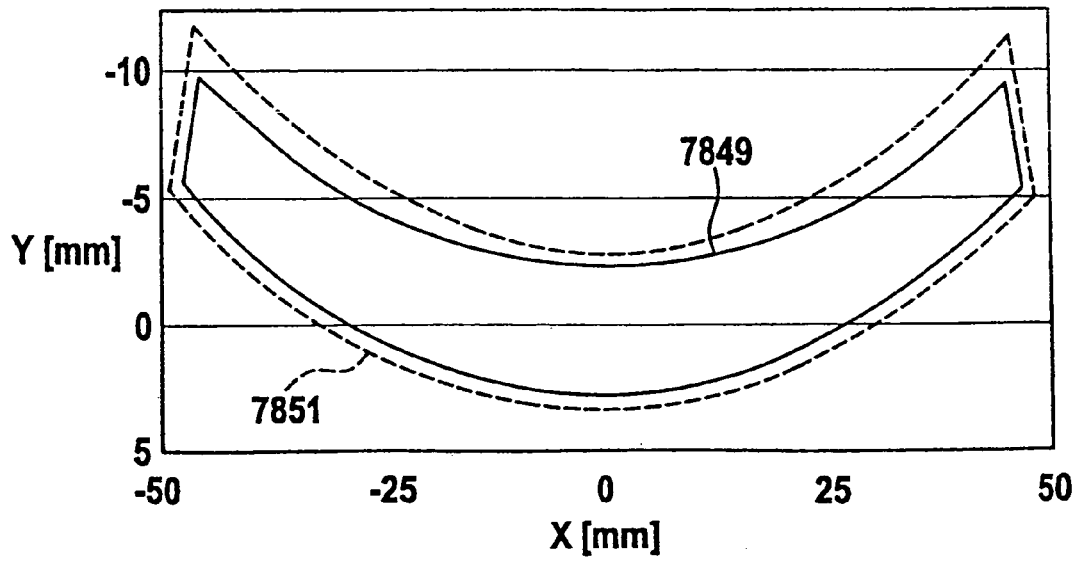
FIG. 78: Intensity distribution of the embodiment of FIG. 77.

FIG. 78 shows the illuminated arc-shaped area in the image plane 7731 of the illumination system presented in FIG. 77. The orientation of the y-axis is defined in FIG. 77. The solid line 7849 represents the 50%-value of the intensity distribution, the dashed line 7851 the 10%-value. The width of the illuminated area in y-direction is constant over the field. The intensity distribution is the result of a simulation done with the optical system given in table 2 and table 3.

Figure 79:
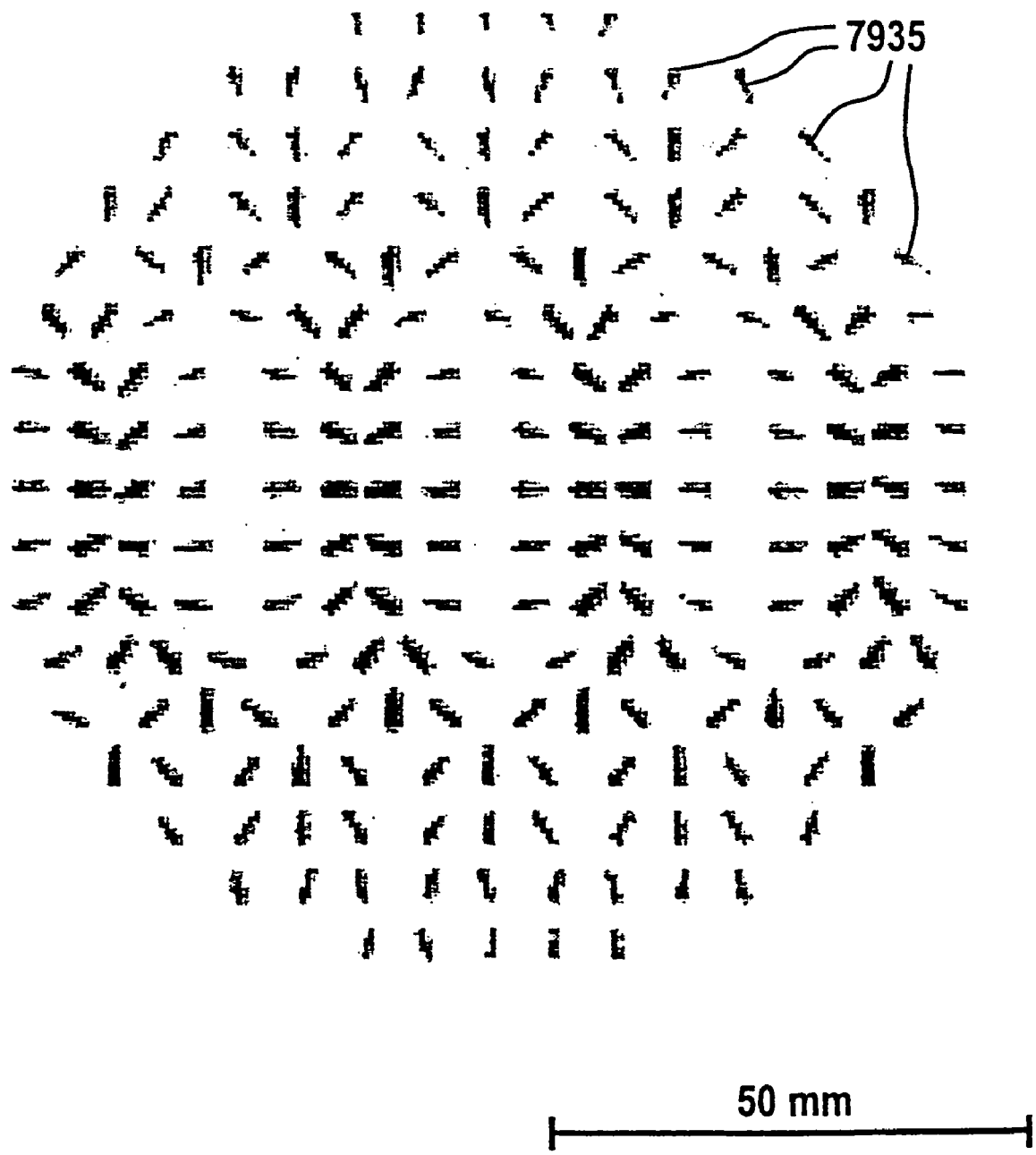
FIG. 79: Illumination of the exit pupil of the illumination system of the embodiment of FIG. 77.

FIG. 79 shows the illumination of the exit pupil 7733 for an object point in the center (x=0 mm; y=0 mm) of the illuminated field in the image plane 7731. The arrangement of the tertiary light sources 7935 corresponds to the arrangement of the pupil raster elements 7715, which is presented in FIG. 74. Wherein the pupil raster elements in FIG. 74 are arranged on a distorted grid, the tertiary light sources 7935 are arranged on a undistorted regular grid. It is obvious in FIG. 79, that the distortion errors of the imaging of the secondary light sources due to the tilted field mirrors and the field-shaping field mirror are compensated. The shape of the tertiary light sources 7935 is not circular, since the light distribution in the exit pupil 7733 is the result of a simulation with a Laser-Plasma-Source which was not spherical but ellipsoidal. The source ellipsoid was oriented in the direction of the local optical axis. Therefore also the tertiary light sources are not circular, but elliptical. Due to the mixing of the light channels and the user-defined assignment between the field raster elements and the pupil raster elements, the orientation of the tertiary light sources 7935 is different for each tertiary light source 7935.

Due to the mixing of the light channels and the user-defined assignment between the field raster elements and the pupil raster elements, the orientation of the tertiary light sources 7935 is different for nearby each tertiary light source 7935. Therefore, the planes of incidence of at least two field raster elements have to intersect each other. The plane of incidence of a field raster element is defined by the centroid ray of the incoming bundle and its corresponding deflected ray.

Figure 80:
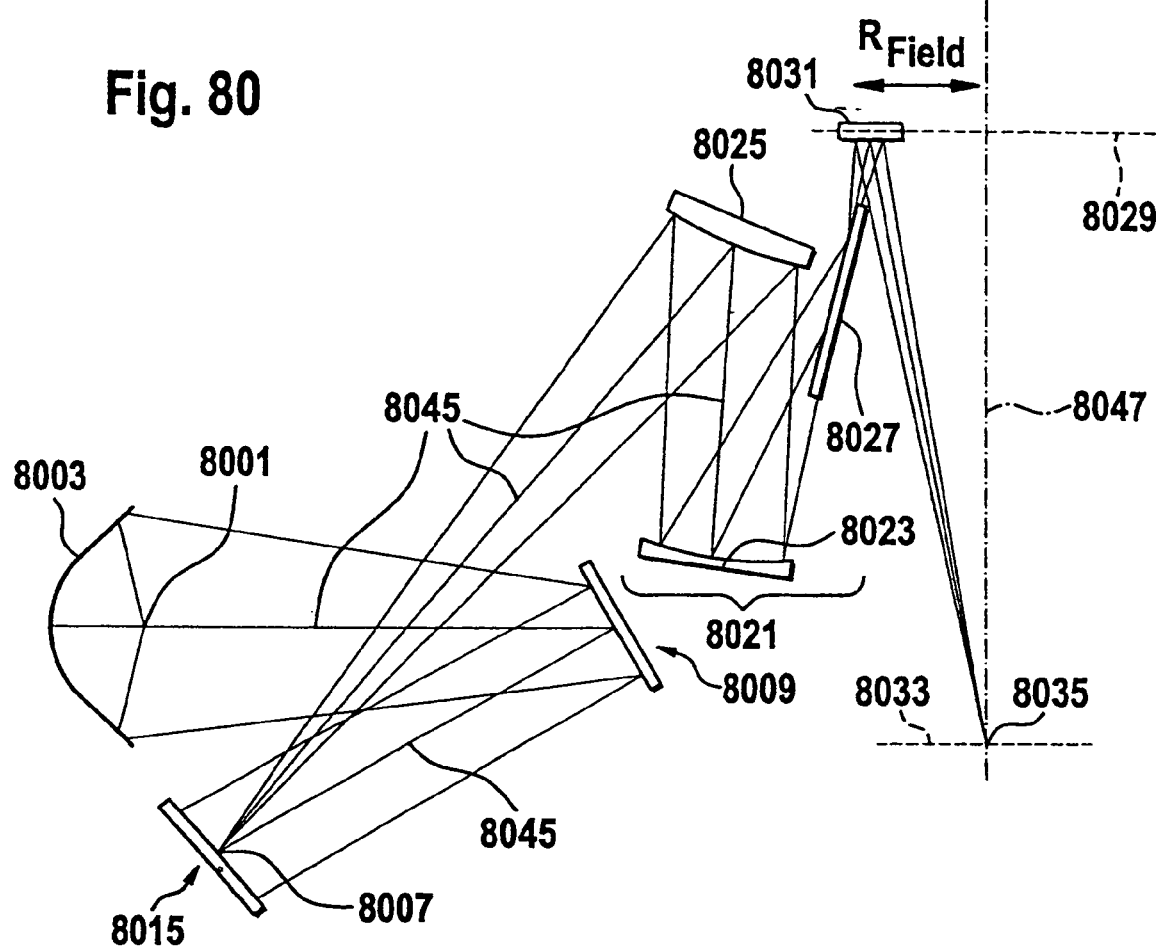
FIG. 80: A schematic view of a reflective embodiment with a crossing of the beam paths.

FIG. 80 shows another embodiment in a schematic view. Corresponding elements have the same reference numbers as those in FIG. 76 increased by 400. Therefore, the description to these elements is found in the description to FIG. 76. In this embodiment the beam path between the plate with the pupil raster elements 8015 and the field mirror 8025 is crossing the beam path from the collector mirror 8003 to the plate with the field raster elements 8009. With this arrangement it is possible to have light sources 8001 emitting a beam cone horizontally and to arrange the reticle horizontally in the image plane 8029 simultaneously.

Figure 81:
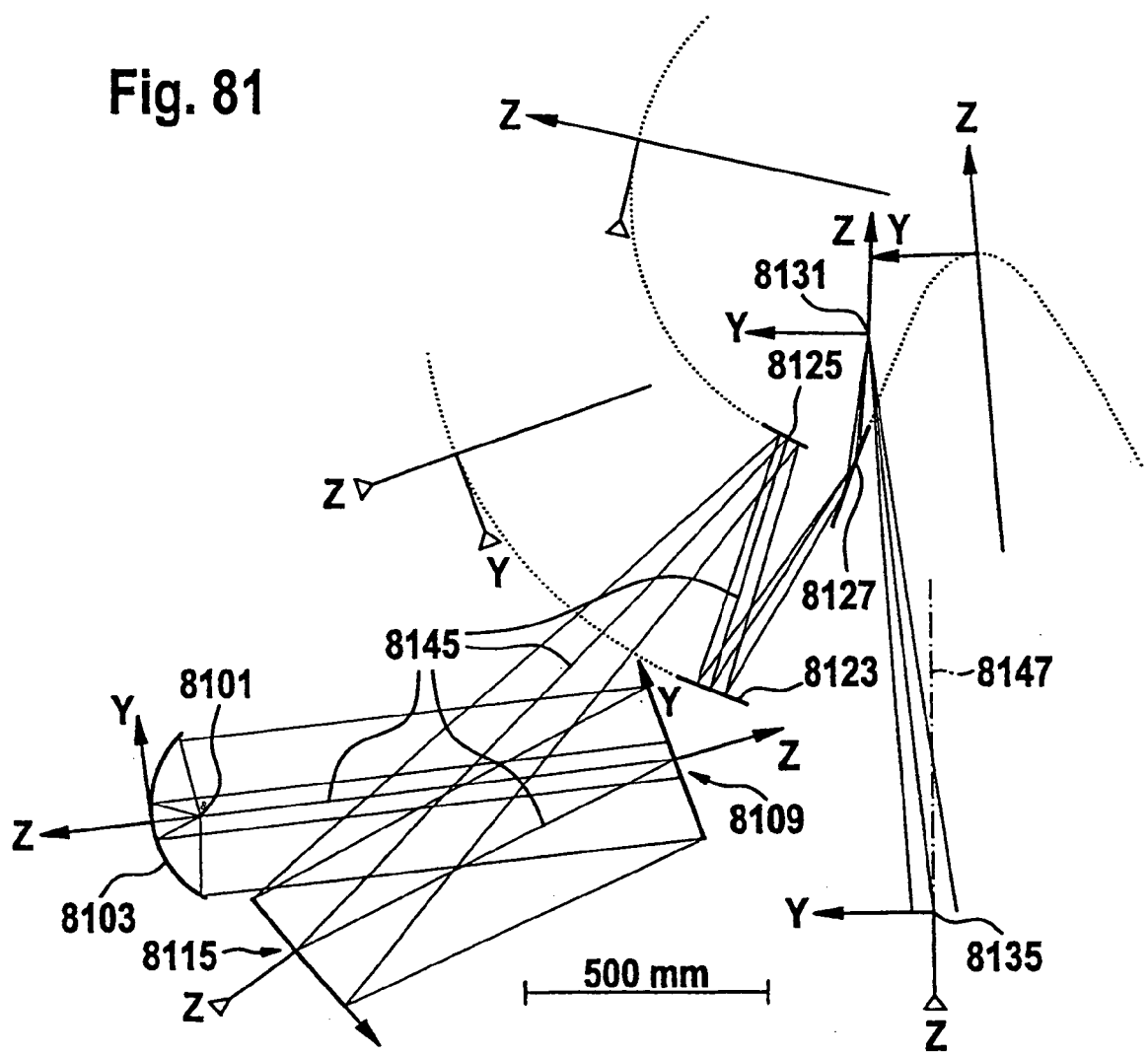
FIG. 81: A detailed view of the embodiment of FIG. 80.

FIG. 81 shows a similar embodiment to the one of FIG. 80 in a detailed view. Corresponding elements have the same reference numbers as those in FIG. 80 increased by 100. Therefore, the description to these elements is found in the description to FIG. 80. The definition of the local co-ordinate systems is the same as in FIG. 77. The positions of the local co-ordinate systems are given in table 4.

TABLE 4

Co-ordinate systems of vertices of mirrors

| | X [mm] | Y[mm] | Z[mm] | α [°] | β [°] | γ[°] |
|---|---|---|---|---|---|---|
| Light source 8101 | 0.0 | 0.0 | 0.0 | 0.0 | 0.0 | 0.0 |
| Collector mirror 8103 | 0.0 | 0.0 | 100.0 | 0.0 | 0.0 | 0.0 |
| Plate with field raster elements 8109 | 0.0 | 0.0 | −10.0 | 10.5 | 180.0 | 0.0 |
| Plate with pupil raster elements 8115 | 0.0 | −322.5 | −159.8 | 31.0 | 0.0 | 180.0 |
| Field mirror 8125 | 0.0 | 1395.9 | −1110.3 | −20.3 | 0.0 | 180.0 |
| Field mirror 8123 | 0.0 | 746.5 | −645.4 | 13.6 | 0.0 | 180.0 |
| Field mirror 8127 | 0.0 | 1053.2 | −1784.2 | 86.3 | 180.0 | 0.0 |
| Image plane 8131 | 0.0 | 906.0 | −1537.1 | 82.0 | 0.0 | 0.0 |
| Exit pupil 8135 | 0.0 | −413.5 | −1491.0 | 82.0 | 0.0 | 0.0 |

The surface data are given in table 5.

TABLE 5

Optical data of the components

| | Collector mirror 8103 | Field raster element 8109 | Pupil raster element 8115 | Field mirror 8125 | Field mirror 8123 | Field mirror 8127 |
|---|---|---|---|---|---|---|
| R [mm] | −200.00 | −1800.0 | −1279.7 | −588.9 | −957.1 | −65.5 |
| K | −1.0 | 0.0 | 0.0 | −0.0541 | −0.0330 | −1.1186 |
| Focal length f [mm] | — | 900.0 | 639.8 | −317.5 | 486.8 | −757.1 |

The light source 8101 in this embodiment is also a Laser Produced-Plasma source. The distance to the collector mirror 8103 is set to 100 mm.

The collector mirror 8103 is a parabolic mirror generating a parallel ray bundle, wherein the light source 8101 is arranged in the focal point of the parabola.

Therefore the field raster elements 8109 are concave mirrors to generate the secondary light sources at the corresponding pupil raster elements 8115. The focal length of the field raster elements 8109 is equal to the distance between the field raster elements 8109 and the corresponding pupil raster elements 8115. The distance between the vertex of the collector mirror 8103 and the center of the plate with the field raster elements 8109 is 1100 mm. The field raster elements 8109 are rectangular with a length $X_{FRE}$=46.0 mm and a width $Y_{FRE}$=2.8 mm. The arrangement of the field raster elements 8109 is shown in FIG. 73. The mean incident angle of the rays intersecting the field raster elements 8109 is 10.5°, the range of the incidence angles is from 8° up to 13°. Therefore the field raster elements 8109 are used at normal incidence.

The plate with the pupil raster elements 8115 is arranged in the focal plane of the field raster elements 8109. The pupil raster elements 8115 are concave mirrors. The arrangement of the pupil raster elements 8115 is similar to the arrangement shown in FIG. 74. The mean incidence angle of the rays intersecting the pupil raster elements 8115 is 10.0°, the range of the incidence angles is from 7° up to 13°. Therefore the pupil raster elements 8115 are used at normal incidence.

Between the plate with the pupil raster elements 8115 and the field mirror 8125 the beam path is crossing the beam path between the collector mirror 8103 and the plate with the field raster elements 8109.

The field mirror 8125 is a convex mirror. The distance between the center of the plate with the pupil raster elements 8115 and the center of the used area on the field mirror 8125 is 1550 mm. The mean incidence angle of the rays intersecting the field mirror 8125 is 13°, the range of the incidence angles is from 11° up to 15°. Therefore the field mirror 8125 is used at normal incidence.

The field mirror 8123 is a concave mirror. The distance between the center of the used area on the field mirror 8125 and the center of the used area on the field mirror 8123 is 600 mm. The mean incidence angle of the rays intersecting the field mirror 8123 is 7.5°, the range of the incidence angles is from 6° up to 9°. Therefore the field mirror 8123 is used at normal incidence.

The field mirror 8127 is a convex mirror. The distance between the center of the used area on the field mirror 8123 and the center of the used area on the field mirror 8127 is 600 mm. The mean incidence angle of the rays intersecting the field mirror 8127 is 78°, the range of the incidence angles is from 73° up to 82°. Therefore the field mirror 8127 is used at grazing incidence.

Figure 82:
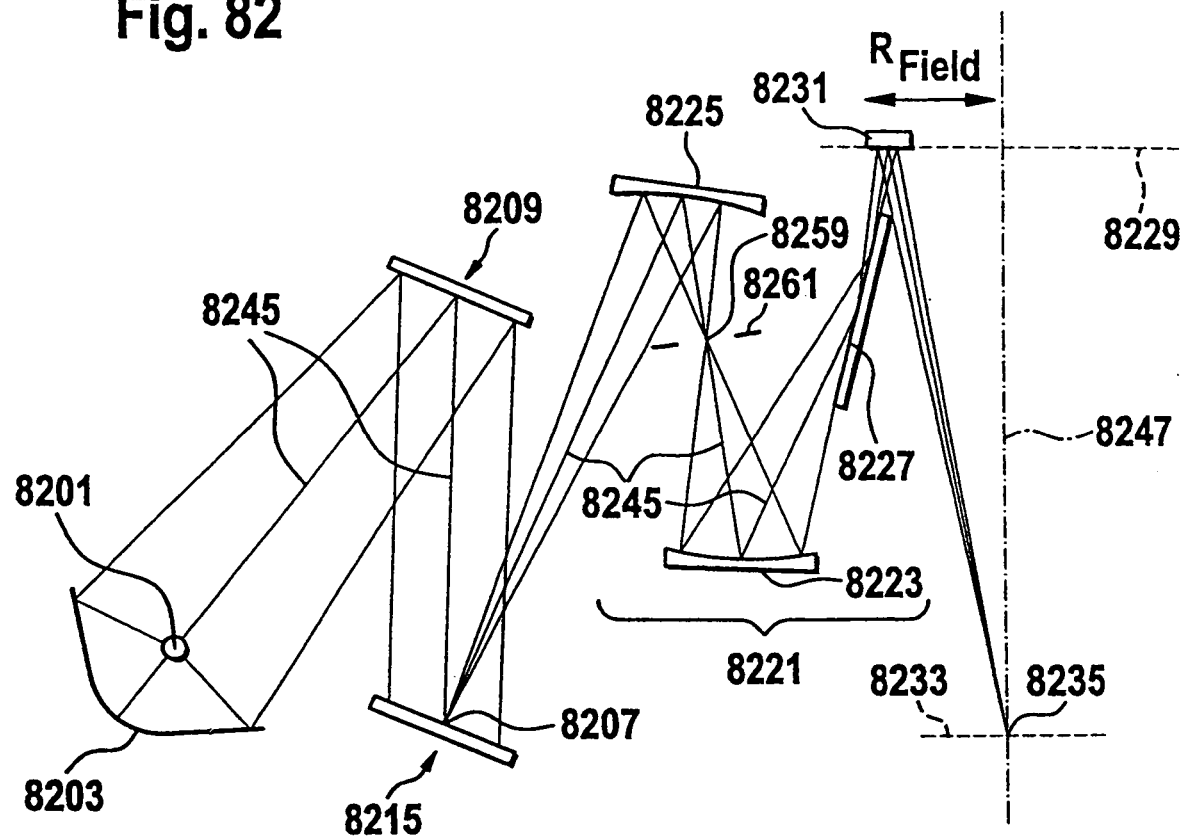
FIG. 82: A schematic view of a reflective embodiment with two pupil planes.

FIG. 82 shows another embodiment in a schematic view. Corresponding elements have the same reference numbers as those in FIG. 76 increased by 600. Therefore, the description to these elements is found in the description to FIG. 76. In this embodiment the field mirror 8225 and the field mirror 8223 are both concave mirrors forming an off-axis Gregorian telescope configuration. The field mirror 8225 images the secondary light sources 8207 in the plane between the field mirror 8225 and the field mirror 8223 forming tertiary light sources 8259. In FIG. 82 only the imaging of the central secondary light source 8207 is shown. At the plane with the tertiary light sources 8259 a masking unit 8261 is arranged to change the illumination mode of the exit pupil 8233. With stop blades it is possible to mask the tertiary light sources 8259 and therefore to change the illumination of the exit pupil 8233 of the illumination system. Possible stop blades has circular shapes or for example two or four circular openings. The field mirror 8223 and the field mirror 8227 image the tertiary light sources 8259 into the exit pupil 8233 of the illumination system forming quaternary light sources 8235.

Figure 83:
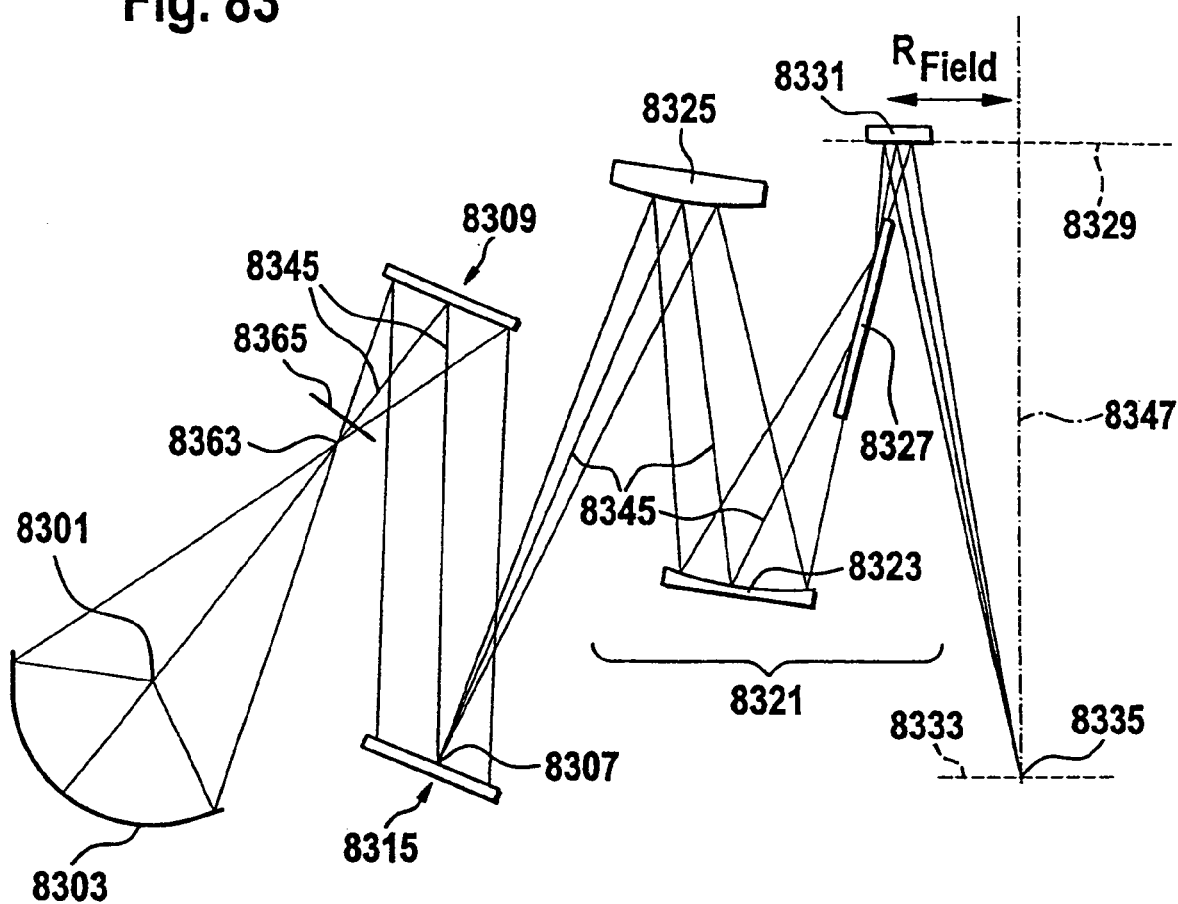
FIG. 83: A schematic view of a reflective embodiment with an intermediate image of the light source.

FIG. 83 shows another embodiment in a schematic view. Corresponding elements have the same reference numbers as those in FIG. 82 increased by 100. Therefore, the description to these elements is found in the description to FIG. 82. In this embodiment the collector mirror 8303 is designed to generate an intermediate image 8361 of the light source 8301 in front of the plate with the field raster elements 8309. Nearby this intermediate image 8363 a transmission plate 8363 is arranged. The distance between the intermediate image 8361 and the transmission plate 8363 is so large that the plate 8363 will not be destroyed by the high intensity near the intermediate focus. The distance is limited by the maximum diameter of the transmission plate 8363 which is in the order of 200 mm. The maximum diameter is determined by the possibility to manufacture a plate being transparent at EUV. The transmission plate 8363 can also be used as a spectral purity filter to select the used wavelength range. Instead of the absorptive transmission plate 8363 also a reflective grating filter can be used. The plate with the field raster elements 8309 is illuminated with a diverging ray bundle. Since the tilt angles of the field raster elements 8309 are adjusted according to a collecting surface the diverging beam path can be transformed to a nearly parallel one. Additionally, the field raster elements 8309 are tilted to deflect the incoming ray bundles to the corresponding pupil raster elements 8315.

Figure 84:
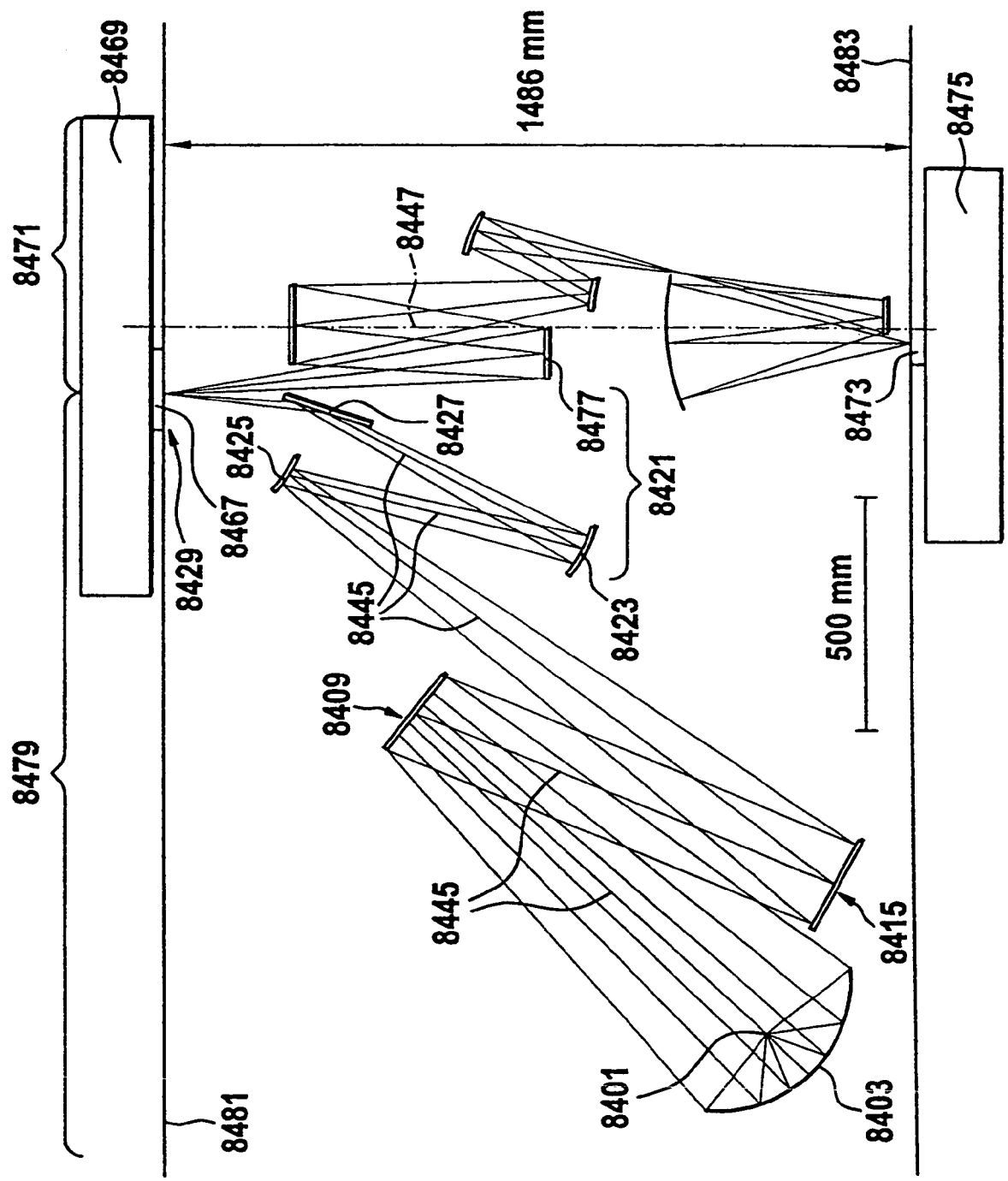
FIG. 84: A detailed view of a projection exposure apparatus.

FIG. 84 shows an EUV projection exposure apparatus in a detailed view. The illumination system is the same as shown in detail in FIG. 77. Corresponding elements have the same reference numbers as those in FIG. 77 increased by 700. Therefore, the description to these elements is found in the description to FIG. 77. In the image plane 8429 of the illumination system the reticle 8467 is arranged. The reticle 8467 is positioned by a support system 8469. The projection objective 8471 having six mirrors images the reticle 8467 onto the wafer 8473 which is also positioned by a support system 8475. The mirrors of the projection objective 8471 are centered on a common straight optical axis 8447. The arc-shaped object field is arranged off-axis. The direction of the beam path between the reticle 8467 and the first mirror 8477 of the projection objective 8471 is convergent to the optical axis 8447 of the projection objective 8471. The angles of the chief rays 8479 with respect to the normal of the reticle 8467 are between 5° and 7°. As shown in FIG. 80 the illumination system 8479 is well separated from the projection objective 8471. The illumination and the projection beam path interfere only nearby the reticle 8467. The beam path of the illumination system is folded with reflection angles lower than 25° or higher than 75° in such a way that the components of the illumination system are arranged between the plane 8481 with the reticle 8467 and the plane 8383 with the wafer 8473.

In FIGS. 85 to 93 preferred embodiments of the invention of a projection exposure apparatus with high transmission are shown. All systems comprise a projection objective with an optical axis and a plurality of principle rays or so called chief rays impinging onto the reticle in a direction from the primary light source toward the reticle. According to the invention the chief rays are inclined away from the optical axis. The entrance pupil of the projection objective of the projection exposure apparatus shown in FIGS. 85 to 93 is situated in the light path of light traveling form the primary light source toward the reticle before the reticle.

Figure 85:
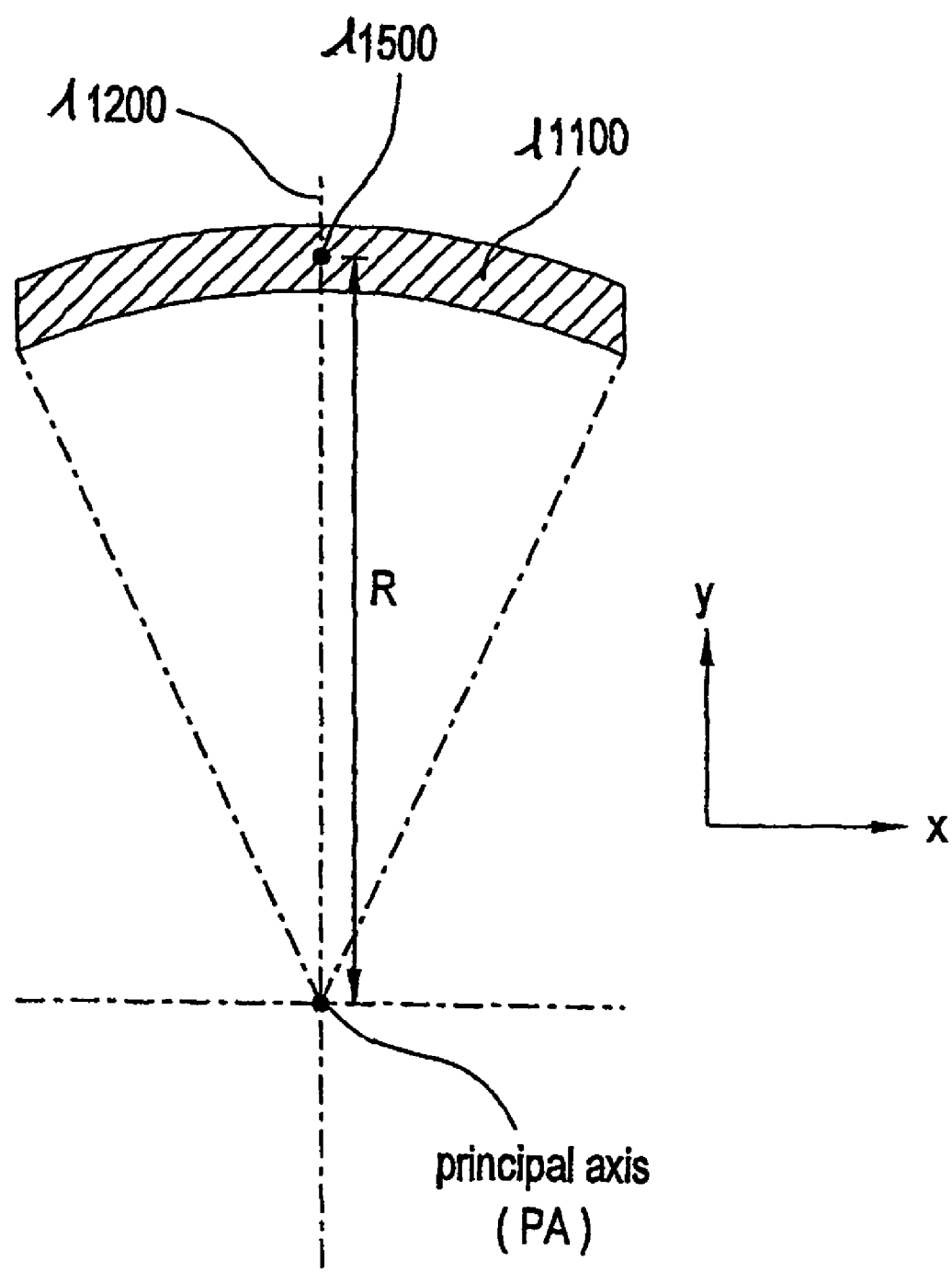
FIG. 85 illustrates the ring field in the object plane of the objective.

In FIG. 85 the object field 11100 of the projection exposure apparatus in the image plane of the projection objective according to the invention is shown. An object in the image plane is imaged by means of the projection objective onto a light sensitive substrate, for example a wafer with a light sensitive material arranged in the image plane of the projection objective. The image field in the image plane has the same shape as the object field in the object plane but with the reduced size according to the magnification ratio. The object or the image field 11100 has the configuration of a segment of a ring field, and the ring field has an axis of symmetry 11200.

In addition, the x-axis and the y-axis are depicted. As can be seen from FIG. 85, the axis of symmetry 11200 of the ring field runs in the direction of the y-axis. The y-axis coincides with the scanning direction of a projection exposure apparatus, which is designed as a ring field scanner. The x-direction is thus the direction that is perpendicular to the scanning direction, within the object plane. The ring field has a so-called ring field radius R, which is defined by the distance of the central field point 11500 of the object field from the principal axis (PA) of the projection objective. The arc-shaped field in the image plane as well as in the object plane has an arc-shaped field width W, which is the extension of the field in scanning or y-direction and a secant length SL.

In FIGS. 86, 87, 88 and 89 arrangements of the six-mirror projection objectives according to the invention are shown.

In all embodiments described below the same reference numbers will be used for the same components and the following nomenclature will be employed:

First mirror (S1), second mirror (S2), third mirror (S3), fourth mirror (S4), fifth mirror (S5), and sixth mirror (S6).

All embodiments shown in FIG. 86 to 89 depict a six-mirror projection objective with a ray path from the object plane 10002 of the projection objective, i.e. reticle plane to the image plane 10004 of the projection objective, i.e. wafer plane and a first mirror S1, a second mirror S2, a third mirror S3, a fourth mirror S4, a fifth mirror S5 and a sixth mirror S6. All embodiments shown in FIGS. 86 to 89 are divided into a first subsystem and a second subsystem. The first subsystem is a four-mirror system formed from S1, S2, S3 and S4. This first subsystem provides and produces a real, reduced image of the object in the object plane as the intermediate image, Z. Lastly, the two-mirror system S5, S6 images the intermediate image Z in the wafer plane 10004 while maintaining the requirements of telecentricity. The aberrations of the four-mirror and two-mirror subsystems are balanced against one another so that the total system has a high optical quality sufficient for integrated circuit fabrication applications.

Furthermore according to the inventive concept all embodiments of projection objectives shown in FIGS. 86 to 89 comprises an optical axis, which is also denoted as principal axis (PA). According to the inventive concept the plurality of chief rays, when impinging a pattern bearing mask situated in the image plane 10002 of the projection objective are inclined away from the optical axis or the so called principal axis (PA) of the projection objective.

By inclining the chief rays away from the optical axis it is possible to design projection objectives with long drift sections and therefore low angles of incidence onto the mask and each of the six mirrors S1–S6. In this application drift section means the optical distance between the vertices of two successive mirrors. The optical distance is the distance in the light path from a mirror to a successive mirror, e.g. from the forth mirror to the fifth mirror.

The chief rays are defined as follows:

From each point of a field in the object plane of the projection objective a light bundle is emerging. Each light bundle consists of a plurality of rays. The chief ray (CR) of a light bundle is the ray out of the plurality of rays of the light bundle which intersect the optical axis of the projection objective in the plane, where the aperture stop of the projection objective is situated.

Figure 86:
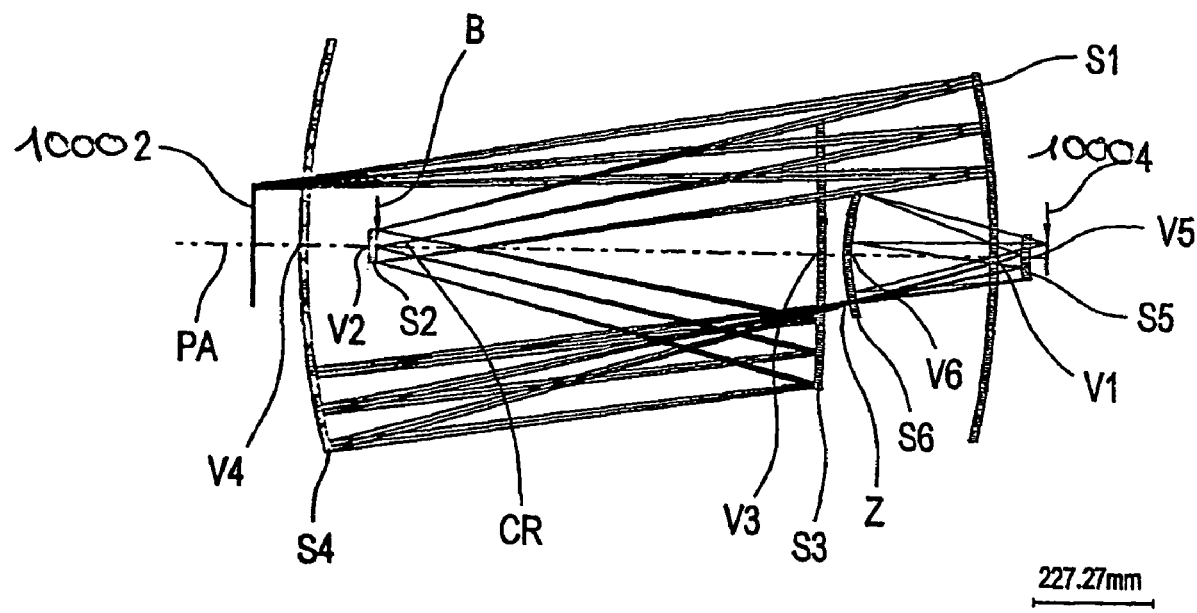
FIG. 86 illustrates an embodiment of the invention with an intermediate image, a freely accessible aperture stop on the second mirror and the first mirror situated between the sixth mirror and the image plane, i.e. the wafer plane.
Figure 87:
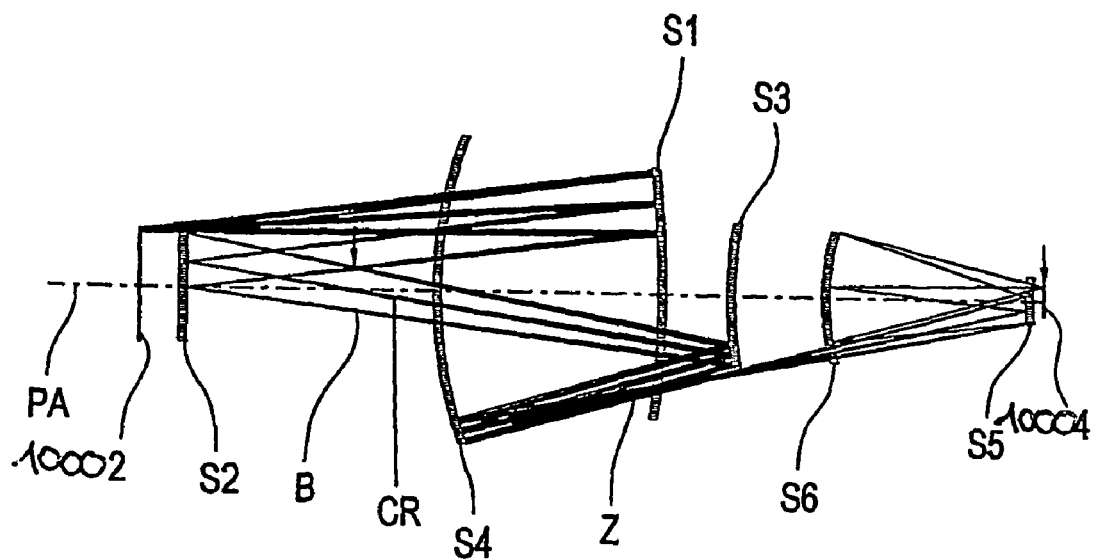
FIG. 87 illustrates a second embodiment of the invention with an aperture stop between the second and the third mirror.
Figure 88:
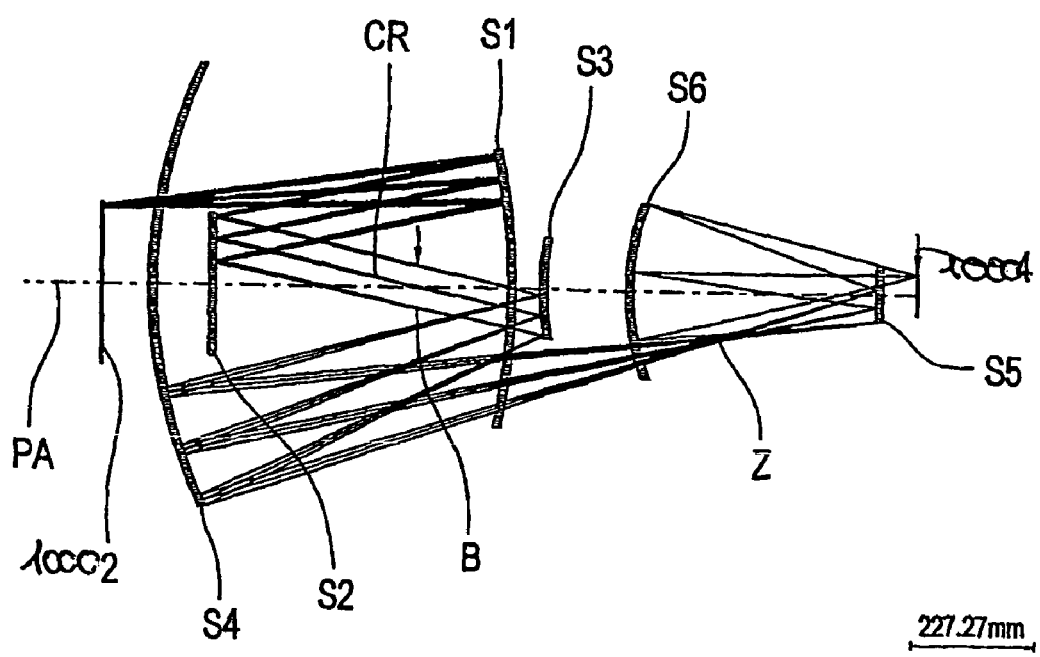
FIG. 88 illustrates a third embodiment of the invention with an aperture stop between the second and the third mirror.
Figure 89:
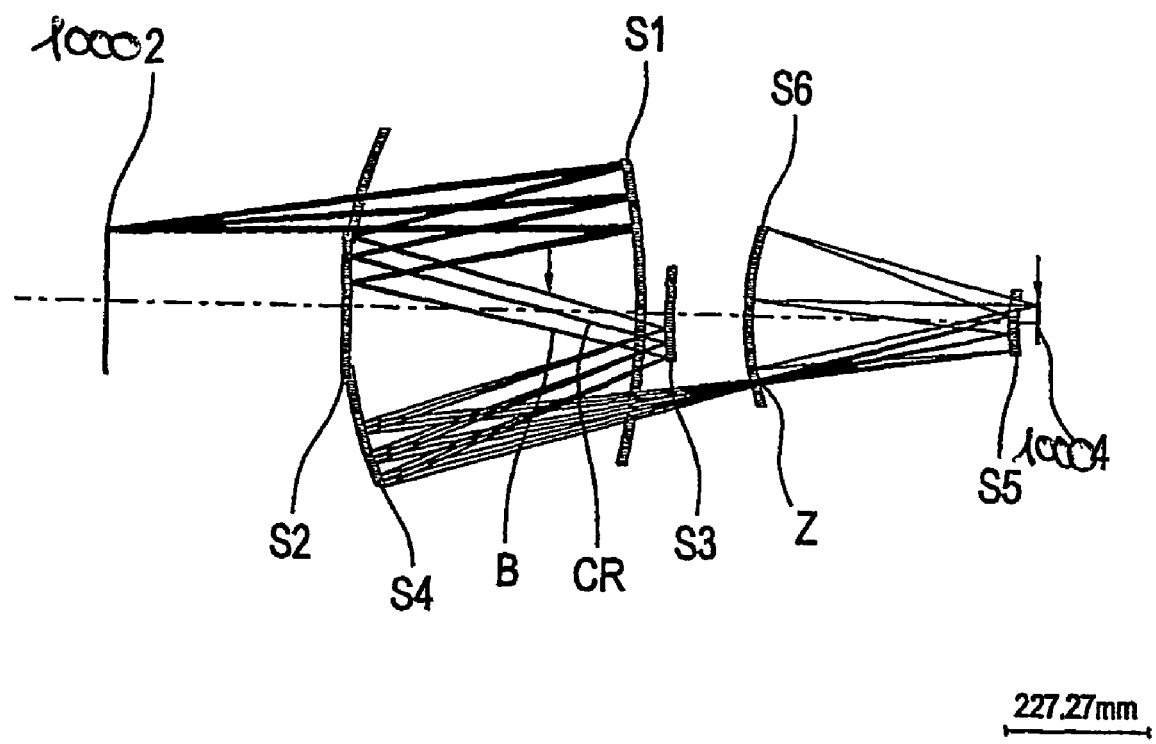
FIG. 89 illustrates a forth embodiment of the invention with an aperture stop between the second and the third mirror.

In the embodiments shown in FIGS. 87 to 89 in this application the angles $\alpha$ of the chief rays with respect to the principle axis (PA) of the projection objective are lower than 6°. In the embodiment shown in FIG. 86 the angle $\alpha$ is lower than 7°. As pointed out above a chief ray (CR) is associated to each field points of the object field shown e.g. in FIG. 85 in the object plane.

In the embodiment shown in FIG. 86 the physical aperture stop B is arranged on the second mirror S2. As is clear from FIG. 86, the aperture stop is accessible. In the embodiment shown in FIG. 86 the vertex V1 of the first mirror S1 is situated near the image plane 10004. This provides for a long drift section between the mask and the first mirror and between the first mirror S1 and the second mirror S2 and therefore for low angles of incidence of the rays impinging onto the mask and mirror S1 and S2. The aperture stop B is positioned in this embodiment on or near the vertex V2 of the second mirror. It would also be possible in a slight different design with long drift sections between the mask and the first mirror and between the first and the second mirror to position the aperture freely accessible between two adjacent mirrors, e.g. between the first mirror S1 and the second mirror S2.

Furthermore in the embodiment shown in FIG. 86, due to the fact that the chief rays are inclined away from the optical axis, the first mirror S1 of the projection objective can physically situated between the sixth mirror S6 and the image plane 10004. In the image plane a light sensitive substrate e.g. a wafer is situated. This provides for a compact size of the projection objective and low angles of incidence of the rays impinging on each mirror S1–S6 and therefore low optical errors. Especially the coating induced phase errors depend on the angle of incidence and can be minimized by such a design. The Code-V-data of the embodiment shown in FIG. 86 are given in table 6 below. Object defines the object plane 10002, where the reticle is situated, image defines the image plane 10004, where the light sensitive substrate, e.g. the wafer is situated. S1, S2, S3, S4, S5 and S6 define the first, second, third, fourth, fifth and sixth mirror.

TABLE 6

Code-V-Data of the projection objective shown in FIG. 86

FABRICATION DATA EMBODIMENT 1

| ELEMENT NUMBER | RADIUS OF CURVATURE | | THICKNESS | APERTURE DIAMETER | | GLASS |
| --- | --- | --- | --- | --- | --- | --- |
| | FRONT | BACK | | FRONT | BACK | |
| OBJECT (2) | | INF | 1396.5017 | | | |
| S1 | | A(1) | −1170.3641 | 705.7225 | | REFL |
| | | | APERTURE STOP | 64.1426 | | |
| S2 | | A(2) | 837.6198 | 64.1426 | | REFL |
| S3 | | A(3) | −963.7575 | 513.0182 | | REFL |

TABLE 6-continued

Code-V-Data of the projection objective shown in FIG. 86

| | | | | |
|---|---|---|---|---|
| S4 | A(4) | 1354.7701 | 790.6662 | REFL |
| S5 | A(5) | −327.0644 | 86.8324 | REFL |
| S6 | A(6) | 372.2945 | 240.1229 | REFL |
| IMAGE (4) | INF | | 57.9931 | |

ASPHERIC CONSTANTS $$Z = \frac{(CURV)Y^2}{1 + (1 - (1 + K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A(1) | −0.00062748 | 0.171026 | −1.73906E−12 | −1.67851E−18 | 2.28421E−24 | 0.00000E+00 |
| A(2) | −0.00133824 | −24.133656 | −1.02827E−09 | 5.10691E−13 | 1.19907E−17 | 0.00000E+00 |
| A(3) | −0.00022204 | 0.650971 | 1.04318E−11 | −2.06095E−17 | −4.08112E−23 | 0.00000E+00 |
| A(4) | 0.00056719 | −2.109443 | 4.48929E−11 | −1.62499E−18 | −4.53112E−24 | 0.00000E+00 |
| A(5) | 0.00245960 | 6.781115 | 1.30078E−08 | 2.84329E−13 | 5.20719E−18 | 0.00000E+00 |
| A(6) | 0.00243994 | 0.079158 | −4.22448E−11 | −2.56743E−16 | −1.16308E−21 | 0.00000E+00 |

REFERENCE WAVELENGTH = 13.5 NM

In FIGS. 87 to 89 further embodiments of the invention are shown. The data of the second embodiment, the third and the fourth embodiment are given in tables 7 to 9.

In all embodiments the aperture stop B is situated freely accessible between the second mirror S2 and the third mirror S3.

Since in these embodiments, the aperture stop is positioned between two adjacent mirrors, the aperture stop is passed only once by a light bundle traveling from the image plane to the object plane. By passing the aperture stop only once vignetting effects can be avoided. Furthermore the aperture stop B can be placed at various locations between the second and the third mirror and therefore an easy correction of telecentricity errors—in first place—and coma and astigmatism—in second place is possible. All designs shown in FIG. 87 to 89 comprise an intermediate image Z. The optical data in Code-V-Format are given in the tables 7 to 9 below. All abbreviations are identical to the abbreviations in table 6.

TABLE 7

Code-V-Data of the projection objective shown in FIG. 87

FABRICATION DATA
embodiment 2

| ELEMENT NUMBER | RADIUS OF CURVATURE | | THICKNESS | APERTURE DIAMETER | | GLASS |
|---|---|---|---|---|---|---|
| | FRONT | BACK | | FRONT | BACK | |
| OBJECT (2) | | INF | 1143.4297 | | | |
| S1 | | A(1) | −1036.0333 | 561.5769 | | REFL |
| S2 | | A(2) | 359.9999 | 240.9754 | | REFL |
| | | | APERTURE STOP | 97.0949 | | |
| | | | 826.3020 | | | |
| S3 | | A(3) | −621.8137 | 322.9857 | | REFL |
| S4 | | A(4) | 1283.1154 | 685.3271 | | REFL |
| S5 | | A(5) | −437.4949 | 105.0990 | | REFL |
| S6 | | A(6) | 482.4979 | 285.4057 | | REFL |
| IMAGE (4) | | INF | | 60.300 | | |

ASPHERIC CONSTANTS $$Z = \frac{(CURV)Y^2}{1 + (1 - (1 + K)(CURV)^2 Y^2)^{1/2}} + (A)Y^4 + (B)Y^6 + (C)Y^8 + (D)Y^{10} +$$
$$E(Y)^{12} + (F)Y^{14} + (G)Y^{16} + (H)Y^{18} + (J)Y^{20}$$

| ASPHERIC | CURV | K<br>E | A<br>F | B<br>G | C<br>H | D<br>J |
|---|---|---|---|---|---|---|
| A(1) | −0.00051437 | 0.464962 | 0.00000E+00 | −4.35625E−18 | 3.71136E−22 | −3.22233E−27 |
| | | 9.41337E−33 | 0.00000E+00 | 0.00000E+00 | 0.00000E+00 | 0.00000E+00 |
| A(2) | 0.00017427 | −190.443068 | 0.00000E+00 | 3.66729E−15 | −3.13378E−20 | −1.96585E−24 |
| | | 5.89234E−29 | 0.00000E+00 | 0.00000E+00 | 0.00000E+00 | 0.00000E+00 |
| A(3) | 0.00053383 | −5.242564 | 0.00000E+00 | 1.64106E−15 | −1.53623E−19 | 4.47821E−24 |
| | | −4.80207E−29 | 0.00000E+00 | 0.00000E+00 | 0.00000E+00 | 0.00000E+00 |

TABLE 7-continued

Code-V-Data of the projection objective shown in FIG. 87

| A(4) | 0.00088762 | −7.499204 | 0.00000E+00 | 7.26472E−15 | −6.24628E−20 | 2.61175E−25 |
|---|---|---|---|---|---|---|
|  |  | −4.46058E−31 | 0.00000E+00 | 0.00000E+00 | 0.00000E+00 | 0.00000E+00 |
| A(5) | 0.00281542 | 4.169635 | 0.00000E+00 | 3.15997E−13 | −3.88133E−18 | −4.96691E−21 |
|  |  | 7.55988E−25 | 0.00000E+00 | 0.00000E+00 | 0.00000E+00 | 0.00000E+00 |
| A(6) | 0.00189328 | 0.076240 | 0.00000E+00 | 3.91452E−17 | 2.30220E−23 | 1.27830E−26 |
|  |  | −2.38044E−31 | 0.00000E+00 | 0.00000E+00 | 0.00000E+00 | 0.00000E+00 |

REFERENCE WAVELENGTH = 13.5 NM

TABLE 8

Code-V-Data of the projection objective shown in FIG. 88

FABRICATION DATA
Ausfuehrungsbeispiel 3

| ELEMENT | RADIUS OF CURVATURE | | | APERTURE DIAMETER | | |
|---|---|---|---|---|---|---|
| NUMBER | FRONT | BACK | THICKNESS | FRONT | BACK | GLASS |
| OBJECT (2) |  | INF | 741.9427 |  |  |  |
| S1 |  | A(1) | −533.4845 |  | 514.4304 | REFL |
| S2 |  | A(2) | 373.5569 |  | 265.2339 | REFL |
|  |  | APERTURE STOP | 224.1681 |  | 80.7160 |  |
| S3 |  | A(3) | −706.1812 |  | 187.8816 | REFL |
| S4 |  | A(4) | 1320.3644 |  | 830.6647 | REFL |
| S5 |  | A(5) | −440.1491 |  | 103.3707 | REFL |
| S6 |  | A(6) | 519.7826 |  | 325.8298 | REFL |
| IMAGE (4) |  | INF |  |  | 73.9287 |  |

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A(1) | −0.00076109 | −0.171405 | 0.00000E+00 | −4.23454E−17 | 6.78680E−22 | −2.99192E−27 |
| A(2) | −0.00000118 | −0.111585e16 | 0.00000E+00 | 3.97811E−15 | −1.96601E−20 | −2.54386E−25 |
| A(3) | 0.00144569 | −12.606347 | 0.00000E+00 | −6.81389E−15 | 4.58606E−21 | 2.31258E−24 |
| A(4) | 0.00094708 | −0.078794 | 0.00000E+00 | −3.00284E−18 | −1.57146E−24 | −1.91632E−29 |
| A(5) | 0.00205402 | 4.870848 | 0.00000E+00 | 1.14865E−13 | 4.55264E−18 | −9.92375E−22 |
| A(6) | 0.00183614 | 0.010678 | 0.00000E+00 | 1.16557E−17 | 1.91309E−22 | 3.48456E−27 |

REFERENCE WAVELENGTH = 13.5 NM

TABLE 9

Code-V-Data of the projection objective shown in FIG. 89

FABRICATION DATA
Ausfuehrungsbeispiel 4

| ELEMENT | RADIUS OF CURVATURE | | | APERTURE DIAMETER | | |
|---|---|---|---|---|---|---|
| NUMBER | FRONT | BACK | THICKNESS | FRONT | BACK | GLASS |
| OBJECT (2) |  | INF | 856.2378 |  |  |  |
| 1 |  | A(1) | −456.2375 |  | 500.8640 | REFL |
| 2 |  | A(2) | 312.2073 |  | 248.1088 | REFL |
|  |  | APERTURE STOP | 190.9596 |  | 62.1635 |  |
| 3 |  | A(3) | −503.1669 |  | 153.8216 | REFL |
| 4 |  | A(4) | 1068.8065 |  | 585.2679 | REFL |
| 5 |  | A(5) | −420.8994 |  | 95.4840 | REFL |
| 6 |  | A(6) | 465.8994 |  | 292.7587 | REFL |
| IMAGE (4) |  | INF |  |  | 61.9117 |  |

TABLE 9-continued

Code-V-Data of the projection objective shown in FIG. 89

ASPHERIC CONSTANTS $$Z = \frac{(CURV)Y^2}{1 + (1 - (1 + K)(CURV)^2 Y^2)^{1/2}} + (A)Y^4 + (B)Y^6 + (C)Y^8 + (D)Y^{10}$$

| ASPHERIC | CURV | K | A | B | C | D |
| --- | --- | --- | --- | --- | --- | --- |
| A(1) | −0.00087558 | −0.189347 | 0.00000E+00 | 1.19748E−16 | 8.21804E−22 | −3.13284E−27 |
| A(2) | −0.00000116 | −0.111585e16 | 0.00000E+00 | 9.04554E−15 | −6.40466E−20 | −4.02299E−25 |
| A(3) | 0.00156020 | −17.497130 | 0.00000E+00 | −3.14252E−14 | 3.01827E−19 | 2.84279E−24 |
| A(4) | 0.00123789 | −0.140200 | 0.00000E+00 | −4.10945E−17 | 1.03708E−22 | −1.54546E−27 |
| A(5) | 0.00244759 | 4.410893 | 0.00000E+00 | 1.70842E−13 | 8.50330E−18 | −1.46120E−21 |
| A(6) | 0.00196948 | 0.035705 | 0.00000E+00 | 1.21906E−16 | 3.41718E−22 | 4.21993E−27 |

REFERENCE WAVELENGTH = 13.5 NM

Figure 90A:
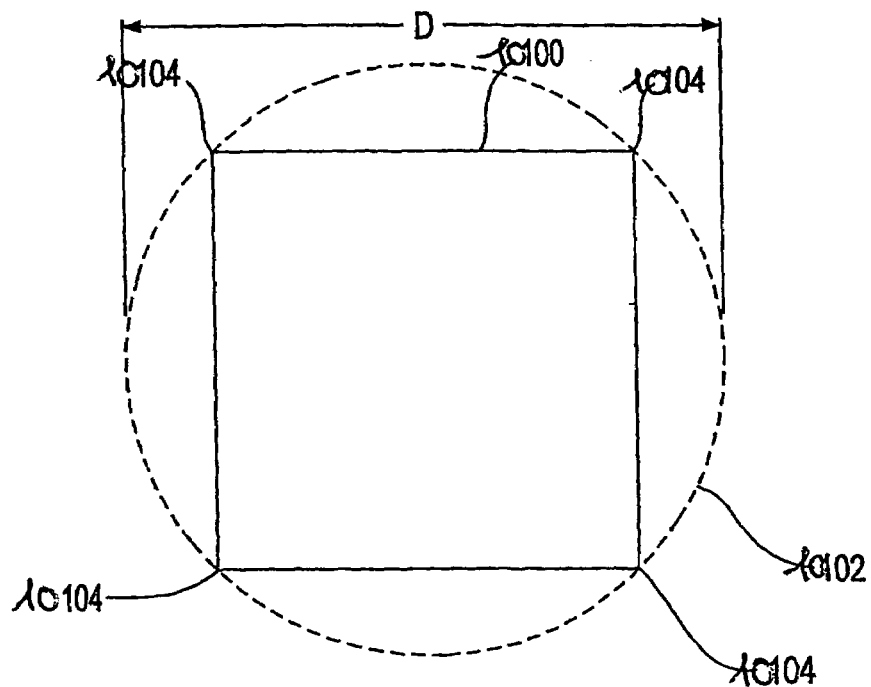
FIGS. 90A and 90B show the used diameter for different physical mirror surfaces or used areas of a mirror.
Figure 90B:
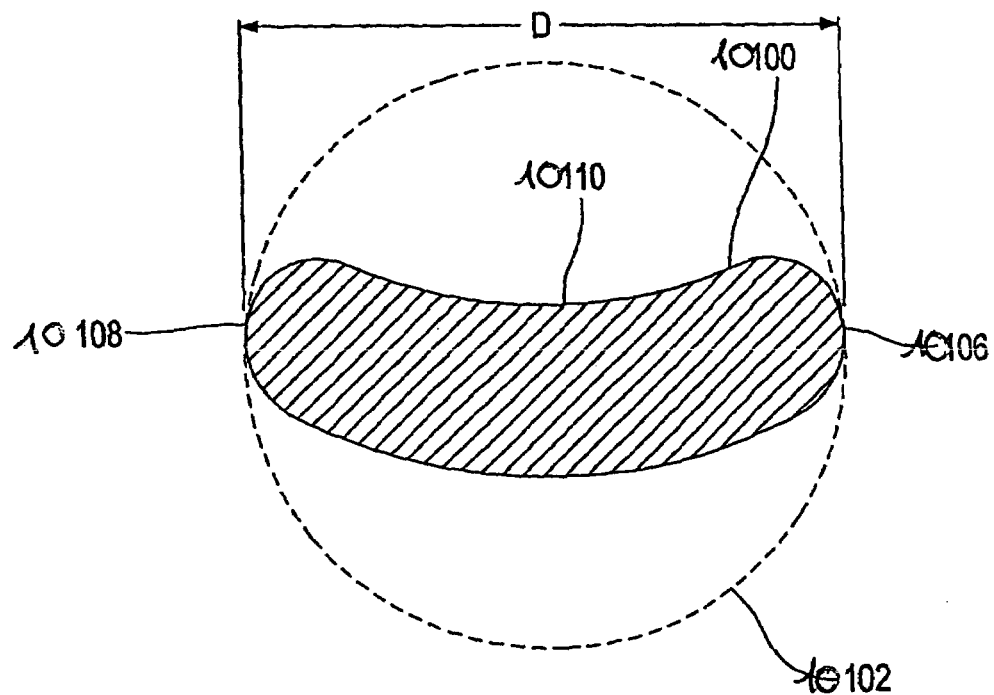

FIGS. 90a and 90b define the used diameter D as used in the description of the above embodiments. As a first example, the illuminated field 10100 on a mirror in FIG. 90a is a rectangular field. The illuminated field corresponds to the area on a mirror onto which a bundle of light rays running through the objective from the image plane 10002 to the object plane 10004 impinge. The used diameter D according to FIG. 90a is then the diameter of the envelope circle 10102, which encompasses the rectangle 10100, where the corners 10104 of the rectangle 10100 lie on the envelope circle 10102. A more realistic example is shown in FIG. 90b. The illuminated field 10100 has a kidney shape, which is expected for the physical mirror surfaces of the mirrors S1–S6 or the so-called used areas of the mirrors S1–S6, when the field in the image plane as well as the field in the object plane is an arc-shaped field as depicted in FIG. 85. The envelope circle 10102 encompasses the kidney shape fully and it coincides with the edge 10110 of the kidney shape at two points, 10106, 10108. The used diameter D of the physical mirror surface or the used area of the mirrors S1–S6 is then given by the diameter of the envelope circle 10102.

Figure 92:
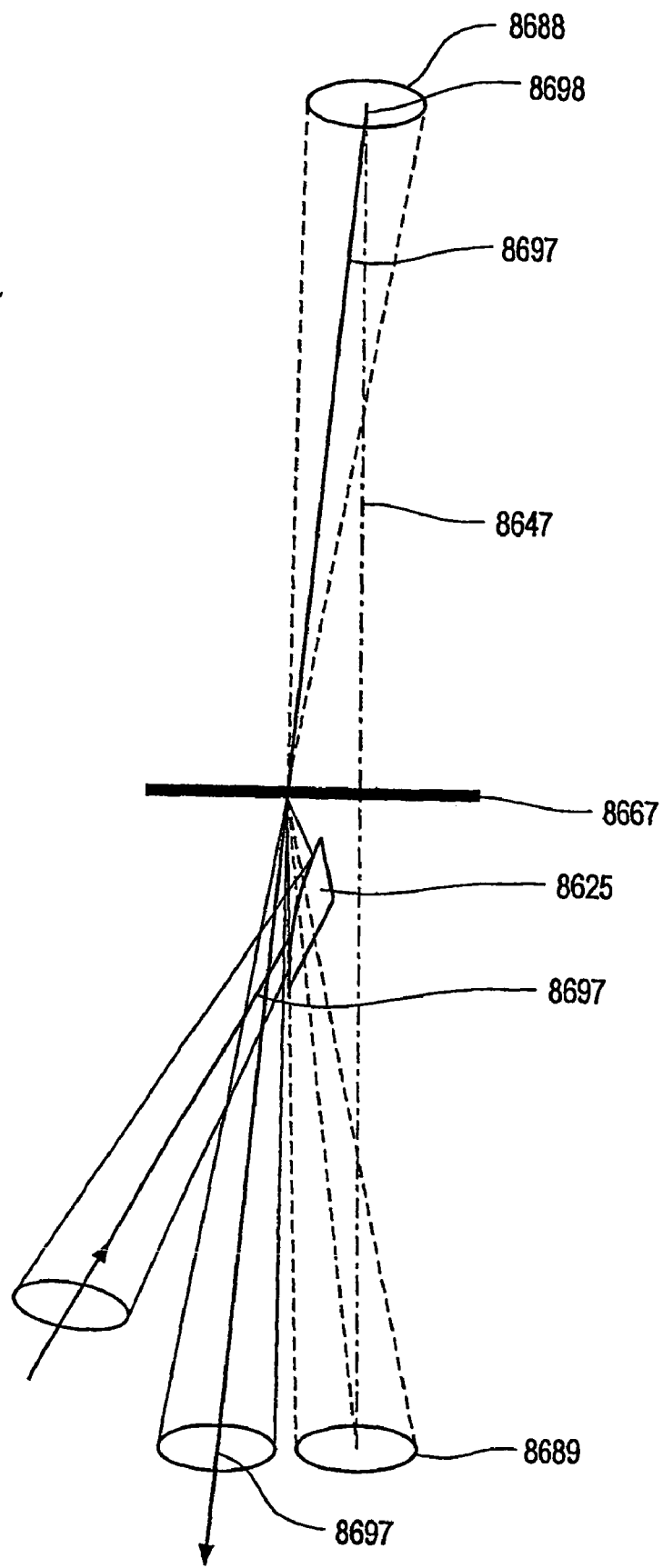
FIG. 92 construction of the entrance pupil of the system according to FIG. 91
Figure 93:
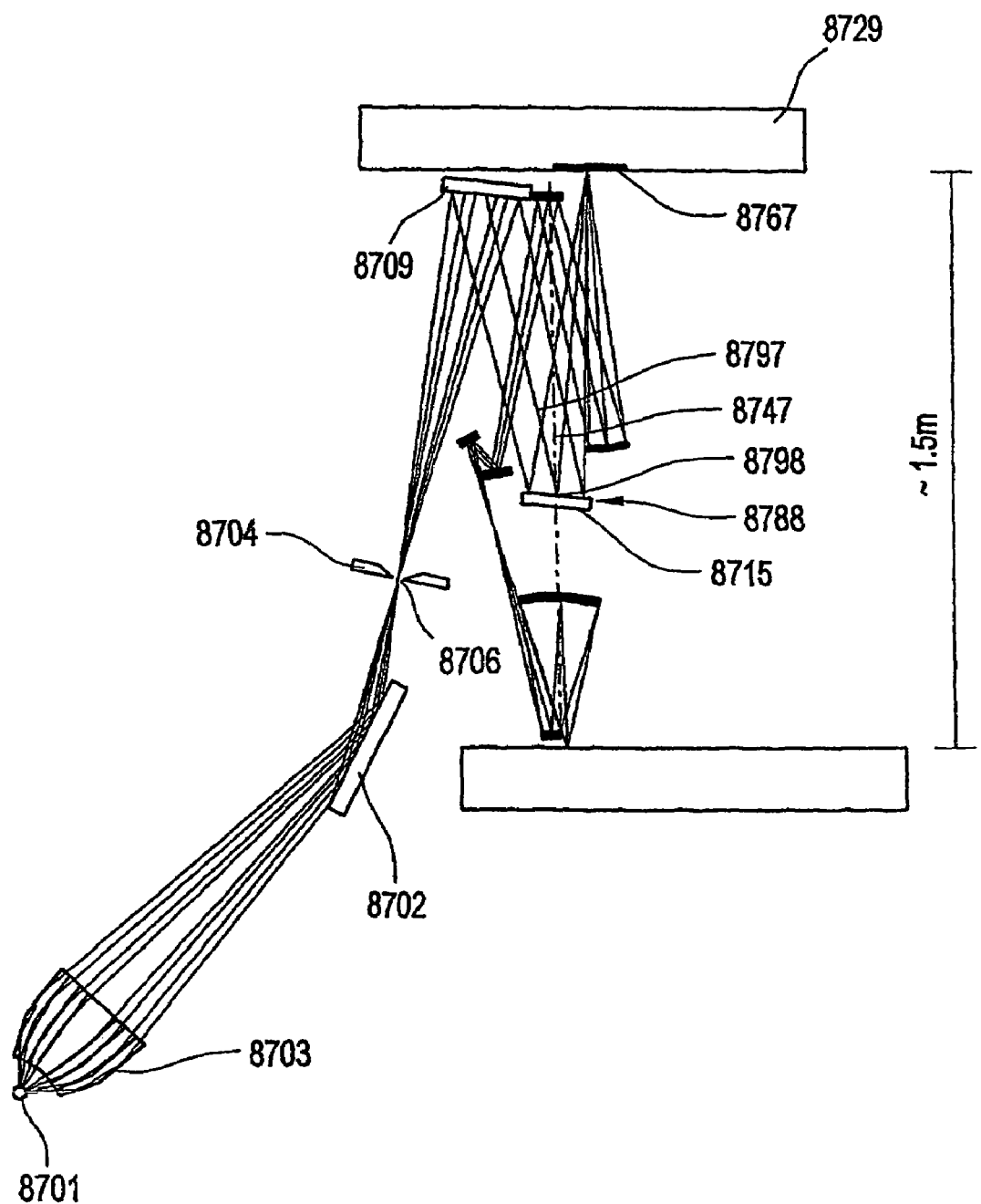
FIG. 93 construction of a second embodiment of a projection exposure apparatus with a inventive projection exposure objective.

In FIGS. 91 to 93 preferred embodiments of the invention of a projection exposure apparatus with high transmission and inventive projection objective are shown. All systems comprise a projection objective with an optical axis and a plurality of principle rays or so-called chief rays impinging onto the reticle in a direction from the primary light source toward the reticle. According to the invention the chief rays are inclined away from the optical axis when reflected. The entrance pupil of the projection objective of the projection exposure apparatus shown in FIGS. 91 to 93 is then situated in the light path of light travelling from the primary light source toward the reticle before the reticle.

In FIG. 91 a first embodiment of an inventive projection exposure apparatus is shown.

The first embodiment comprises a primary light source 8501 and a collecting optical element a so-called collector 8503. The collector 8503 is a nested grazing incidence collector as shown, for example, in WO 02/27400 A2. The radiation is spectral filtered by grating element 8502 together with aperture stop 8504. The grating element diffracts the light impinging onto the grating element in different diffraction orders, e.g. the −1.diffration order. The aperture stop 8504 is situated in or nearby an intermediate image 8506 of the primary light source in the −1.diffration order. The projection exposure apparatus further comprises a first optical component having a first optical element with first or so-called field raster elements 8509 and a second optical element with second or so-called pupil raster elements 8515. The first optical element comprising field raster elements decomposes the light bundle impinging from the direction of the primary light source 8501 onto the plate with field raster elements 8509 in a plurality of light bundles. Each light bundle is focused and forms a secondary light source at or near the site where the plate with pupil raster elements 8515 is situated. The illumination system of the projection exposure apparatus shown in FIG. 91 further comprises a second optical component. The second optical component comprises a first field mirror 8525 for shaping the arc-shaped field in the image plane 8529, where the reticle 8567 is situated. To each field point of the arc-shaped field in the image plane 8529 a principle ray or so-called chief ray is associated, giving a plurality of chief rays. In FIG. 91 only the chief ray for the centre field point (0,0) of the arc-shaped field in the image plane 8529 is denoted with reference number 8597.

The reticle 8567 is positioned by a support system 8569. The reticle 8567 in the image plane of the illumination system, which coincidence with the object plane of the projection system, 8529 is imaged by a projection objective 8571 onto a light sensitive substrate, e.g. a wafer 8573 which is positioned by a support system 8575. The embodiment of the projection objective 8571 comprises six mirrors, a first mirror 8591, a second mirror 8592, a third mirror 8593, a fourth mirror 8594, a fifth mirror 8595 and a sixth mirror 8596 as e.g. the embodiments shown in FIGS. 86 to 89. The six mirrors 8591, 8592, 8593, 8594, 8595 and 8596 of the projection objective 8571 are centered on a common straight optical axis 8547. The projection objective has an intermediate image 8599 between the forth mirror 8594 and the fifth mirror 8595. The invention is not restricted to a six mirror projection objective. All other projection objectives usable for wavelengths ≦193 nm such as, for example, a four-mirror objective shown in U.S. Pat. No. 6,244,717 can be used by a man skilled in the art to practice the invention.

According to the invention the chief ray 8597 of the centre field point associated to the light bundle impinging onto to the reticle 8567 in a direction from the primary light source 8501 toward the reticle 8567 is inclined away from the optical axis 8547 defined by the projection objective.

The reticle 8567 of the embodiment shown in FIG. 91 is a reflective mask. Therefore the plurality of chief rays is reflected divergent at the reflective mask 8567 into the projection objective 8571.

Each of the plurality of chief rays intersects the entrance pupil plane of the projection objective in or near the optical axis 8547 of the projection objective. The entrance pupil for a plurality of chief rays running divergent into the projection objective is situated in the light path form the primary light source 8501 to the reticle 8567 before the image plane 8529 according to the invention. The projection objective is for example a 6-mirror projection objective as shown and described in FIGS. 86 to 89. The projection objective is not limited to a six-mirror objective. Also other reflective projection-objectives with at least four mirrors are possible.

If, as in case of the embodiment shown FIG. 91, a field mirror as field shaping element is used the entrance pupil is a virtual entrance pupil. This is apparent from FIG. 92.

FIG. 92 shows the construction of the entrance pupil of the system shown in FIG. 91. Corresponding elements have the same reference numbers as those in FIG. 91 increased by 100. A light bundle from the first field mirror 8625 is reflected by the reticle 8667 divergent in the projection objective not show. In FIG. 92 the chief ray associated to the centre field point is shown and denoted with reference number 8697. To construct the entrance pupil the principle or so-called chief ray 8697 of the centre filed point reflected at the reticle into the projection objective is elongated in a direction behind the reflective reticle 8667, giving a intersection point 8698 with the optical axis 8647 of the projection objective, which is not shown. This intersection point 8698 defines the position of the entrance pupil 8688 of the projection objective. Due to the reflection of the beam path at the reticle 8667, the entrance pupil position is imaged at the reticle to form an image of the entrance pupil, a so-called virtual entrance pupil 8689, beyond the reticle 8667. According to the invention the entrance pupil constructed in this way is situated in the light path form the primary light source to the reticle, before the reticle.

In FIG. 93 a second embodiment of the invention is shown. Corresponding elements have the same reference numbers as those in FIG. 91 increased by 200. The difference between the embodiment shown in FIG. 91 and the embodiment shown in FIG. 93 is the field forming of the arc-shaped field in the image plane. According to the embodiment shown in FIG. 93 no field-forming mirror is necessary any longer. Therefore the system shown in FIG. 93 is most compact in size. It has fewer optical elements with regard to a projection exposure apparatus known from the state of the art e.g. U.S. Pat. No. 6,198,793.

The field according to the embodiment shown in FIG. 93 is formed by the first raster elements 8709, which have the shape of the field to be illuminated in the image plane 8729. For an arc-shaped field in the image plane 8729, the field raster elements or first raster elements then have arcuate shape.

The real entrance pupil 8788 of the system is given by the intersection point 8798 of the plurality of chief rays associated with each field point in the image plane of the illumination system with the optical axis 8747 of the projection objective. In FIG. 93 the chief ray 8797 for the central field point (0,0) is shown and denoted with reference number 8797. According to the invention the entrance pupil defined in this way is situated in the light path from the primary light source 8701 to the reticle 8767 before the reticle 8767. In the plane defined by the entrance pupil the second optical element with pupil raster elements 8715 can be situated directly. The apparatus shown in FIG. 93 does not need any imaging optics for imaging the secondary light sources or the pupil raster elements 8715 associated to each secondary light source into the entrance pupil 8798 of the projection objective as, for example, the apparatus shown in the state of the art, e.g. U.S. Pat. No. 6,198,793.

Therefore the number of optical elements compared to the embodiment in the state of the art is drastically reduced.

Nevertheless an projection exposure apparatus as shown in FIGS. 91 to 93 with a entrance pupil situated in the light path of light travelling from the primary light source toward the reticle before the reticle can also comprise further optical components such as a second or a third field mirror.

A system according to the invention with such a second or a third field mirror has also the entrance pupil situated in the light path of light travelling from the primary light source to reticle, before the reticle.

The system has a numerical aperture $NA_{ret}$ at the reticle in the object plane, e.g. of 0.0625. In an ideal system the chief rays of all field points intersect the optical axis in the entrance pupil. In a non-ideal system, in the entrance pupil, the chief ray has a distance from the optical axis. The distance is small, but there is a preferred maximum allowable deviation in terms of the aperture. The preferred maximum allowable deviation can be represented as:

$$\Delta NA_{ret}/NA < 2\%$$

In the present application, the phrases "at or near" and "in or near" are defined by the allowable deviation $\Delta NA_{ret}$ of the numerical aperture $NA_{ret}$, where the allowable deviation $\Delta NA_{ret}$ is, in turn, defined by $\Delta NA_{ret}/NA < 2\%$. For example, "in or near the optical axis" means that the maximum distance from the optical axis is defined by the allowable deviation $\Delta NA_{ret}$ pursuant to the aforementioned relationship.

The invention claimed is:

1. A projection objective for a projection exposure apparatus, said projection exposure apparatus having a primary light source for emitting electromagnetic radiation having a chief ray with a wavelength $\leq 193$ nm, said projection objective comprising:
   an object plane;
   a first mirror;
   a second mirror;
   a third mirror;
   a fourth mirror;
   a fifth mirror and
   an image plane,
   wherein said object plane, said first mirror, said second mirror, said third mirror, said fourth mirror, said fifth mirror and said image plane are arranged in a centered arrangement around a common optical axis,
   wherein said first mirror, said second mirror, said third mirror, said fourth mirror and said fifth mirror are situated between said object plane and said image plane, and
   wherein said chief ray, when incident on an object situated in said object plane, in a direction from said primary light source, is inclined away from said common optical axis.

2. The projection objective of claim 1, further comprising a sixth mirror in a centered arrangement around said common optical axis.

3. The projection objective of claim 2,
   wherein said object is imaged by a first subsystem comprising said first mirror, said second mirror, said third mirror, and said fourth mirror into a real intermediate image, and
   wherein said real intermediate image is imaged by a second subsystem comprising said fifth mirror and said sixth mirror into said image in said image plane.

4. The projection objective of claim 2, further comprising an aperture stop located on or near a vertex of a surface of said second mirror.

5. The projection objective of claim 2, further comprising an aperture stop located in a light path from said object plane to said image plane between a vertex of a surface of said first mirror and a vertex of a surface of said second mirror.

6. The projection objective of claim 2, further comprising an aperture stop located in a light path from said object plane to said image plane between a vertex of a surface of said second mirror and a vertex of a surface of said third mirror.

7. The projection objective of claim 2, wherein said first mirror is situated between a vertex of a surface of said sixth mirror and said image plane.

8. The projection objective of claim 1, further comprising at least one additional mirror, situated between said object plane and said image plane, and arranged in said centered arrangement around said optical axis.

9. A projection exposure apparatus for microlithography using a wavelength $\leqq 193$ nm, comprising:
   (A) a primary light source;
   (B) an illumination system having:
      (1) an object plane; and
      (2) a plurality of raster elements for receiving light from said primary light source;
      wherein said illumination system uses light from said plurality of raster elements to form a field having a plurality of field points in said object plane, and
      wherein said illumination system has a chief ray associated with each of said plurality of field points thus defining a plurality of chief rays; and
   (C) a projection objective having:
      a first mirror;
      a second mirror;
      a third mirror;
      a fourth mirror;
      a fifth mirror; and
      an image plane,
      wherein said object plane, said first mirror, said second mirror, said third mirror, said fourth mirror, said fifth mirror and said image plane are arranged in a centered arrangement around a common optical axis,
      wherein said first mirror, said second mirror, said third mirror, said fourth mirror and said fifth mirror are situated between said object plane and said image plane, and
      wherein said plurality of chief rays, when incident on a pattern-bearing mask situated in said object plane, from a direction of said primary light source, is inclined away from said common optical axis,
      wherein said projection objective images said pattern bearing mask onto a light sensitive object in said image plane.

10. The projection exposure apparatus of claim 9, wherein said projection objective further includes at least one additional mirror, situated between said object plane and said image plane, and arranged in said centered arrangement around said optical axis.

11. The projection exposure apparatus of claim 9, wherein said projection objective further includes a sixth mirror centered around said common optical axis, and situated between said object plane and said image plane.

12. The projection exposure apparatus of claim 11,
   wherein said plurality of chief rays intersects an entrance pupil of said projection objective in or near said common optical axis, and
   wherein said entrance pupil is situated before said object plane of said illumination system in a light path from said primary light source to said image plane.

13. The projection exposure apparatus of claim 11,
   wherein said plurality of chief rays includes a chief ray situated at an angle $\alpha$ to said optical axis is defined, and
   wherein said angle $\alpha$ is less than 7°.

14. The projection exposure apparatus of claim 11,
   wherein said plurality of raster elements includes a raster element having an arcuate shape, and
   wherein said field is arc-shaped.

15. The projection exposure apparatus of claim 11,
   wherein said plurality of raster elements deflects a plurality of incoming ray bundles to produce a plurality of deflected ray bundles with deflection angles, and
   wherein at least two of said deflection angles are different from one another.

16. The projection exposure apparatus of claim 11, wherein said illumination system further includes a field mirror that receives said light from said plurality of raster elements to form said field.

17. The projection exposure apparatus of claim 11, wherein said primary light source comprises a collection optics system having a collecting optic element.

18. A method for producing microelectronic components, comprising employing the projection exposure apparatus of claim 11.

19. The projection exposure apparatus claim 11,
   wherein said plurality of raster elements is a first plurality of raster elements, and
   wherein said illumination system further includes a second plurality of raster elements for receiving said light from said first plurality of raster elements and directing said light toward a field mirror.

20. The projection exposure apparatus of claim 12,
   wherein said first plurality of raster elements has a member that corresponds to a member of said second plurality of raster elements, and
   wherein said member of said first plurality of raster elements deflects a member of a plurality of incoming ray bundles to said corresponding member of said second plurality of raster elements.

21. The projection exposure apparatus of claim 19,
   wherein said plurality of chief rays intersects an entrance pupil of said projection objective at or near said common optical axis,
   wherein said entrance pupil is situated before said object plane in a light path from said primary light source to said pattern-bearing mask, and
   wherein said second plurality of raster elements is situated in or near said entrance pupil.

* * * * *

UNITED STATES PATENT AND TRADEMARK OFFICE
CERTIFICATE OF CORRECTION

PATENT NO. : 7,186,983 B2  Page 1 of 1
APPLICATION NO. : 10/919583
DATED : March 6, 2007
INVENTOR(S) : Hans-Juergen Mann et al.

It is certified that error appears in the above-identified patent and that said Letters Patent is hereby corrected as shown below:

Column 8, line 50, delete "Quadrupol" insert --Quadrupole--.

Column 9, line 37, delete "Dipol" insert --Dipole--.

Column 9, line 37, delete "Quadrupol" insert --Quadrupole--.

Column 15, line 10, after "91" insert --.--.

Column 27, line 62, after "mm" insert --.--.

Column 28, line 54, delete "0.075" insert --0.175--.

Signed and Sealed this

Seventeenth Day of February, 2009

JOHN DOLL
*Acting Director of the United States Patent and Trademark Office*